US010347567B2

(12) United States Patent
Nishikizawa et al.

(10) Patent No.: US 10,347,567 B2
(45) Date of Patent: Jul. 9, 2019

(54) SEMICONDUCTOR DEVICE AND METHOD OF MANUFACTURING THE SAME

(71) Applicant: RENESAS ELECTRONICS CORPORATION, Tokyo (JP)

(72) Inventors: Atsushi Nishikizawa, Tokyo (JP); Yuichi Yato, Gunma (JP); Hiroi Oka, Gunma (JP); Tadatoshi Danno, Tokyo (JP); Hiroyuki Nakamura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/020,353

(22) Filed: Jun. 27, 2018

(65) Prior Publication Data

US 2018/0315685 A1   Nov. 1, 2018

Related U.S. Application Data

(63) Continuation of application No. 15/515,297, filed as application No. PCT/JP2015/060024 on Mar. 30, 2015, now Pat. No. 10,037,932.

(51) Int. Cl.
*H01L 23/495* (2006.01)
*H01L 23/00* (2006.01)
(Continued)

(52) U.S. Cl.
CPC .... *H01L 23/49513* (2013.01); *H01L 21/4825* (2013.01); *H01L 21/565* (2013.01);
(Continued)

(58) Field of Classification Search
CPC ........... H01L 23/49513; H01L 23/3114; H01L 23/4952; H01L 23/49568
(Continued)

(56) References Cited

U.S. PATENT DOCUMENTS 5,057,906 A   10/1991   Ishigami
5,124,783 A * 6/1992   Sawaya ............. H01L 23/49531
                                                    257/724
(Continued)

FOREIGN PATENT DOCUMENTS

JP       61-113243 A    5/1986
JP        9-153571 A    6/1997
(Continued)

OTHER PUBLICATIONS

International Search Report PCT/JP2015/060024 dated Jun. 9, 2015, with English translation.
(Continued)

*Primary Examiner* — Nitin Parekh
(74) *Attorney, Agent, or Firm* — McDermott Will & Emery LLP

(57) ABSTRACT

In a resin sealing type semiconductor device, a semiconductor chip CP2 is mounted over a die pad DP having conductivity via a bonding member BD2 having insulation property, and a semiconductor chip CP1 is mounted over the die pad DP via a bonding member BD1 having conductivity. A first length of a portion, in a first side formed by an intersection of a first side surface and a second side surface of the semiconductor chip CP2, covered with the bonding member BD2 is larger than a second length of a portion, in a second side formed by an intersection of a third side surface and a fourth side surface of the semiconductor chip CP1, covered with the bonding member BD1.

10 Claims, 36 Drawing Sheets

(51) Int. Cl.
*H01L 21/48* (2006.01)
*H01L 21/56* (2006.01)
*H01L 23/31* (2006.01)

(52) U.S. Cl.
CPC ...... *H01L 23/3114* (2013.01); *H01L 23/4952* (2013.01); *H01L 23/49562* (2013.01); *H01L 23/49568* (2013.01); *H01L 23/49575* (2013.01); *H01L 24/06* (2013.01); H01L 23/3107 (2013.01); H01L 2224/05554 (2013.01); H01L 2224/32245 (2013.01); H01L 2224/45144 (2013.01); H01L 2224/48137 (2013.01); H01L 2224/48247 (2013.01); H01L 2224/73265 (2013.01); H01L 2224/83192 (2013.01); H01L 2224/92247 (2013.01); H01L 2924/181 (2013.01)

(58) Field of Classification Search
USPC ........................................................ 257/676
See application file for complete search history.

(56) References Cited

U.S. PATENT DOCUMENTS

| | | | |
|---|---|---|---|
| 5,422,435 A * | 6/1995 | Takiar | H01L 23/49531 174/521 |
| 5,488,256 A * | 1/1996 | Tsunoda | H01L 23/142 257/691 |
| 5,606,487 A * | 2/1997 | Yasukawa | H01L 23/3735 257/717 |
| 5,767,573 A * | 6/1998 | Noda | H01L 23/24 257/675 |
| 5,814,878 A * | 9/1998 | Hirakawa | H01L 21/565 257/667 |
| 7,312,534 B2 | 12/2007 | delos Santos et al. | |
| 7,365,441 B2 | 4/2008 | Ikenaga et al. | |
| 7,633,143 B1 * | 12/2009 | Fan | H01L 23/49503 257/666 |
| 8,022,522 B1 | 9/2011 | Liou et al. | |
| 2005/0006758 A1 | 1/2005 | Wolf et al. | |
| 2006/0145322 A1 | 7/2006 | Takahashi et al. | |
| 2011/0190465 A1 | 8/2011 | Hottovy et al. | |
| 2012/0074546 A1 | 3/2012 | Chong et al. | |
| 2013/0001792 A1 | 1/2013 | Uno et al. | |
| 2013/0234313 A1 | 9/2013 | Wainerdi et al. | |
| 2015/0200181 A1 | 7/2015 | Haga et al. | |

FOREIGN PATENT DOCUMENTS

| | | |
|---|---|---|
| JP | 2013-012669 | 1/2013 |
| JP | 2013-239479 A | 11/2013 |
| WO | 2003/034495 A2 | 4/2003 |
| WO | 2011/087119 A1 | 7/2011 |

OTHER PUBLICATIONS

Japanese Office Action issued in corresponding Japanese Patent Application No. 2017-508911, dated Oct. 26, 2017.
Japanese Office Action issued in corresponding Japanese Patent Application No. 2017-508911, dated Mar. 6, 2018.
Non-Final Office Action issued in related parent U.S. Appl. No. 15/515,297, dated Oct. 24, 2017.
Notice of Allowance issued in related parent U.S. Appl. No. 15/515,297, dated Mar. 28, 2018.
Taiwanese Office Action issued in corresponding Taiwanese Patent Application No. 105109603, dated Feb. 26, 2019, with English Translation.

* cited by examiner

FIG. 40

| | THICKNESS T2 OF SEMICONDUCTOR CHIP CP2 | LENGTH L2 | DISTANCE L3 | WITHSTAND VOLTAGE BETWEEN SEMICONDUCTOR CHIP CP2 AND DIE PAD DP |
|---|---|---|---|---|
| SAMPLE A | APPROXIMATELY 400 μm | APPROXIMATELY 60 μm | APPROXIMATELY 85 μm | APPROXIMATELY 1300 V |
| SAMPLE B | APPROXIMATELY 400 μm | APPROXIMATELY 250 μm | APPROXIMATELY 320 μm | 5000 V OR MORE (NO BREAKDOWN AT 5000 V) |

SEMICONDUCTOR DEVICE AND METHOD OF MANUFACTURING THE SAME

CROSS-REFERENCE TO RELATED APPLICATIONS

This application is a Continuation of U.S. patent application Ser. No. 15/515,297 filed on Mar. 29, 2017, which is the U.S. National Phase entry of PCT/JP2015/060024 filed on Mar. 30, 2015, the subject matter of which are incorporated herein by reference in their entirety.

TECHNICAL FIELD

The present invention relates to a semiconductor device and a method of manufacturing the semiconductor device and can be suitably used for, for example, a semiconductor device including a plurality of semiconductor chips adjacently arranged and packaged, and a method of manufacturing the semiconductor device.

BACKGROUND ART

A semiconductor device in a packaged form can be manufactured by mounting a semiconductor chip on a die pad, electrically connecting a pad electrode of the semiconductor chip and a lead via a wire, and sealing them with a resin.

International Publication No. WO 2003/034495 (Patent Document 1) describes a technique relating to a multi-chip package having a power semiconductor chip and a logic chip mounted on a substrate.

RELATED ART DOCUMENT

Patent Document

Patent Document 1: International Publication No. WO 2003/034495

SUMMARY OF THE INVENTION

Problems to be Solved by the Invention

Even in a semiconductor device including a plurality of semiconductor chips adjacently arranged and packaged, reliability is desired to be improved as much as possible.

Other objects and novel features of the present invention will be apparent from the description of the present specification and the accompanying drawings.

Means for Solving the Problems

According to an embodiment, a semiconductor device is a resin sealing type semiconductor device including a first semiconductor chip and a second semiconductor chip mounted over a conductive chip mounting portion via a first bonding member having insulation property and a second bonding member having conductivity, respectively. A first length of a portion, in a first side formed by an intersection of a first side surface and a second side surface of the first semiconductor chip, covered with the first bonding member is larger than a second length of a portion, in a second side formed by an intersection of a third side surface and a fourth side surface of the second semiconductor chip, covered with the second bonding member.

In addition, according to an embodiment, a method of manufacturing a semiconductor device includes the steps of: (a) mounting a first semiconductor chip and a second semiconductor chip over a chip mounting portion having conductivity via a first bonding member having insulation property and a second bonding member having conductivity, respectively; and (b) forming a sealing body sealing the first semiconductor chip, the second semiconductor chip, and at least apart of the chip mounting portion. A first length of a portion, in a first side formed by an intersection of a first side surface and a second side surface of the first semiconductor chip, covered with the first bonding member is larger than a second length of a portion, in a second side formed by an intersection of a third side surface and fourth side surface of the second semiconductor chip, covered with the second bonding member.

Effect of the Invention

According to an embodiment, reliability of the semiconductor device can be improved.

BRIEF DESCRIPTIONS OF THE DRAWINGS

FIG. 40 is a table indicating an exemplary effect according to the present embodiment.

DETAILED DESCRIPTION OF PREFERRED EMBODIMENT

Figure 1:
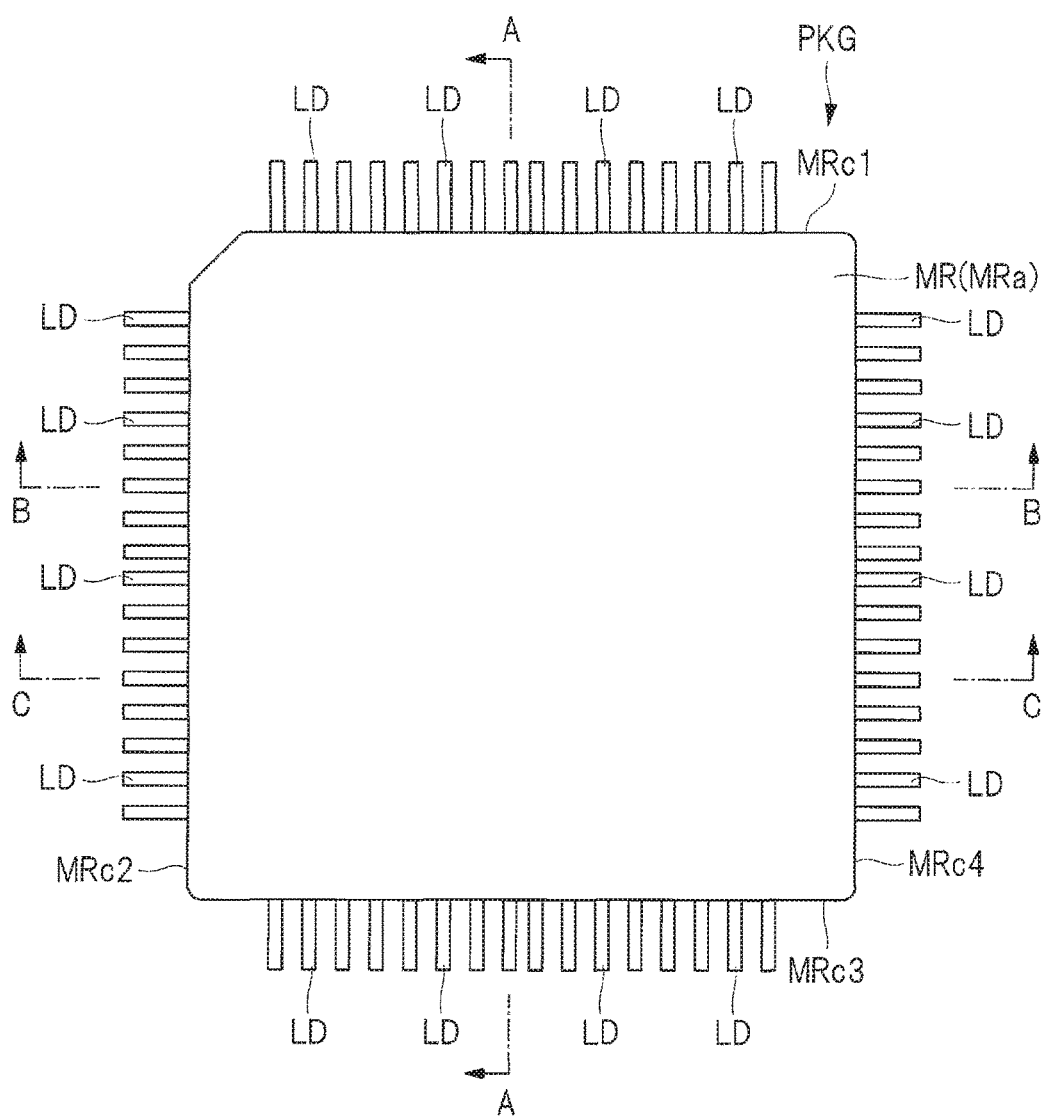
FIG. 1 is a top view of a semiconductor device according to an embodiment.

In an embodiment described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiment described below, when referring to the number of elements (including number of pieces, values, amount, range, and the like), the number of the elements is not limited to a specific number unless otherwise stated or except the case where the number is apparently limited to a specific number in principle. The number larger or smaller than the specific number is also applicable. Further, in the embodiment described below, it goes without saying that the components (including element steps) are not always indispensable unless otherwise stated or except the case where the components are apparently indispensable in principle. Similarly, in the embodiment described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, the embodiment of the present invention will be described in detail with reference to the accompanying drawings. Note that components having the same function are denoted by the same reference characters throughout the drawings for describing the embodiment, and the repetitive description thereof is omitted. In addition, the description of the same or similar portions is not repeated in principle unless particularly required in the following embodiment.

In addition, in some drawings used in the embodiment, hatching may be omitted even in a cross-sectional view so as to make the drawings easy to see. Also, hatching may be used even in a plan view so as to make the drawings easy to see.

First Embodiment

A semiconductor device according to the embodiment of the present invention will be described with reference to the drawings.

<Structure of Semiconductor Device (Semiconductor Package)>

Figure 2:
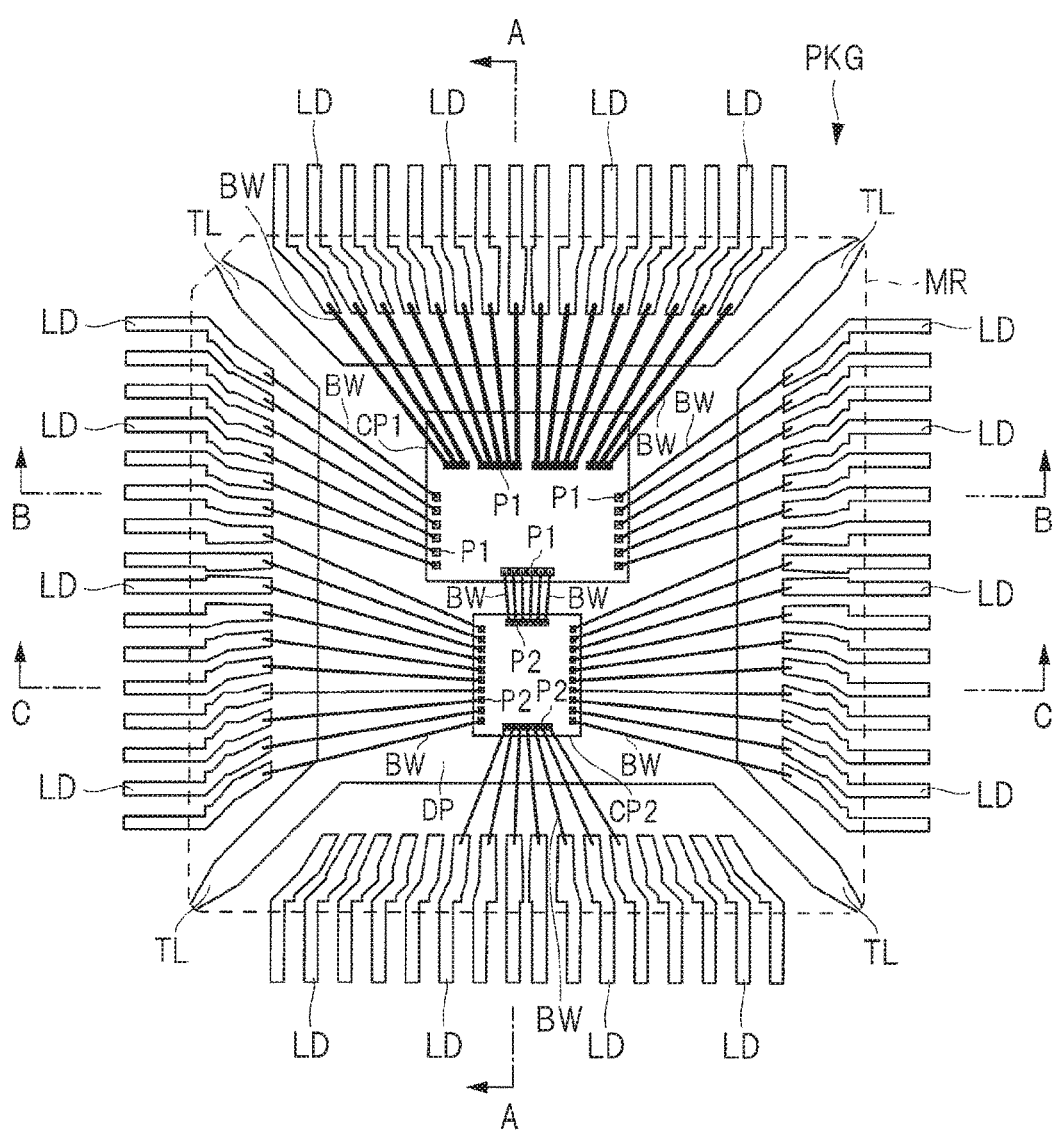
FIG. 2 is a plan perspective view of the semiconductor device according to the embodiment.
Figure 3:
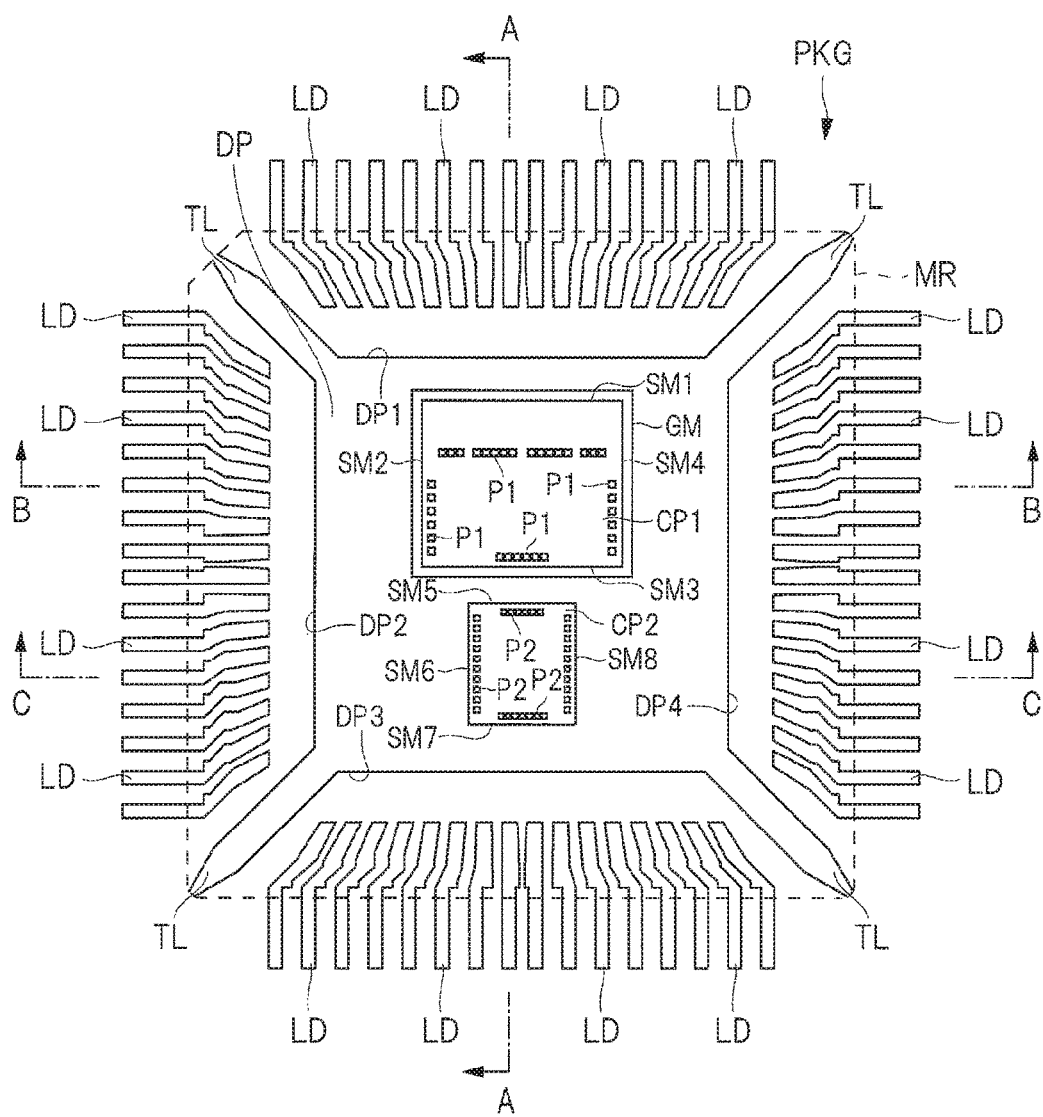
FIG. 3 is a plan perspective view of the semiconductor device according to the embodiment.
Figure 4:
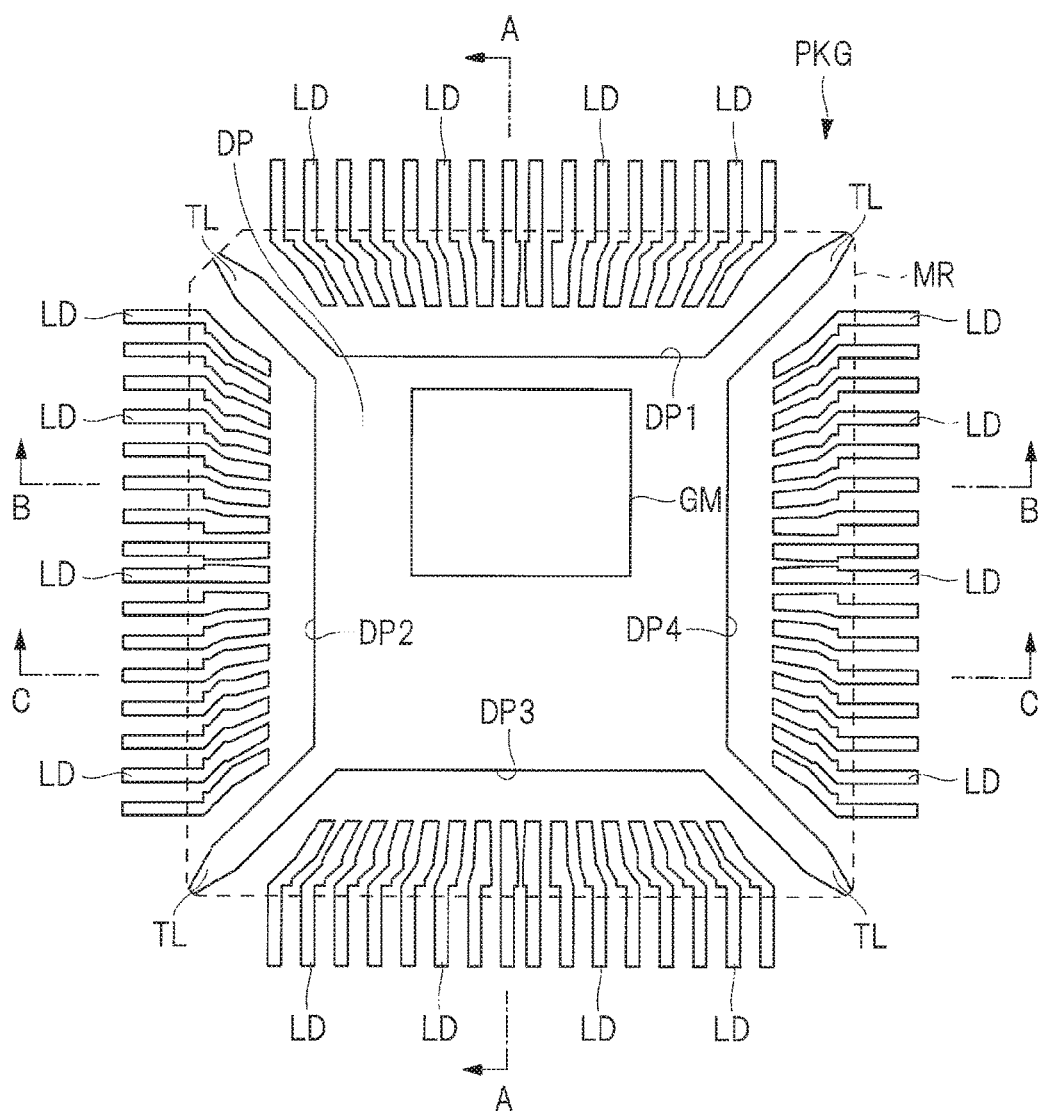
FIG. 4 is a plan perspective view of the semiconductor device according to the embodiment.
Figure 5:
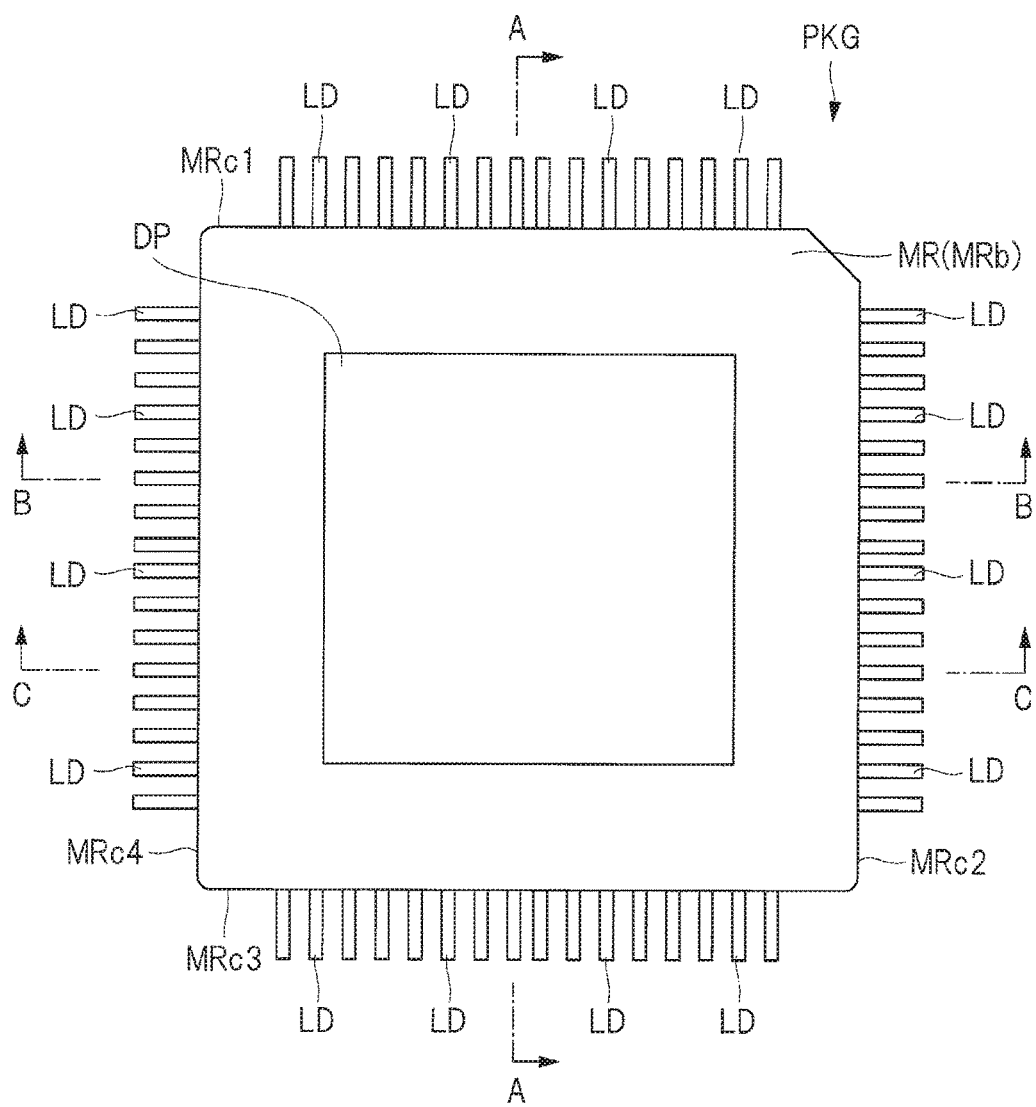
FIG. 5 is a bottom view of the semiconductor device according to the embodiment.
Figure 6:
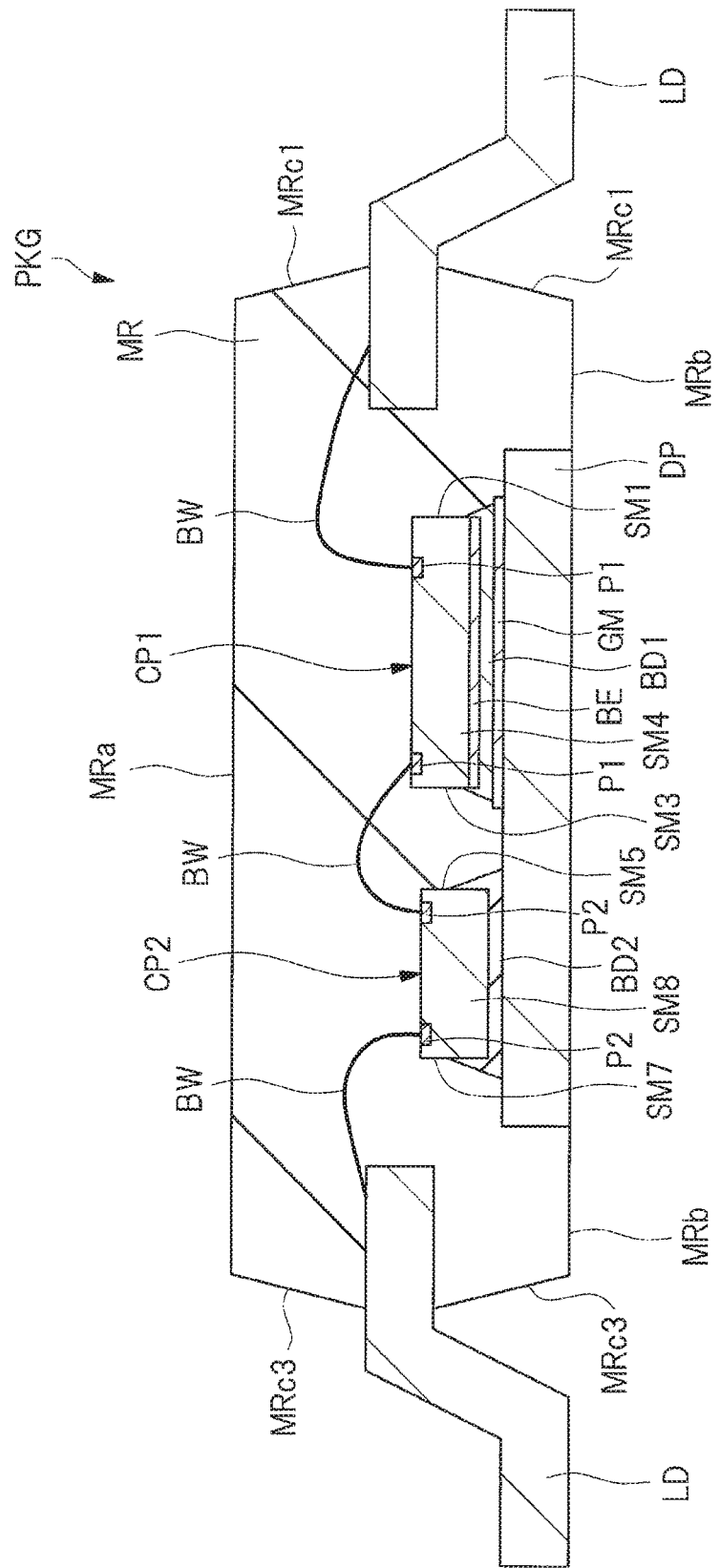
FIG. 6 is a cross-sectional view of the semiconductor device according to the embodiment.
Figure 7:
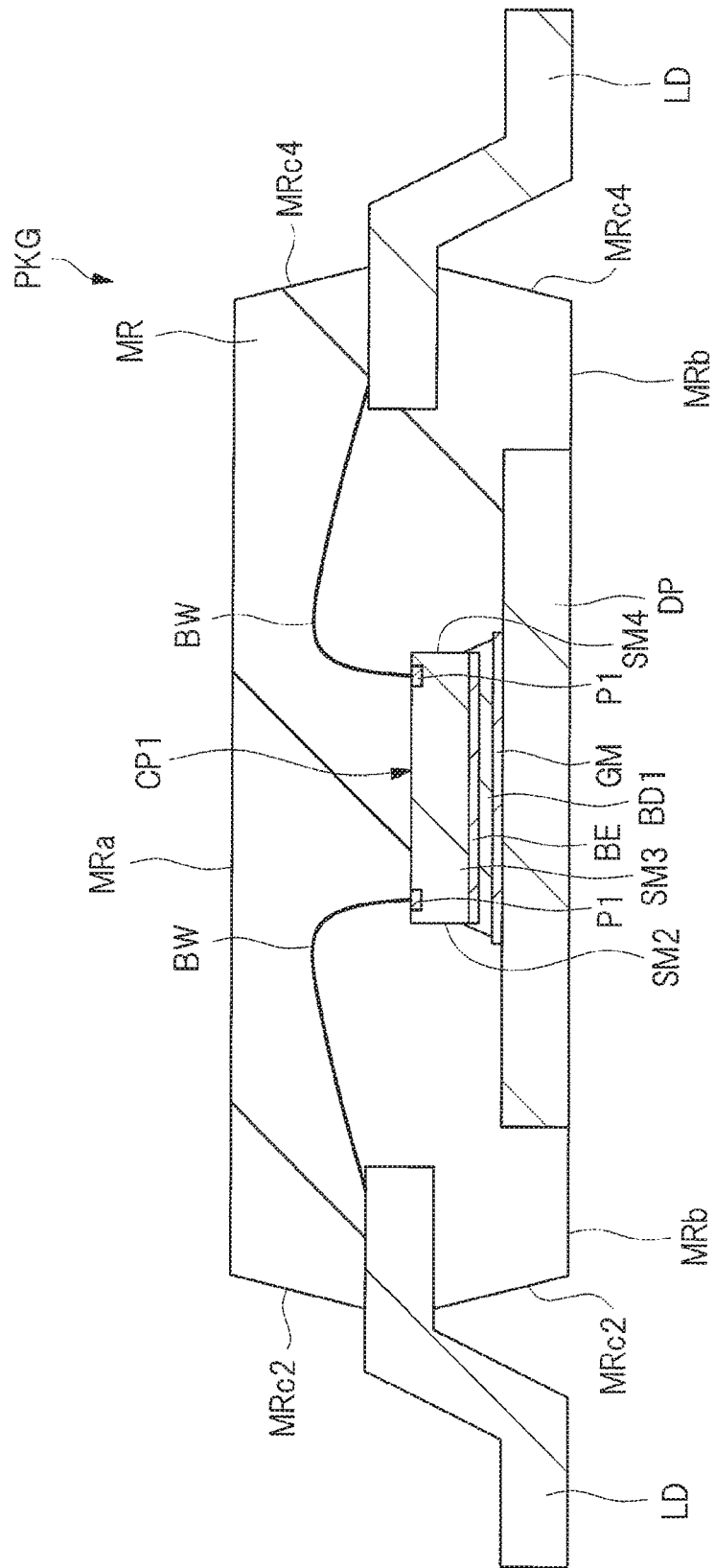
FIG. 7 is a cross-sectional view of the semiconductor device according to the embodiment.
Figure 8:
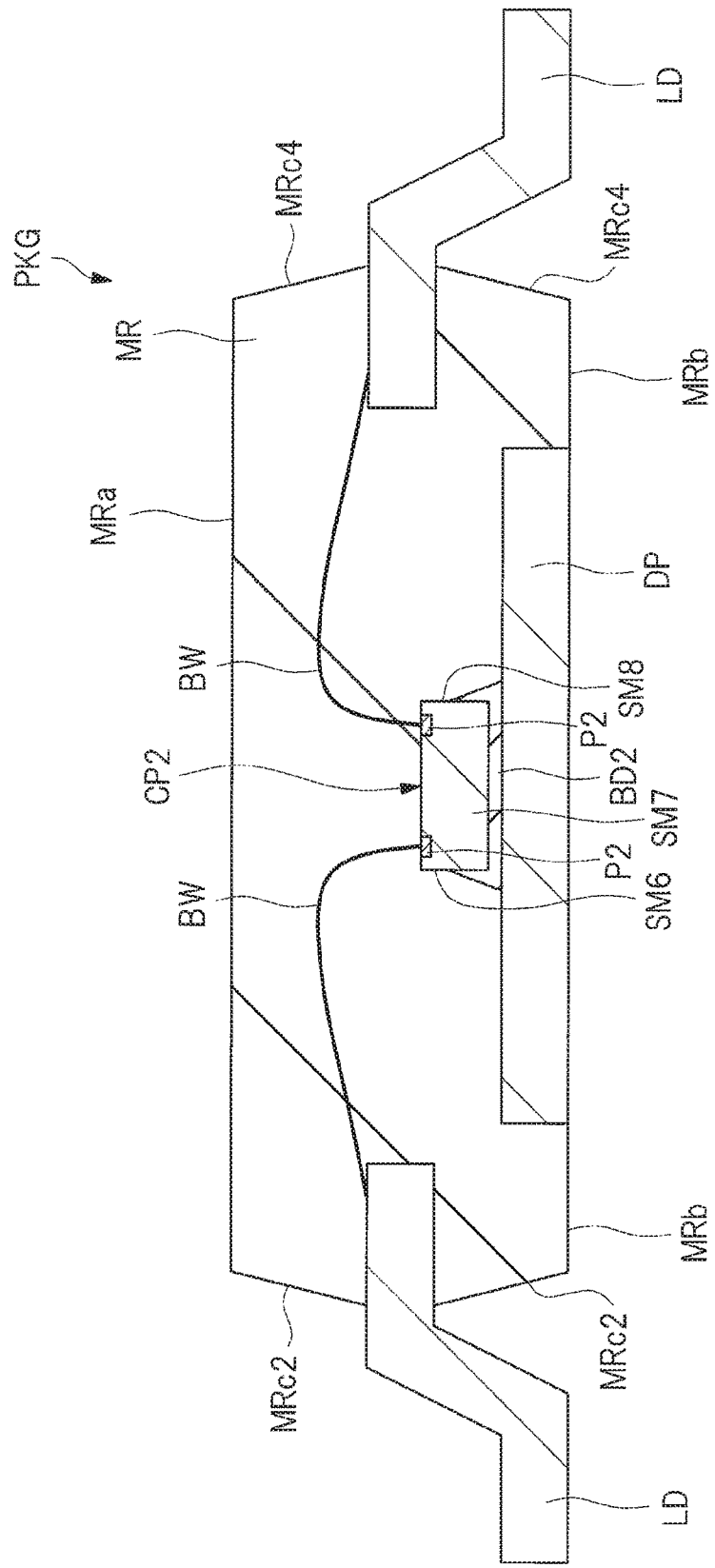
FIG. 8 is a cross-sectional view of the semiconductor device according to the embodiment.
Figure 9:
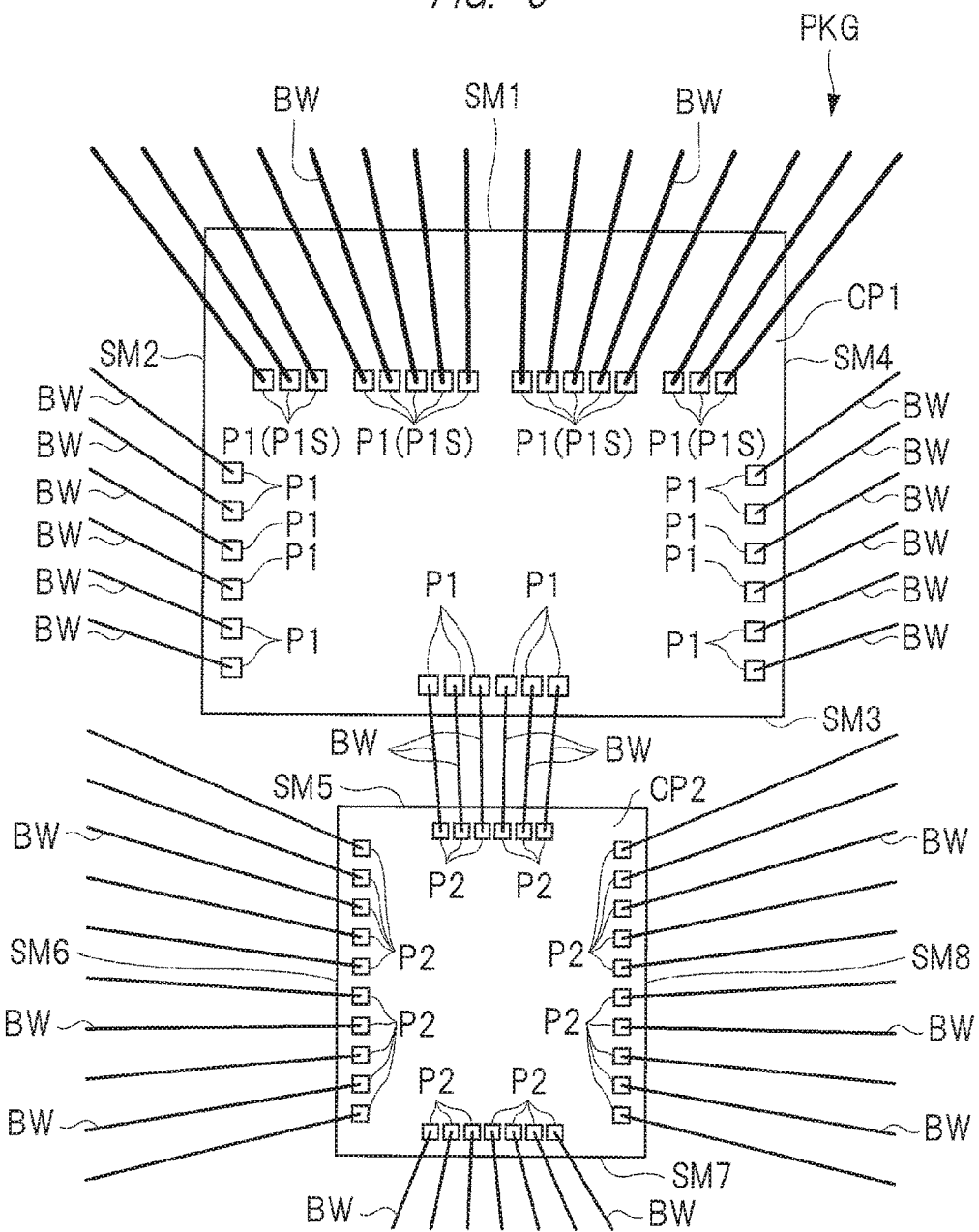
FIG. 9 is a partially enlarged plan perspective view of the semiconductor device according to the embodiment.

FIG. 1 is a top view of a semiconductor device PKG according to the embodiment, FIGS. 2 to 4 are plan perspective views of the semiconductor device PKG, FIG. 5 is a bottom view (a back surface view) of the semiconductor device PKG, and FIGS. 6 to 8 are cross-sectional views of the semiconductor device PKG. FIG. 2 is a plan perspective view on a side of an upper surface of the semiconductor device PKG when viewed through a sealing portion MR. In addition, FIG. 3 is a plan perspective view on the side of the upper surface of the semiconductor device PKG when further viewed through wires BW (when the wires BW are omitted) in FIG. 2. In addition, FIG. 4 is a plan perspective view on the side of the upper surface of the semiconductor device PKG when still further viewed through semiconductor chips CP1 and CP2 (when the semiconductor chips CP1 and CP2 are still further omitted) in FIG. 3. Note that the semiconductor devices PKG in FIGS. 1 to 4 are disposed in the same direction. A position of an outer periphery of the sealing portion MR is indicated with a broken line in FIGS. 2 to 4. A cross-section of the semiconductor device PKG at a position of a line A-A in FIGS. 1, 2, and 5 substantially corresponds to FIG. 6. A cross-section of the semiconductor device PKG at a position of a line B-B in FIGS. 1, 2, and 5 substantially corresponds to FIG. 7. A cross-section of the semiconductor device PKG at a position of a line C-C in FIGS. 1, 2, and 5 substantially corresponds to FIG. 8. In addition, FIG. 9 is a partially enlarged plan perspective view of FIG. 2.

The semiconductor device (the semiconductor package) PKG according to the present embodiment illustrated in FIGS. 1 to 9 is a semiconductor device in a resin sealing type semiconductor package mode and here, a semiconductor device in a quad flat package (QFP) mode. A configuration of the semiconductor device PKG will be described below with reference to FIGS. 1 to 9.

The semiconductor device PKG according to the present embodiment illustrated in FIGS. 1 to 9 has the semiconductor chips CP1 and CP2, a die pad DP on which the semiconductor chips CP1 and CP2 are mounted, a plurality of leads LD formed of a conductive material, a plurality of wires BW electrically connecting a plurality of pad electrodes P1 and P2 of the semiconductor chips CP1 and CP2 and the plurality of leads LD, respectively, and the sealing portion MR sealing thereof.

The sealing portion (a sealing resin portion or a sealing body) MR as a sealing body is composed of a resin material such as a thermosetting resin material and can additionally include a filler. For example, the sealing portion MR can be formed by using an epoxy resin including the filler. For example, a biphenyl thermosetting resin including a phenolic curing agent, silicone rubber, and a filler added thereto may be used as a material of the sealing portion MR in order to achieve low stress, other than the epoxy resin.

The sealing portion MR has an upper surface (a front surface) MRa being a main surface on one side, a lower surface (aback surface or a bottom surface) MRb being a main surface on the other side opposite to the upper surface MRa, and side surfaces MRc1, MRc2, MRc3, and MRc4 intersecting with the upper surface MRa and the lower surface MRb (see FIG. 1 and FIGS. 5 to 8). That is, an external appearance of the sealing portion MR has a thin plate shape surrounded by the upper surface MRa, the lower surface MRb, and the side surfaces MRc1, MRc2, MRc3, and MRc4. Note that each of the side surfaces MRc1, MRc2, MRc3, and MRc4 of the sealing portion MR can be regarded as a side of the sealing portion MR in plan view.

Each shape of the upper surface MRa and the lower surface MRb of the sealing portion MR in plan view is formed to be, for example, rectangular, and corners of the rectangle (a plane rectangle) can be rounded. Any corner of four corners of the rectangle (the plane rectangle) can be removed. When each plane shape of the upper surface MRa and the lower surface MRb of the sealing portion MR is rectangular, the sealing portion MR has a rectangular (quadrangular) planar shape (an outer shape) intersecting with the thickness thereof. Of the side surfaces MRc1, MRc2, MRc3, and MRc4 of the sealing portion MR, the side surface MRc1 and the side surface MRc3 face each other, the side surface MRc2 and the side surface MRc4 face each other, the side surface MRc1 intersects with the side surface MRc2, the side surface MRc1 intersects with the side surface MRc4, the side surface MRc3 intersects with the side surface MRc2, and the side surface MRc3 intersects with the side surface MRc4.

The plurality of leads (lead portions) LD are composed of the conductive material, and preferably a metal material such as copper (Cu) or copper alloy. Each of the plurality of leads LD has one part sealed in the sealing portion MR and the other part protruding from the corresponding side surface of the sealing portion MR to the outside of the sealing portion MR. Hereinafter, the part of each of the leads LD positioned in the sealing portion MR is referred to as an inner lead portion, and the other part of each of the leads LD positioned outside the sealing portion MR is referred to as an outer lead portion.

Note that the semiconductor device PKG according to the present embodiment has a structure in which the other part of each of the leads LD (the outer lead portion) protrudes from the corresponding side surface of the sealing portion MR and will be described below based on this structure. However, the semiconductor device PKG according to the present embodiment is not limited to this structure and can adopt, for example, a configuration in which each of the leads LD hardly protrudes from the corresponding side surface of the sealing portion MR and the other part of each of the leads LD is exposed from the lower surface MRb of the sealing portion MR (a QFN type configuration).

The plurality of leads LD include a plurality of leads LD arranged on a side of the side surface MRc1 of the sealing portion MR, a plurality of leads LD arranged on a side of the side surface MRc2 of the sealing portion MR, a plurality of leads LD arranged on a side of the side surface MRc3 of the sealing portion MR, and a plurality of leads LD arranged on a side of the side surface MRc4 of the sealing portion MR.

Each of the outer lead portions of the plurality of leads LD arranged on the side of the side surface MRc1 of the sealing portion MR protrudes from the side surface MRc1 of the sealing portion MR to the outside of the sealing portion MR. In addition, each of the outer lead portions of the plurality of leads LD arranged on the side of the side surface MRc2 of the sealing portion MR protrudes from the side surface MRc2 of the sealing portion MR to the outside of the sealing portion MR. In addition, each of the outer lead portions of the plurality of leads LD arranged on the side of the side surface MRc3 of the sealing portion MR protrudes from the side surface MRc3 of the sealing portion MR to the outside of the sealing portion MR. In addition, each of the outer lead portions of the plurality of leads LD arranged on the side of the side surface MRc4 of the sealing portion MR protrudes from the side surface MRc4 of the sealing portion MR to the outside of the sealing portion MR.

The outer lead portion of each of the leads LD is bended such that a lower surface close to an end portion of the outer lead portion is substantially flush with the lower surface MRb of the sealing portion MR. The outer lead portion of each of the leads LD functions as an external connecting terminal portion (an external terminal) of the semiconductor device PKG.

The die pad (a chip mounting portion or a tab) DP is a chip mounting portion on which the semiconductor chip CP1 and the semiconductor chip CP2 are mounted. A plane shape of the die pad DP is formed to be, for example, rectangular. The semiconductor chip CP1 and the semiconductor chip CP2 are adjacently arranged over the die pad DP, the sealing portion MR seals a part of the die pad DP, and the plurality of leads LD are arranged around the die pad DP.

The die pad DP has a side (a side surface) DP1 on the side of the side surface MRc1, a side (a side surface) DP2 on the side of the side surface MRc2, a side (a side surface) DP3 on the side of the side surface MRc3, and a side (a side surface) DP4 on the side of the side surface MRc4 (see FIGS. 1, 3, and 4). The side (the side surface) DP1 of the die pad DP is aside (a side surface) along the side surface MRc1 of the sealing portion MR, the side (the side surface) DP2 of the die pad DP is aside (a side surface) along the side surface MRc2 of the sealing portion MR, the side (the side surface) DP3 of the die pad DP is aside (a side surface) along the side surface MRc3 of the sealing portion MR, and the side (the side surface) DP4 of the die pad DP is a side (a side surface) along the side surface MRc4 of the sealing portion MR.

The plurality of leads LD arranged on the side of the side surface MRc1 of the sealing portion MR are arranged (arrayed) along the side DP1 of the die pad DP, and the plurality of leads LD arranged on the side of the side surface MRc2 of the sealing portion MR are arranged (arrayed) along the side DP2 of the die pad DP. In addition, the plurality of leads LD arranged on the side of the side surface MRc3 of the sealing portion MR are arranged (arrayed) along the side DP3 of the die pad DP, and the plurality of leads LD arranged on the side of the side surface MRc4 of the sealing portion MR are arranged (arrayed) along the side DP4 of the die pad DP.

That is, the plurality of leads LD (the inner lead portions thereof) are arranged (arrayed) along the side surface MRc1 of the sealing portion MR between the side DP1 of the die pad DP and the side surface MRc1 of the sealing portion MR, and the plurality of leads LD (the inner lead portions thereof) are arranged (arrayed) along the side surface MRc2 of the sealing portion MR between the side DP2 of the die pad DP and the side surface MRc2 of the sealing portion MR. In addition, the plurality of leads LD (the inner lead portions thereof) are arranged (arrayed) along the side surface MRc3 of the sealing portion MR between the side DP3 of the die pad DP and the side surface MRc3 of the sealing portion MR, and a plurality of leads LD (the inner lead portions thereof) are arranged (arrayed) along the side surface MRc4 of the sealing portion MR between the side DP4 of the die pad DP and the side surface MRc4 of the sealing portion MR.

A lower surface (a back surface) of the die pad DP is exposed from the lower surface MRb of the sealing portion MR. The die pad DP is not exposed from the upper surface MRa of the sealing portion MR.

The die pad DP is composed of a conductive material and preferably a metal material such as copper (Cu) or copper alloy. The die pad DP and the plurality of leads LD included in the semiconductor device PKG are more preferably formed of the same material (the same metal material). Accordingly, a lead frame to which the die pad DP and the plurality of leads LD are connected is easily manufactured, so that the semiconductor device PKG with the lead frame can be easily manufactured.

Each of suspension leads TL is integrally formed at each of four corners of the rectangular planar shape of the die pad DP. Each of the suspension leads TL is integrally formed with the die pad DP with the same material as that of the die pad DP. Each of the suspension leads TL is integrally formed at each of the four corners of an outer edge of the die pad DP. End portions of the respective suspension leads TL on a side opposite to a side connected to the die pad DP extend in the sealing portion MR so as to reach side surfaces of the four corners (corner portions) of the sealing portion MR in a rectangular planar shape. The suspension leads TL each have a portion protruding from the sealing portion MR cut off after formation of the sealing portion MR, and cross-sections (end surfaces) obtained by cutting off the suspension leads TL are exposed at the side surfaces of the four corners of the sealing portion MR, respectively.

The semiconductor chip CP1 is mounted over an upper surface (a main surface) of the die pad DP in such a way that a front surface thereof (a main surface or an upper surface) faces upward and a back surface thereof (a lower surface) faces the die pad DP (see FIGS. 2, 3, 6, 7, and 9). In addition, the semiconductor chip CP2 is mounted over the upper surface (the main surface) of the die pad DP in such a way that a front surface thereof (a main surface or an upper surface) faces upward and a back surface thereof (a lower surface) faces the die pad DP (see FIGS. 2, 3, 6, 8, and 9). A region in which the semiconductor chip CP1 is mounted and a region in which the semiconductor chip CP2 is mounted are spaced apart from each other on the upper surface of the die pad DP. Therefore, the semiconductor chip CP1 and the semiconductor chip CP2 are spaced apart from each other in plan view.

That is, the semiconductor chip CP1 and the semiconductor chip CP2 are adjacently arranged over the upper surface of the die pad DP. In other words, the semiconductor chip CP1 and the semiconductor chip CP2 are not stacked one on top of another but are adjacently arranged to be spaced apart from each other on the upper surface of the die pad DP. A plane size of the die pad DP (a plane area) is larger than each of plane sizes of the semiconductor chips CP1 and CP2 (plane areas). In plan view, the semiconductor chip CP1 and the semiconductor chip CP2 are disposed inside an outer periphery of the upper surface of the die pad DP, but the semiconductor chip CP1 and the semiconductor chip CP2 are not stacked one on top of another.

The back surface of the semiconductor chip CP1 adheres to (is bonded to) the upper surface of the die pad DP via a bonding member (a bonding layer or an adhesive layer) BD1 to be fixed, and the back surface of the semiconductor chip CP2 adheres to (is bonded to) the upper surface of the die pad DP via a bonding member (a bonding layer or an adhesive layer) BD2 to be fixed (see FIGS. 6 to 8). The semiconductor chips CP1 and CP2 are sealed in the sealing portion MR and are not exposed from the sealing portion MR.

The semiconductor chip CP1 includes aback surface electrode BE formed on the back surface thereof (a main surface on a side adhering to the die pad DP) (see FIGS. 6 and 7). Accordingly, the bonding member BD1 for adhering to the semiconductor chip CP1 has conductivity, and the back surface electrode BE of the semiconductor chip CP1 is bonded, fixed, and additionally electrically connected with the die pad DP via this conductive bonding member BD1. Accordingly, a desired potential can be supplied from the die pad DP to the back surface electrode BE of the semiconductor chip CP1 via the conductive bonding member BD1. The back surface electrode BE of the semiconductor chip CP1 is electrically connected to a drain of a power MOSFET (corresponding to a power MOSFET Q1 to be described later) formed in the semiconductor chip CP1. A conductive paste type bonding member (an adhesive member) such as silver (Ag) paste can be suitably used as the bonding member BD1. In addition, a thermosetting bonding member can be suitably used as the conductive paste type bonding member for the bonding member BD1, but the bonding member BD1 has already been cured in the manufactured semiconductor device PKG.

A silver (Ag) plated layer GM is formed in the region in which the semiconductor chip CP1 is mounted, of the upper surface of the die pad DP. The silver plated layer GM is formed on a part of the upper surface of the die pad DP, and the semiconductor chip CP1 is disposed within an outer periphery of the silver plated layer GM in plan view. The semiconductor chip CP1 is mounted over and bonded to the silver plated layer GM on the upper surface of the die pad DP via the conductive bonding member BD1. That is, the back surface electrode BE of the semiconductor chip CP1 is bonded, fixed, and additionally electrically connected with the silver plated layer GM on the upper surface of the die pad DP via the conductive bonding member BD1. Therefore, the back surface electrode BE of the semiconductor chip CP1 is electrically connected with the die pad DP via the conductive bonding member BD1 and the silver plated layer GM.

The silver plated layer GM can be omitted, and when no silver plated layer GM is provided, the semiconductor chip CP1 is mounted over the die pad DP composed of copper (Cu) or copper (Cu) alloy via the bonding member BD1. However, providing the silver plated layer GM on apart of the upper surface of the die pad DP and mounting the semiconductor chip CP1 over the silver plated layer GM via the bonding member BD1 are more preferable. In a case in which an oxide layer is formed on the upper surface of the die pad DP including copper (Cu) or copper (Cu) alloy and the semiconductor chip CP1 is mounted over a region in which the oxide layer is formed, via the bonding member BD1, even when connection can be electrically made between the back surface electrode BE of the semiconductor chip CP1 and the die pad DP, connection resistance therebetween may increase. In contrast, a front surface of the silver plated layer GM is barely oxidized in comparison to a front surface of the die pad DP. Accordingly, the silver plated layer GM is provided on the upper surface of the die pad DP, and the semiconductor chip CP1 is mounted over the silver plating layer GM via the bonding member BD1, so that connection can be appropriately and electrically made with low resistance between the back surface electrode BE of the semiconductor chip CP1 and the die pad DP.

Meanwhile, no back surface electrode is formed on the back surface of the semiconductor chip CP2 (see FIGS. 6 and 8). A bonding member BD2 for bonding the semiconductor chip CP2 has no conductivity but has insulation property. That is, the bonding member BD2 is composed of an insulating bonding member. Accordingly, the die pad DP and the semiconductor chip CP2 are insulated via the insulating bonding member BD2, and therefore, the potential to be supplied from the die pad DP to the back surface electrode BE of the semiconductor chip CP1 via the conductive bonding member BD1 is not supplied to the back surface of the semiconductor chip CP2. An insulating paste type bonding member (an adhesive member) can be suitably used as the bonding member BD2. In addition, although a thermosetting bonding member can be suitably used as the insulating paste type bonding member for the bonding member BD2, the bonding member BD2 has already been cured in the manufactured semiconductor device PKG.

In addition, no silver plated layer GM is formed in the region in which the semiconductor chip CP2 is mounted, of the upper surface of the die pad DP. Accordingly, the semiconductor chip CP2 is mounted over and bonded to the upper surface of the die pad DP in the region in which no silver plated layer GM is formed, via the insulating bonding member BD2.

A silver plated layer similar to the silver plated layer GM is provided also in the region in which the semiconductor chip CP2 is mounted, on the upper surface of the die pad DP, and then, the semiconductor chip CP2 may also be mounted over the silver plated layer via the bonding member BD2. However, more preferably, a silver plated layer similar to the silver plated layer GM is not provided in the region in which the semiconductor chip CP2 is mounted, on the upper surface of the die pad DP, and the semiconductor chip CP2 is mounted over the upper surface of the die pad DP in the region in which the silver plated layer is not formed, via the bonding member BD2. That is, the semiconductor chip CP2 is more preferably mounted over an exposed surface of the die pad DP composed of copper or copper alloy, via the bonding member BD2. This is because adhesion property between the sealing portion MR and the die pad DP (adhesion strength) is higher than adhesion property between the silver plated layer GM and the sealing portion MR (adhesion strength). No silver plated layer GM is provided in the region to be mounted with the semiconductor chip CP2 which does not need to be electrically connected with the die pad DP, so that high adhesion property between the sealing portion MR and the die pad DP can be secured. Meanwhile, the silver plated layer GM is provided in the region to be mounted with the semiconductor chip CP1 which needs to be electrically connected with the die pad DP, so that reliability of the electrical connection between the back surface electrode BE of the semiconductor chip CP1 and the die pad DP can be improved.

The die pad DP can also have a function as a heat sink for dissipating heat generated in the semiconductor chip CP1. The heat generated in the semiconductor chip CP1 is conducted to the die pad DP via the bonding member BD1 and then, can be dissipated from the lower surface (the back surface) of the die pad DP exposed from the sealing portion MR, to the outside of the semiconductor device PKG. The bonding member BD1 interposed between the semiconductor chip CP1 and the die pad DP has conductivity so as to have thermal conductivity higher than that of the insulating bonding member BD2 interposed between the semiconductor chip CP2 and the die pad DP. The higher heat conductivity of the bonding member BD1 interposed between the semiconductor chip CP1 and the die pad DP advantageously acts in a case where the heat generated in the semiconductor chip CP1 is dissipated to the outside of the semiconductor device PKG via the bonding member BD1 and the die pad DP.

Meanwhile, a heat generation amount of the semiconductor chip CP2 is smaller than that of the semiconductor chip CP1. As described below, this is because the semiconductor chip CP1 has a power transistor through which a large current flows, formed therein, whereas the semiconductor chip CP2 has no such power transistor formed therein, and a current flowing through the semiconductor chip CP2 is smaller than that flowing through the semiconductor chip CP1. Accordingly, even if the bonding member BD2 interposed between the semiconductor chip CP2 and the die pad DP has insulation property and as a result, the thermal conductivity thereof decreases, a problem relating to the heat generation of the semiconductor chip CP2 barely occurs.

The semiconductor chips CP1 and CP2 are manufactured by forming various semiconductor elements or semiconductor integrated circuits in a main surface of a semiconductor substrate (a semiconductor wafer) composed of, for example, single-crystal silicon, and then, dividing the semiconductor substrate into each semiconductor chip through dicing, for example. The semiconductor chips CP1 and CP2 each have a rectangular (quadrangular) planar shape intersecting with the thickness thereof.

The semiconductor chip CP1 is an intelligent power device (IPD) chip. Accordingly, although the details will be described later, the semiconductor chip CP1 has the power transistor (corresponding to a power MOSFET Q1 to be described later) and a control circuit controlling the power transistor (a control circuit CLC to be described later). The semiconductor chip CP2 is a microcomputer chip. Accordingly, the semiconductor chip CP2 has a circuit controlling the semiconductor chip CP1 (particularly, the control circuit CLC of the semiconductor chip CP1) and has, for example, an arithmetic circuit (a CPU) and a memory circuit. The semiconductor chip CP2 can be used as a control chip controlling the semiconductor chip CP1 (a control semiconductor chip). That is, the semiconductor chip CP2 is a semiconductor chip controlling the semiconductor chip CP1.

The semiconductor chip CP1 is larger than the semiconductor chip CP2 in plane area. The reason for the difference in plane area is as follows: That is, the semiconductor chip CP2 preferably has a smaller external shape size as much as possible in consideration of the size of the entire semiconductor device PKG. In contrast, the semiconductor chip CP1 has the power transistor formed therein, and the power transistor preferably has a smaller on-resistance occurring in the transistor as much as possible. The reduction of the on-resistance can be achieved by widening a channel width of each of a plurality of unit transistor cells included in the power transistor. Accordingly, the external shape size of the semiconductor chip CP1 is larger than the external shape size of the semiconductor chip CP2.

The plurality of pad electrodes (pads, bonding pads, or terminals) P1 are formed in the front surface (the main surface or the upper surface) of the semiconductor chip CP1 (see FIGS. 2, 3, 6, 7, and 9). In addition, the plurality of pad electrodes (pads, bonding pads, or terminals) P2 are formed in the front surface (the main surface or the upper surface) of the semiconductor chip CP2 (see FIGS. 2, 3, 6, 8, and 9). Note that, hereinafter, the "pad electrode" may be simply referred to as the "pad."

Here, the main surface on a side on which the plurality of pad electrodes P1 are formed is referred to as the front surface of the semiconductor chip CP1, and the main surface on a side opposite to the front surface and facing the die pad DP is referred to as the back surface of the semiconductor chip CP1, in the two main surfaces positioned on the sides mutually opposite in the semiconductor chip CP1. Similarly, the main surface on a side on which the plurality of pad electrodes P2 are formed is referred to as the front surface of the semiconductor chip CP2, and the main surface on a side opposite to the front surface and facing the die pad DP is referred to as the back surface of the semiconductor chip CP2, in the two main surfaces positioned on the sides mutually opposite in the semiconductor chip CP2.

The front surface of the semiconductor chip CP1 has a rectangular planar shape (see FIGS. 3 and 9). Accordingly, the semiconductor chip CP1 has four side surfaces SM1, SM2, SM3, and SM4 connecting the front surface of the semiconductor chip CP1 and the back surface of the semiconductor chip CP1. That is, the semiconductor chip CP1 has the front surface being the main surface on one side, the back surface being the main surface on the other side opposite to the front surface, and the side surfaces SM1, SM2, SM3, and SM4 intersecting with the front surface and the back surface. Here, the side surface SM1 and the side surface SM3 are positioned on the sides mutually opposite, the side surface SM2 and the side surface SM4 are positioned on the sides mutually opposite, the side surface SM1 and the side surface SM3 are mutually in parallel, the side surface SM2 and the side surface SM4 are mutually in parallel, the side surface SM1 is orthogonal to the side surfaces SM2 and SM4, and the side surface SM3 is orthogonal to the side surfaces SM2 and SM4, in the semiconductor chip CP1. Note that each of the side surfaces SM1, SM2, SM3, and SM4 of the semiconductor chip CP1 can be regarded as a side of the semiconductor chip CP1, in plan view.

In addition, the front surface of the semiconductor chip CP2 has a rectangular planar shape (see FIGS. 3 and 9). Accordingly, the semiconductor chip CP2 has four side surfaces SM5, SM6, SM7, and SM8 connecting the front surface of the semiconductor chip CP2 and the back surface of the semiconductor chip CP2. That is, the semiconductor chip CP2 has the front surface being the main surface on one side, the back surface being the main surface on the other side opposite to the front surface, and the side surfaces SM5, SM6, SM7, and SM8 intersecting with the front surface and the back surface. Here, the side surface SM5 and the side surface SM7 are positioned on the sides mutually opposite, the side surface SM6 and the side surface SM8 are positioned on the sides mutually opposite, the side surface SM5 and the side surface SM7 are mutually in parallel, the side surface SM6 and the side surface SM8 are mutually in parallel, the side surface SM5 is orthogonal to the side surfaces SM6 and SM8, and the side surface SM7 is orthogonal to the side surfaces SM6 and SM8, in the semiconductor chip CP2. Note that each of the side surfaces SM5, SM6, SM7, and SM8 of the semiconductor chip CP2 can be regarded as a side of the semiconductor chip CP2, in plan view.

The semiconductor chip CP1 and the semiconductor chip CP2 are mounted over the upper surface of the die pad DP such that the side surface SM3 of the semiconductor chip CP1 and the side surface SM5 of the semiconductor chip CP2 face each other (see FIGS. 3 and 9). Although the side surface SM3 of the semiconductor chip CP1 and the side surface SM5 of the semiconductor chip CP2 face each other, the side surface SM3 of the semiconductor chip CP1 and the side surface SM5 of the semiconductor chip CP2 can be substantially in parallel.

The side surface SM1 is a side surface along the side surface MRc1 of the sealing portion MR and the side DP1 of the die pad DP, and the side surface SM2 is aside surface along the side surface MRc2 of the sealing portion MR and the side DP2 of the die pad DP, in the semiconductor chip CP1. In addition, the side surface SM3 is a side surface along the side surface MRc3 of the sealing portion MR and the side DP3 of the die pad DP, and the side surface SM4 is a side surface along the side surface MRc4 of the sealing portion MR and the side DP4 of the die pad DP, in the semiconductor chip CP1. In addition, the side surface SM5 is a side surface along the side surface MRc1 of the sealing portion MR and the side DP1 of the die pad DP, and the side surface SM6 is a side surface along the side surface MRc2 of the sealing portion MR and the side DP2 of the die pad DP, in the semiconductor chip CP2. In addition, the side surface SM7 is a side surface along the side surface MRc3 of the sealing portion MR and the side DP3 of the die pad DP, and the side surface SM8 is a side surface along the side surface MRc4 of the sealing portion MR and the side DP4 of the die pad DP, in the semiconductor chip CP2.

The semiconductor chip CP1 is arranged on the side close to the side surface MRc1 of the sealing portion MR, and the semiconductor chip CP2 is arranged on the side close to the side surface MRc3 of the sealing portion MR, of the semiconductor chips CP1 and CP2 over the upper surface of the die pad DP. That is, the semiconductor chip CP1 is arranged on the side close to the side DP1 of the die pad DP, and the semiconductor chip CP2 is arranged on the side close to the side DP3 of the die pad DP, of the semiconductor chips CP1 and CP2 over the upper surface of the die pad DP.

The side surface SM1 of the semiconductor chip CP1 faces the inner lead portions of the plurality of leads LD arranged on the side of the side surface MRc1 of the sealing portion MR, and the side surface SM2 of the semiconductor chip CP1 faces the inner lead portions of the plurality of leads LD arranged on the side of the side surface MRc2 of the sealing portion MR, in plan view. In addition, the side surface SM3 of the semiconductor chip CP1 faces the side surface SM5 of the semiconductor chip CP2, and the side surface SM4 of the semiconductor chip CP1 faces the inner lead portions of the plurality of leads LD arranged on the side of the side surface MRc4 of the sealing portion MR. In addition, the side surface SM5 of the semiconductor chip CP2 faces the side surface SM3 of the semiconductor chip CP1, and the side surface SM6 of the semiconductor chip CP2 faces the inner lead portions of the plurality of leads LD arranged on the side of the side surface MRc2 of the sealing portion MR, in plan view. In addition, the side surface SM7 of the semiconductor chip CP2 faces the inner lead portions of the plurality of leads LD arranged on the side of the side surface MRc3 of the sealing portion MR, and the side surface SM8 of the semiconductor chip CP2 faces the inner lead portions of the plurality of leads LD arranged on the side of the side surface MRc4 of the sealing portion MR.

The plurality of pad electrodes P1 of the semiconductor chip CP1 are electrically connected with the plurality of leads LD via the plurality of wires (bonding wires) BW, respectively, and the plurality of pad electrode P2 of the semiconductor chip CP2 are electrically connected with the plurality of leads LD via the plurality of wires (bonding wires) BW, respectively. In addition, the plurality of pad electrodes P1 of the semiconductor chip CP1 are electrically connected with the plurality of pad electrodes P2 of the semiconductor chip CP2 via another plurality of wires BW, respectively.

That is, the plurality of pad electrodes P1 of the semiconductor chip CP1 include the pad electrodes P1 electrically connected with the leads LD via the wires BW, and the pad electrodes P1 electrically connected with the pad electrodes P2 of the semiconductor chip CP2 via the wires BW. In addition, the plurality of pad electrodes P2 of the semiconductor chip CP2 include the pad electrodes P2 electrically connected with the leads LD via the wires BW, and the pad electrodes P2 electrically connected with the pad electrodes P1 of the semiconductor chip CP1 via the wires BW. In addition, the semiconductor device PKG has the plurality of wires BW, and the plurality of wires BW include the wires BW electrically connecting the pad electrodes P1 of the semiconductor chip CP1 with the leads LD, the wires BW electrically connecting the pad electrodes P2 of the semiconductor chip CP2 with the leads LD, and the wires BW electrically connecting the pad electrodes P1 of the semiconductor chip CP1 and the pad electrodes P2 of the semiconductor chip CP2.

Note that the plurality of pad electrodes P1 arranged along the side surface SM1 are electrically connected with the plurality of leads LD arranged on the side of the side surface MRc1 of the sealing portion MR via the plurality of wires BW, respectively, of the plurality of pad electrodes P1 formed in the front surface of the semiconductor chip CP1. In addition, the plurality of pad electrodes P1 arranged along the side surface SM2 are electrically connected with the plurality of leads LD arranged on the side of the side surface MRc2 of the sealing portion MR via the plurality of wires BW, respectively, of the plurality of pad electrodes P1 formed in the front surface of the semiconductor chip CP1. In addition, the plurality of pad electrodes P1 arranged along the side surface SM4 are electrically connected with the plurality of leads LD arranged on the side of the side surface MRc4 of the sealing portion MR via the plurality of wires BW, respectively, of the plurality of pad electrodes P1 formed in the front surface of the semiconductor chip CP1. In addition, the plurality of pad electrodes P2 arranged along the side surface SM6 is electrically connected with the plurality of leads LD arranged on the side of the side surface MRc2 of the sealing portion MR via the plurality of wires BW, respectively, of the plurality of pad electrodes P2 formed in the front surface of the semiconductor chip CP2. In addition, the plurality of pad electrodes P2 arranged along the side surface SM7 are electrically connected with the plurality of leads LD arranged on the side of the side surface MRc3 of the sealing portion MR via the plurality of wires BW, respectively, of the plurality of pad electrodes P2 formed in the front surface of the semiconductor chip CP2. In addition, the plurality of pad electrodes P2 arranged along the side surface SM8 are electrically connected with the plurality of leads LD arranged on the side of the side surface MRc4 of the sealing portion MR via the plurality of wires BW, respectively, of the plurality of pad electrodes P2 formed in the front surface of the semiconductor chip CP2. In addition, the plurality of pad electrodes P1 arranged along the side surface SM3, of the plurality of pad electrodes P1 formed in the front surface of the semiconductor chip CP1, and the plurality of pad electrodes P2 arranged along the side surface SM5, of the plurality of pad electrodes P2 formed in the front surface of the semiconductor chip CP2, are electrically connected with each other via the plurality of wires BW, respectively.

In addition, the plurality of pad electrodes P1 formed in the front surface of the semiconductor chip CP1 include a plurality of source pad electrodes P1S (see FIG. 9). The plurality of source pad electrodes P1S are arranged along the side surface SM1 in the front surface of the semiconductor chip CP1 and are electrically connected with the leads LD arranged on the side of the side surface MRc1 of the sealing portion MR via the wires BW, respectively. Accordingly, the pad electrodes P1 electrically connected with the leads LD via the wires BW include the source pad electrodes P1S. The source pad electrodes P1S are source pad electrodes (pads or bonding pads) and are electrically connected to a source of the power transistor (corresponding to the power MOSFET Q1 to be described later) formed in the semiconductor chip CP1. The plurality of source pad electrodes P1S can be arranged along the side surface SM1 and can be also arranged apart from the side surface SM1 to some extent, in the front surface of the semiconductor chip CP1.

The wires (the bonding wires) BW are conductive connecting members and more specifically, conductive wires. The wires BW are composed of metal and can be also regarded as metal wires (metal fine wires). The wires BW are sealed in the sealing portion MR and are not exposed from the sealing portion MR. Portions of the respective leads LD connected to the wires BW are the inner lead portions positioned in the sealing portion MR.

All the wires BW can be made to have the same thickness (the diameter) in the plurality of wires BW included in the semiconductor device PKG (corresponding to the wires BW illustrated in FIG. 2). However, the thicknesses (the diameters) of the wires BW connecting the source pad electrodes P1S of the semiconductor chip CP1 and the leads LD are more preferably made larger than the thicknesses (the diameters) of the other wires BW, of the plurality of wires BW included in the semiconductor device PKG (corresponding to the wires BW illustrated in FIG. 2). That is, the thicknesses (the diameters) of the wires BW connected to the source pad electrodes P1S are more preferably made larger than the thicknesses (the diameters) of the wires BW connected to the pad electrodes P1 and P2 except the source pad electrodes P1S, of the plurality of wires BW included in the semiconductor device PKG (corresponding to the wires BW illustrated in FIG. 2). The reason is given as follows:

That is, a large current flows through each of the wires BW connecting the source pad electrodes P1S of the semiconductor chip CP1 and the leads LD in comparison to the other wires BW. Accordingly, increasing each thickness (each diameter) of the wires BW connecting the source pad electrodes P1S of the semiconductor chip CP1 and the leads LD can reduce resistance to decrease a loss. Meanwhile, such a large current does not flow through each of the other wires BW except the wires BW connecting the source pad electrodes P1S of the semiconductor chip CP1 and the leads LD. Accordingly, decreasing each thickness (each diameter) of the other wires BW except the wires BW connecting the source pad electrodes P1S of the semiconductor chip CP1 and the leads LD can reduce each size of the pad electrodes P1 and P2 connected to the other wires BW except the wires BW connecting the source pad electrodes P1S of the semiconductor chip CP1 and the leads LD so as to have an advantage in miniaturizing the semiconductor chips CP1 and CP2. Byway of example, the diameters of the wires BW connected to the source pad electrodes P1S can be set to approximately 35 μm, and the diameters of the wires BW connected to the pad electrodes P1 and P2 except the source pad electrodes P1S can be set to approximately 20 μm.

Examples of the wires BW that can be suitably used include a gold (Au) wire, a copper (Cu) wire, or an aluminum (Al) wire.

In addition, as described above, for the wires BW connected to the source pad electrodes P1S, each thickness (each diameter) can be increased, and the copper wires can be used. For the wires BW connected to the pad electrodes P1 and P2 except the source pad electrodes P1S, each thickness (each diameter) can be decreased, and the gold wires can be used. That is, the wires BW connected to the source pad electrodes P1S and the wires BW connected to the pad electrodes P1 and P2 except the source pad electrodes P1S can be different from each other in the materials. The copper (Cu) wires each having a large diameter can be used for the former wires, and the gold (Au) wires each having a small diameter can be used for the latter wires. Using the copper (Cu) wires for the wires BW each having the large diameter (that is, the wires BW connected to the source pad electrodes P1S) can reduce manufacturing costs of the semiconductor device PKG. By using the gold (Au) wires for the wires BW each having the small diameter (that is, the wires BW connected to the pad electrodes P1 and P2 except the source pad electrodes P1S), even when the sizes of the pad electrodes P1 and P2 to be connected to the wires BW each having the small diameter are made smaller, the wires BW can be easily and appropriately connected to the small pad electrodes P1 and P2. This is because small pads can be connected to the gold wires more easily than the copper wires. Accordingly, connection reliability of the wires BW can be improved with the manufacturing costs being reduced.

In addition, when there is no problem in connecting the copper wires to the pad electrodes P1 and P2 in terms of the sizes of the pad electrodes P1 and P2, the copper (Cu) wires can be used not only for the wires BW connected to the source pad electrodes P1S but also for the wires BW connected to the pad electrodes P1 and P2 except the source pad electrodes P1S. That is, the copper (Cu) wires can also be used for all the wires BW included in the semiconductor device PKG. Accordingly, the manufacturing costs of the semiconductor device PKG can be further reduced.

<Manufacturing Process of Semiconductor Device>

Figure 10:
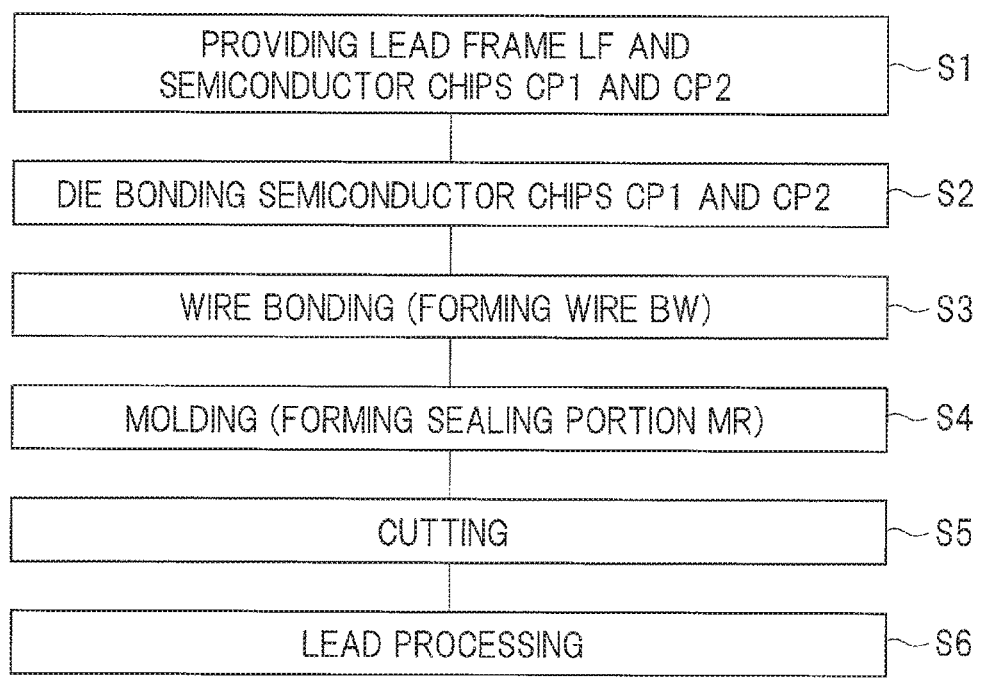
FIG. 10 is a process flow chart illustrating a manufacturing process of the semiconductor device according to the embodiment.

Next, a manufacturing process of the semiconductor device PKG illustrated in FIGS. 1 to 9 will be described. FIG. 10 is a process flow chart illustrating the manufacturing process of the semiconductor device PKG illustrated in FIGS. 1 to 9 described above. FIGS. 11 to 15 are cross-sectional views of the semiconductor device PKG during the manufacturing process. Note that FIGS. 11 to 15 each illustrate a cross-section corresponding to FIG. 6.

First, a lead frame LF and the semiconductor chips CP1 and CP2 are prepared in order to manufacture the semiconductor device PKG (step S1 in FIG. 10).

Figure 11:
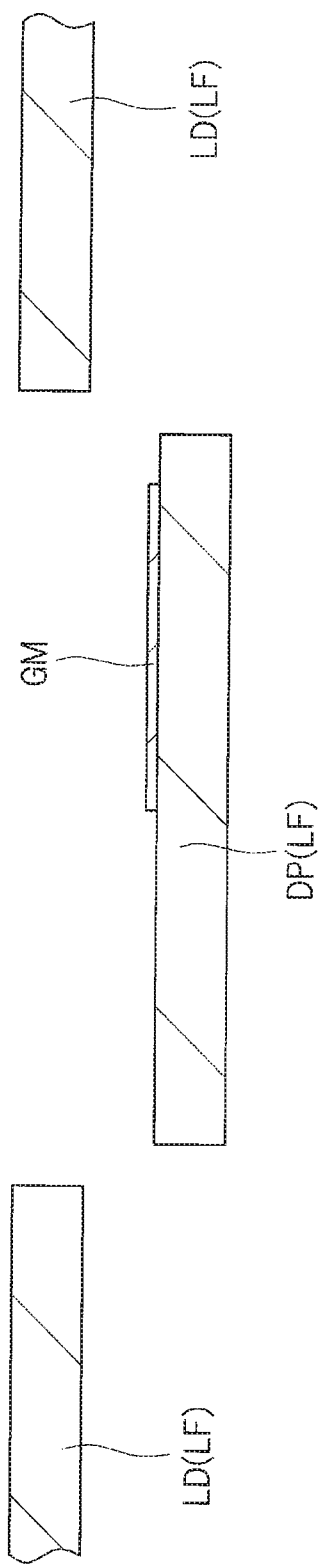
FIG. 11 is a cross-sectional view of the semiconductor device according to the embodiment during the manufacturing process.

As illustrated in FIG. 11, the lead frame LF integrally has a frame (not illustrated), the plurality of leads LD connected to the frame, and the die pad DP connected with the frame via the plurality of suspension leads TL.

In step S1, the preparation of the lead frame LF, the preparation of the semiconductor chip CP1, and the preparation of the semiconductor chip CP2 may be made in random order or may be simultaneously made.

Figure 12:
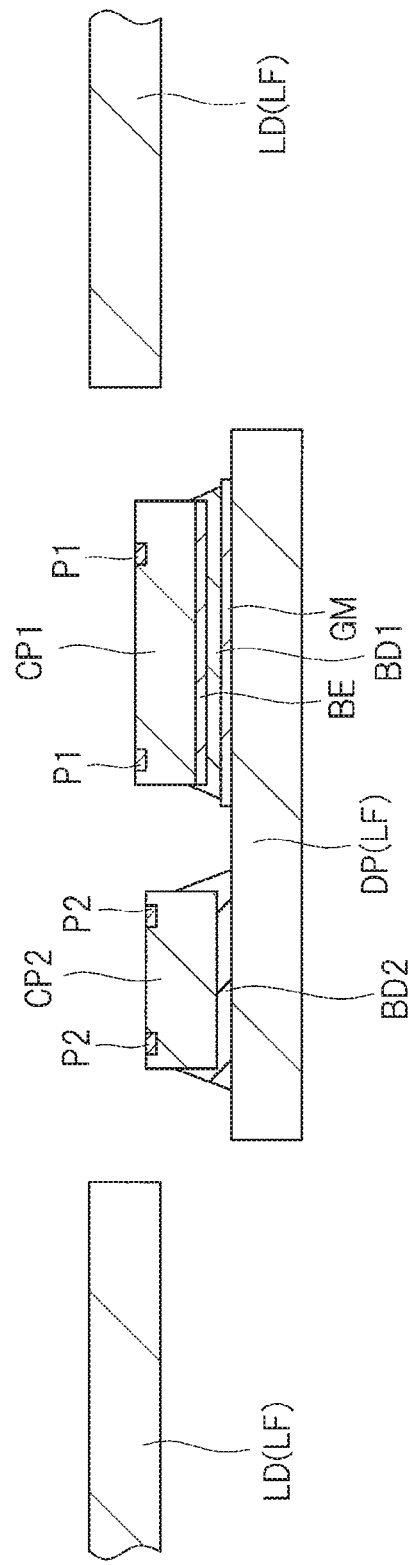
FIG. 12 is a cross-sectional view of the semiconductor device during the manufacturing process subsequent to FIG. 11.

Next, as illustrated in FIG. 12, a die bonding step of the semiconductor chips CP1 and CP2 is performed. In this step, the semiconductor chip CP1 is mounted over and bonded to the die pad DP of the lead frame via the conductive bonding member BD1, and the semiconductor chip CP2 is mounted over and bonded to the die pad DP of the lead frame via the insulating bonding member BD2 (step S2 in FIG. 10). Since the back surface electrode BE is formed on the back surface of the semiconductor chip CP1, the back surface electrode BE of the semiconductor chip CP1 is bonded to the die pad DP via the conductive bonding member BD1 in step S2. Step S2 will be described in more detail later.

Figure 13:
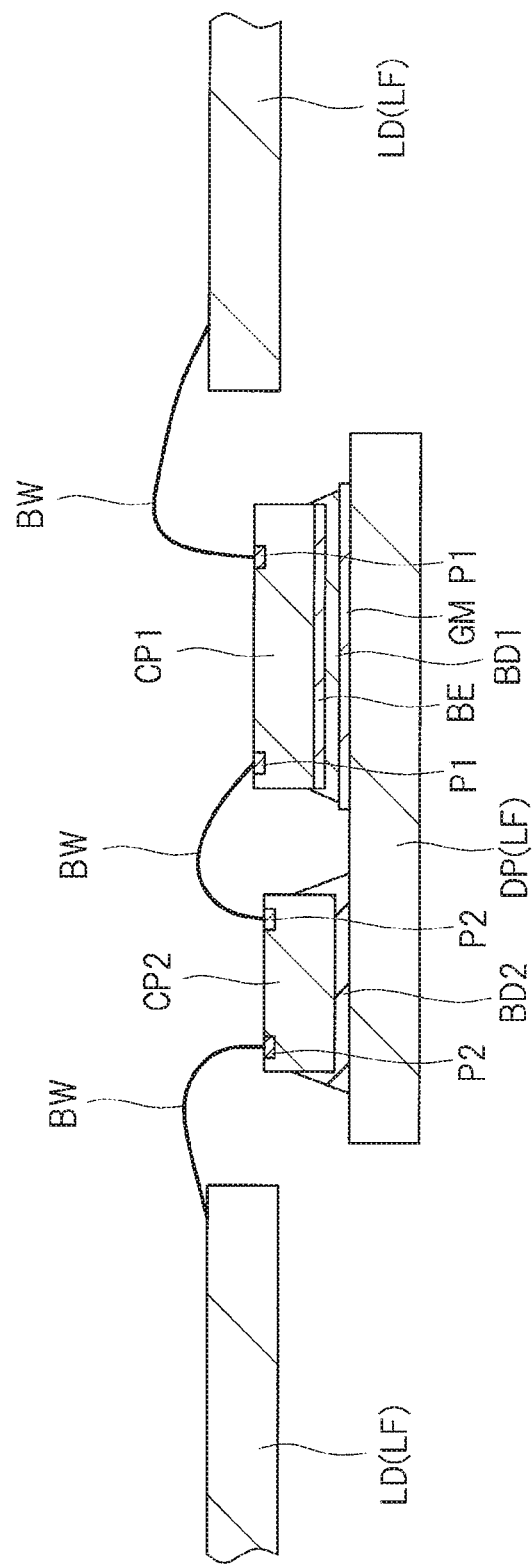
FIG. 13 is a cross-sectional view of the semiconductor device during the manufacturing process subsequent to FIG. 12.

After the die bonding step is performed in step S2, as illustrated in FIG. 13, a wire bonding step is performed (step S3 in FIG. 10).

In step S3, the plurality of wires BW electrically connect between the plurality of pad electrodes P1 of the semiconductor chip CP1 and the plurality of leads LD of the lead frame LF, between the plurality of pad electrodes P2 of the semiconductor chip CP2 and the plurality of leads LD of the lead frame LF, and between the plurality of pad electrodes P1 of the semiconductor chip CP1 and the plurality of pad electrodes P2 of the semiconductor chip CP2, respectively.

As described above, when each thickness (each diameter) of the wires BW connecting the source pad electrodes P1S of the semiconductor chip CP1 and the leads LD is made larger than each thickness (each diameter) of the other wires BW, in step S3, the wire bonding step is preferably performed in two stages. That is, wire bonding is first performed with the wires BW each having the large diameter as the first stage, and then, wire bonding is performed with the wires BW each having the small diameter as the second stage.

Specifically, the wire bonding is first performed for the wires BW illustrated in FIG. 10 as the first stage. Accordingly, the wires BW each having the large diameter electrically connect between the plurality of source pad electrodes P1S of the semiconductor chip CP1 and the plurality of leads LD, respectively. After that, the wire bonding is performed for the wires BW illustrated in FIG. 11. Accordingly, the wires BW each having the small diameter electrically connect between the plurality of pad electrodes P1 of the semiconductor chip CP1 except the source pad electrodes P1S, and the plurality of leads LD, between the plurality of pad electrodes P2 of the semiconductor chip CP2 and the plurality of leads LD, and between the plurality of pad electrodes P1 of the semiconductor chip CP1 and the plurality of pad electrodes P2 of the semiconductor chip CP2, respectively.

A wire having a small diameter is deformed more easily than a wire having a large diameter. Accordingly, in step S3, the wire bonding in which the wires BW each having the large diameter are used is first performed, and then, the wire bonding in which the wires BW each having the small diameter are used is performed, so that a possibility of deforming the wire BW during the wire bonding step in step S3 can be reduced.

Figure 14:
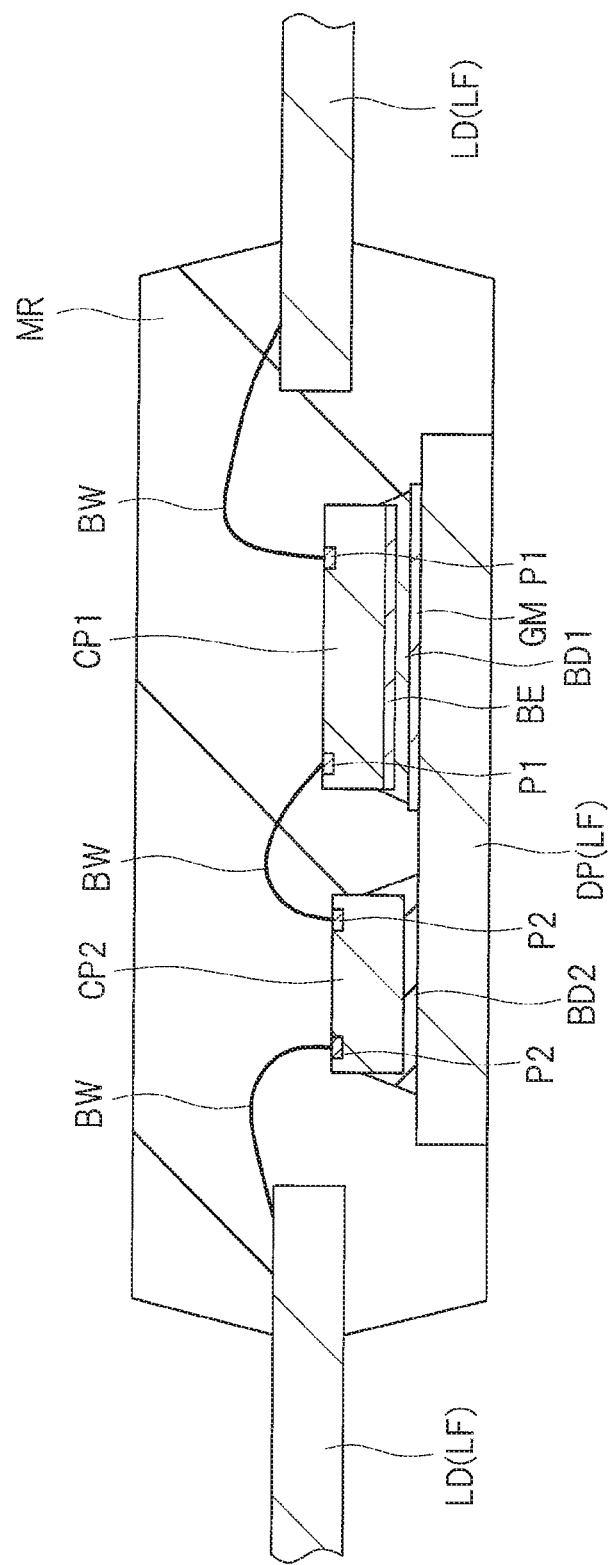
FIG. 14 is a cross-sectional view of the semiconductor device during the manufacturing process subsequent to FIG. 13.

Next, resin sealing is performed in a molding step (a resin molding step), and as illustrated in FIG. 14, the sealing portion MR seals the semiconductor chips CP1 and CP2 and the plurality of wires BW connected thereto (step S4 in FIG.

10). In this molding step in step S4, the sealing portion MR sealing the semiconductor chips CP1 and CP2, the die pad DP, the inner lead portions of the plurality of leads LD, the plurality of wires BW, and the suspension leads TL, is formed.

Next, as necessary, plating treatment is performed to the outer lead portions of the leads LD exposed from the sealing portion MR. After that, the leads LD and the suspension leads TL are cut off at predetermined positions outside the sealing portion MR so as to be separated from the frame of the lead frame LF (step S5 in FIG. 10).

Figure 15:
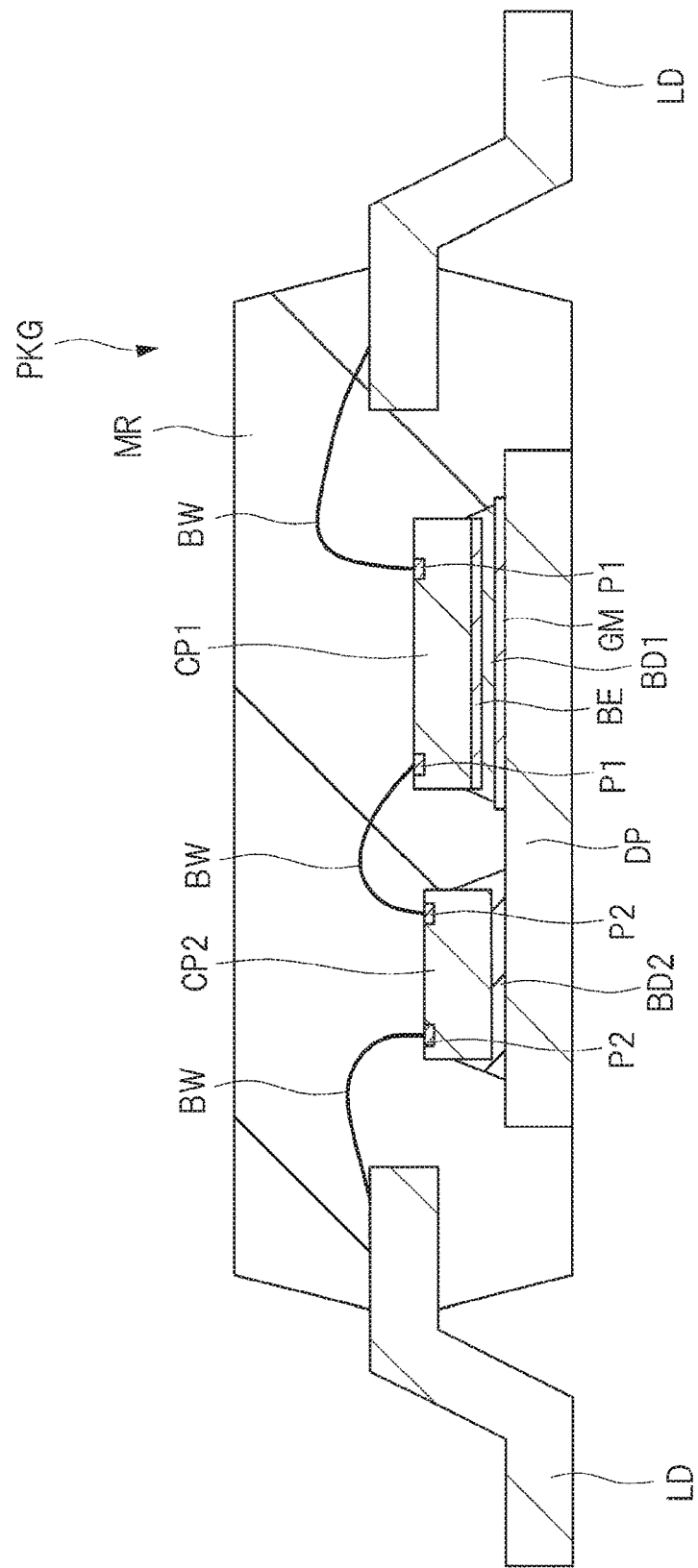
FIG. 15 is a cross-sectional view of the semiconductor device during the manufacturing process subsequent to FIG. 14.

Next, as illustrated in FIG. 15, bending processing (lead processing or lead forming) is performed to the outer lead portions of the leads LD protruding from the sealing portion MR (step S6 in FIG. 10).

In this manner, the semiconductor device PKG illustrated in FIGS. 1 to 9 is manufactured.

<Die Bonding Step>

The die bonding step in step S2 will be described in detail with reference to the drawings. FIGS. 16 to 19 are process flow charts illustrating the die bonding step in step S2 in detail of the process flow in FIG. 10. In addition, FIGS. 20 to 30 are plan views or cross-sectional views of the semiconductor device PKG during the manufacturing process. Of FIGS. 20 to 30, FIGS. 20, 21, 23, 25, 27, 29, and 30 are plan views, and FIGS. 22, 24, 26, and 28 each illustrate a cross-section corresponding to FIG. 6. Note that a cross-sectional view taken along a line A1-A1 in FIG. 20 corresponds to FIG. 11, a cross-sectional view taken along the line A1-A1 in FIG. 21 corresponds to FIG. 22, a cross-sectional view taken along the line A1-A1 in FIG. 23 corresponds to FIG. 24, a cross-sectional view taken along the line A1-A1 in FIG. 25 corresponds to FIG. 26, and a cross-sectional view taken along the line A1-A1 in FIG. 27 corresponds to FIG. 28.

Figure 20:
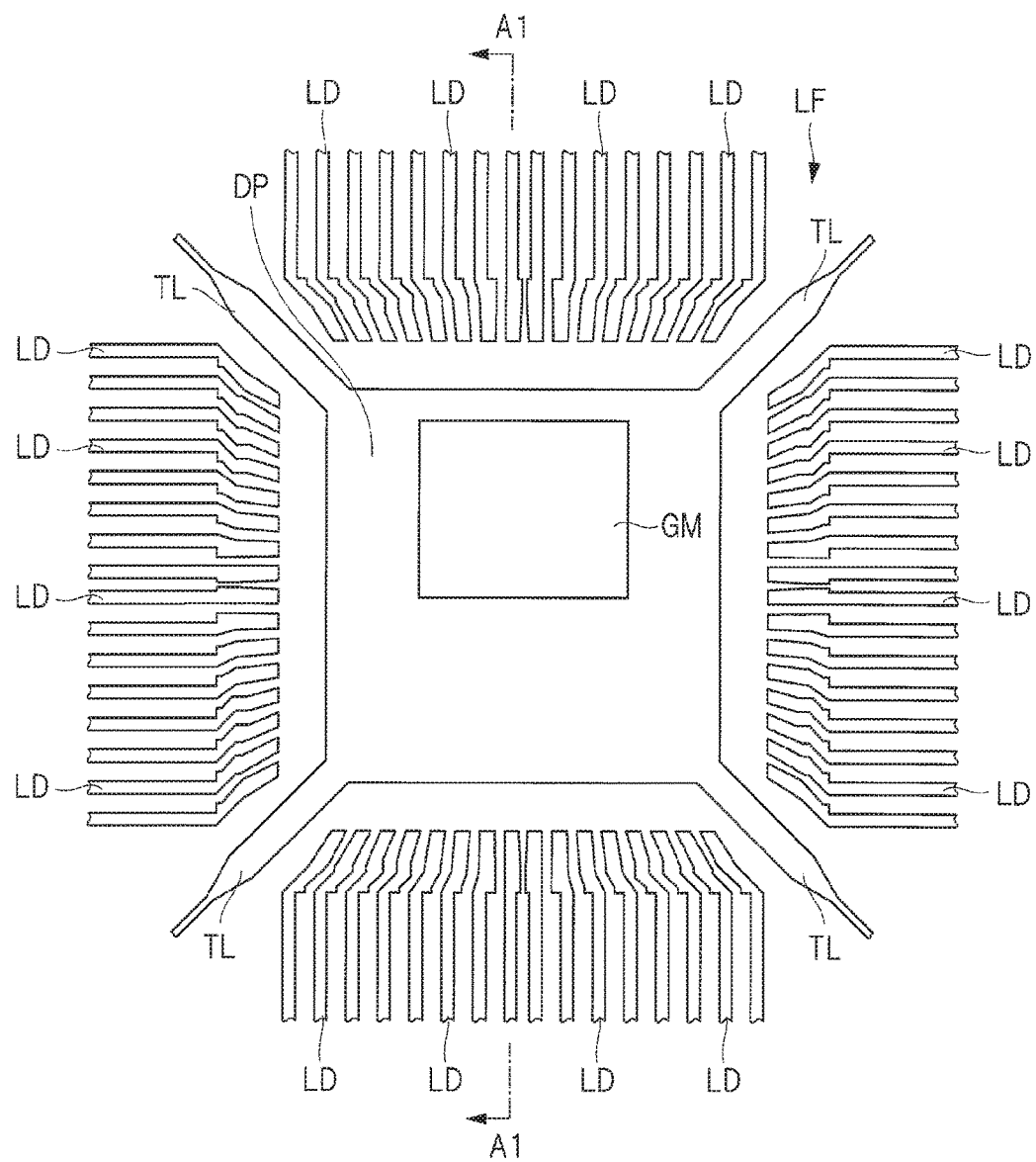
FIG. 20 is a plan view of the semiconductor device according to the embodiment during the manufacturing process.

FIG. 20 illustrates a plan view of the lead frame LF at a stage before the die bonding step in step S2 and illustrates a plan view of a region from which one semiconductor device PKG is obtained. FIGS. 21, 23, 25, 27, 29, and 30 each illustrate the same plane region as that in FIG. 20.

Figure 16:
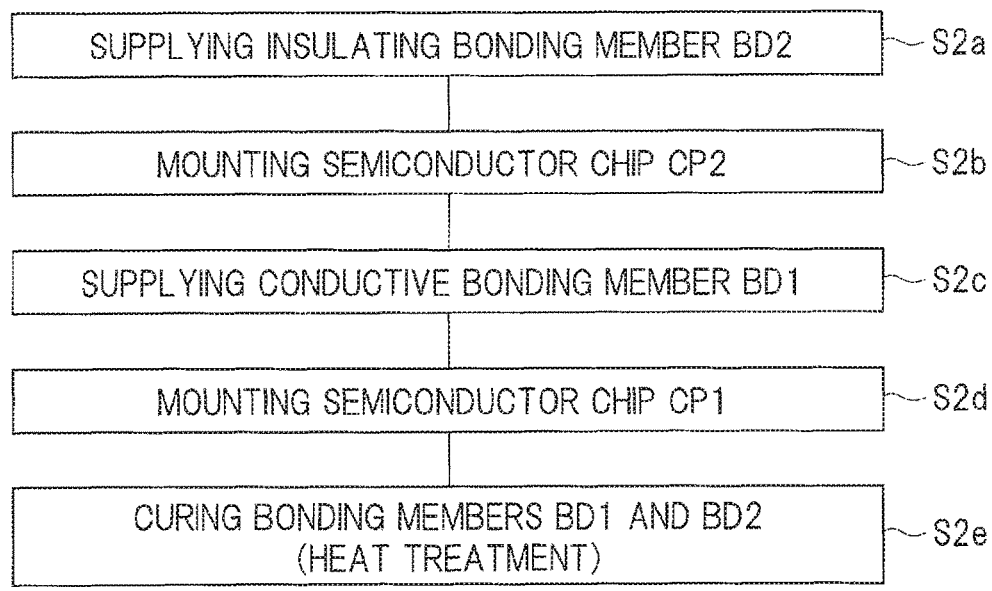
FIG. 16 is a process flow chart of a detailed die bonding step.

Specifically, step S2 can be performed as illustrated in FIG. 16.

Figure 21:
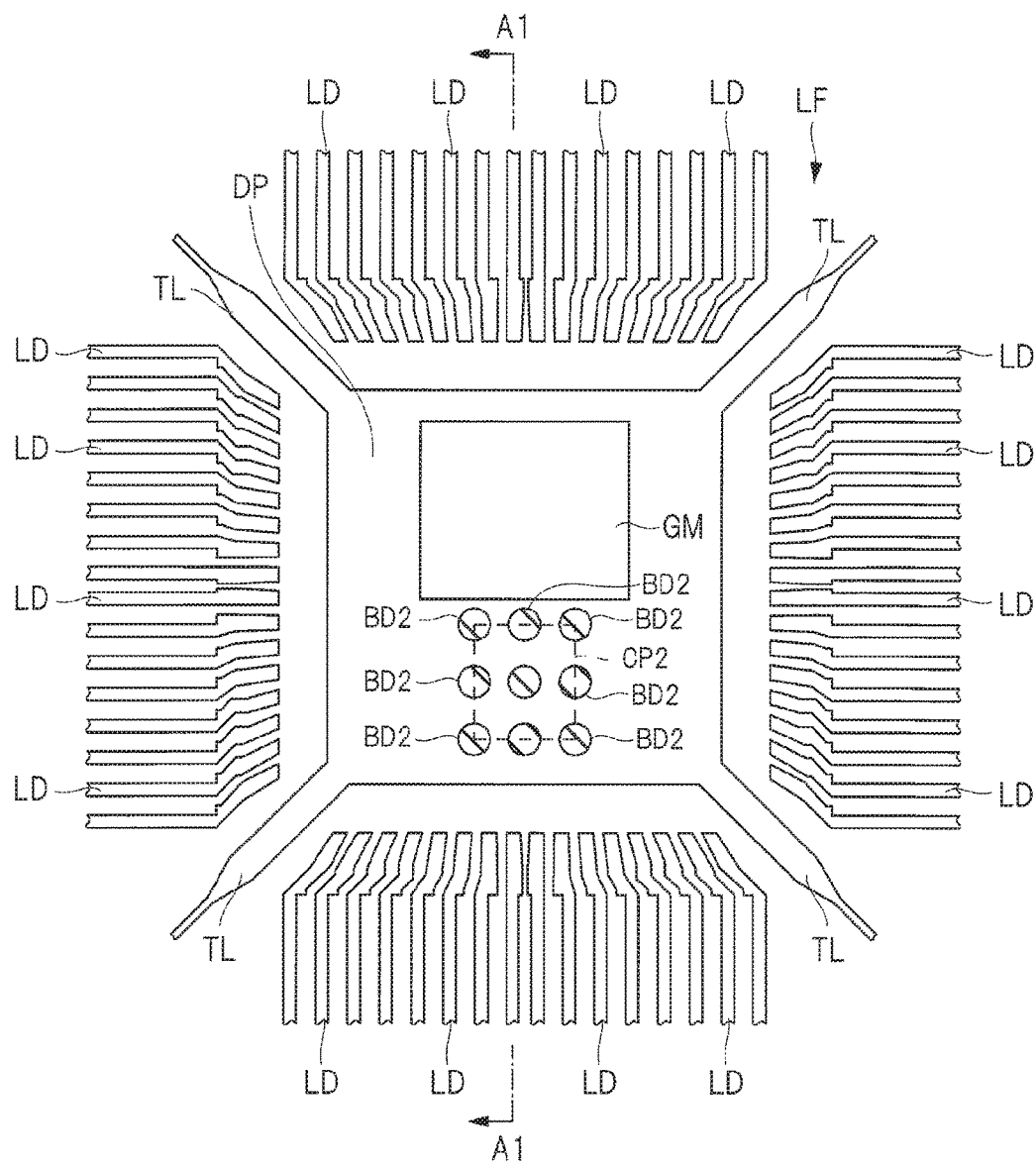
FIG. 21 is a plan view of the semiconductor device during the manufacturing process subsequent to FIG. 20.
Figure 22:
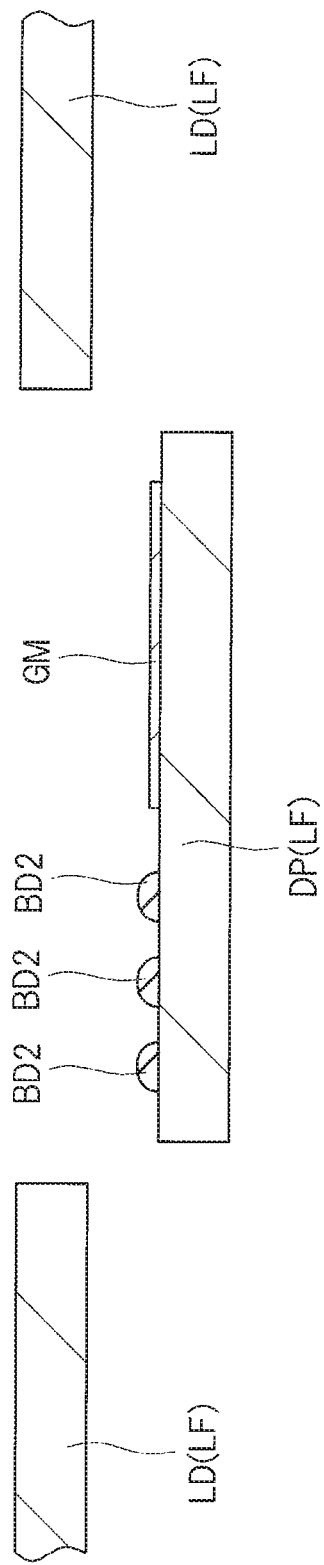
FIG. 22 is a cross-sectional view of the semiconductor device of FIG. 21 during the manufacturing process.

That is, as illustrated in FIGS. 21 and 22, the insulating bonding member BD2 is first supplied to the predetermined region to be mounted with the semiconductor chip CP2 on the upper surface of the die pad DP (step S2a in FIG. 16).

Figure 23:
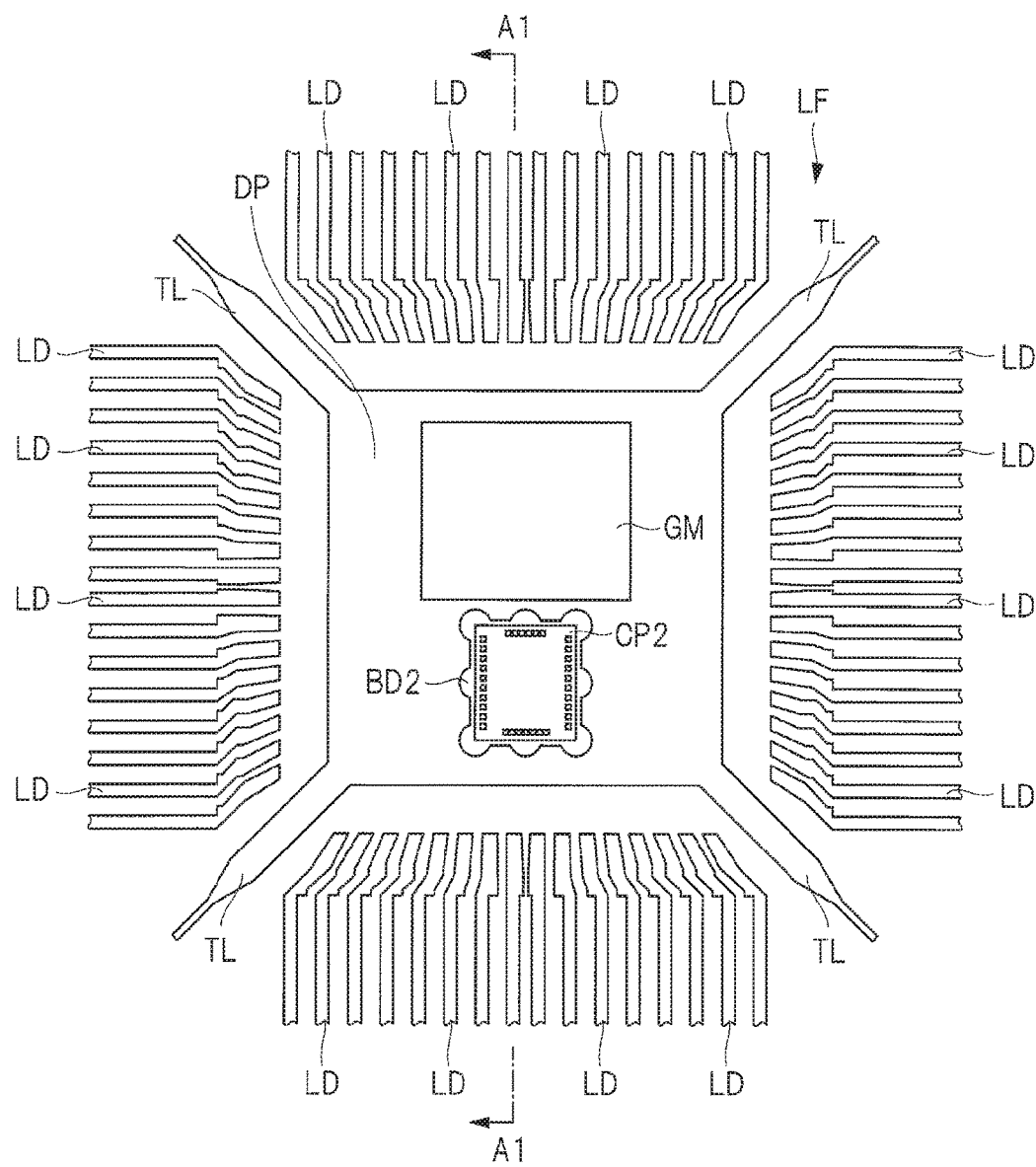
FIG. 23 is a plan view of the semiconductor device during the manufacturing process subsequent to FIG. 21.
Figure 24:
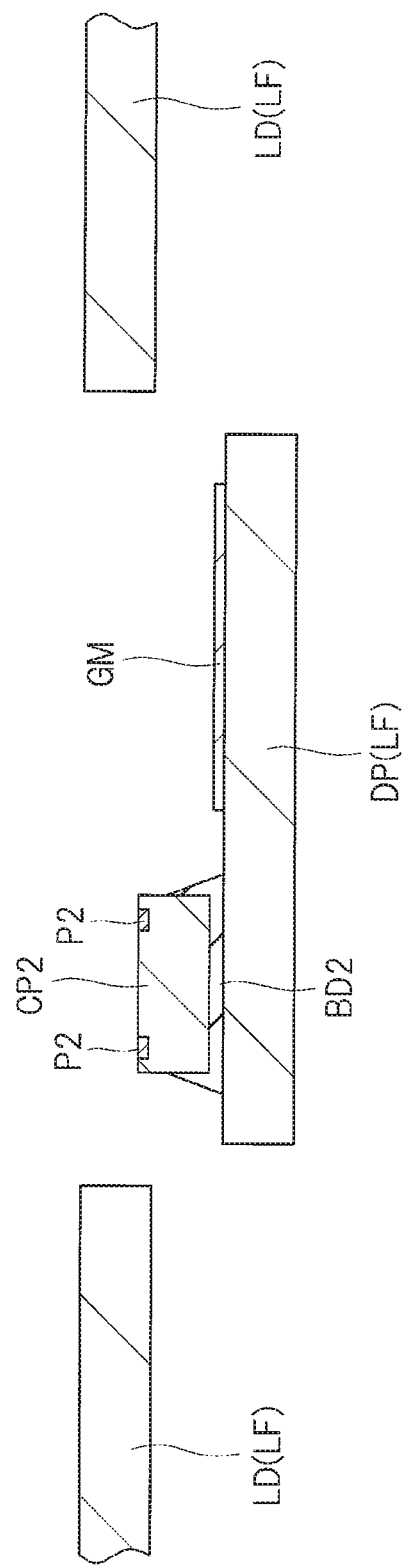
FIG. 24 is a cross-sectional view of the semiconductor device of FIG. 23 during the manufacturing process.

Then, as illustrated in FIGS. 23 and 24, the semiconductor chip CP2 is mounted over the upper surface of the die pad DP via the bonding member BD2 (step S2b in FIG. 16).

The bonding member BD2 is preferably composed of the insulating paste type bonding member (the adhesive member). In steps S2a and S2b, the bonding member BD2 has not been cured and is still paste having viscosity.

The insulating paste type bonding member (the adhesive member) including an insulating spacer (an insulating particle or an insulating spacer particle) is further preferably used as the bonding member BD2. The insulating spacer included in the bonding member BD2 is interposed between the semiconductor chip CP2 and the die pad DP, so that a space between the semiconductor chip CP2 and the die pad DP can be secured. That is, the space between the semiconductor chip CP2 and the die pad DP is substantially the same as the size (the diameter) of the insulating spacer included in the bonding member BD2. Accordingly, a thickness of the bonding member BD2 interposed between the semiconductor chip CP2 and the die pad DP can be prevented from thinning, and the bonding member BD2 having a desired thickness can be interposed between the semiconductor chip CP2 and the die pad DP. Accordingly, a withstand voltage between the semiconductor chip CP2 and the die pad DP can be prevented from decreasing due to the thinning of the thickness of the bonding member BD2 interposed between the semiconductor chip CP2 and the die pad DP.

The insulating spacer included in the bonding member BD2 is composed of, for example, methacrylic acid ester copolymer, and a size (an average particle diameter) can be set to, for example, approximately 10 to 40 μm. Accordingly, the thickness of the bonding member BD2 interposed between the semiconductor chip CP2 and the die pad DP can be set to, for example, approximately 10 to 40 μm.

Figure 25:
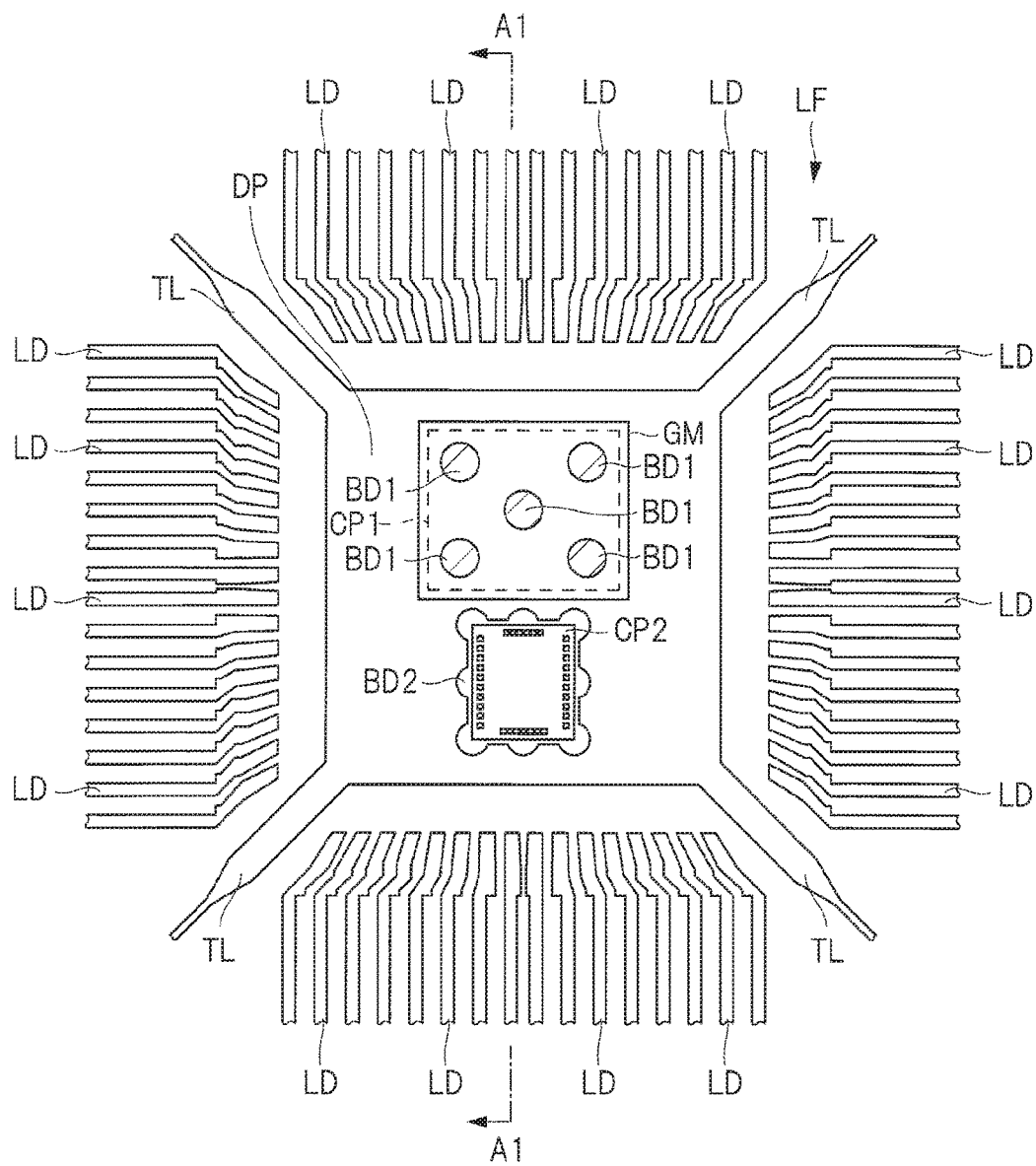
FIG. 25 is a plan view of the semiconductor device during the manufacturing process subsequent to FIG. 23.
Figure 26:
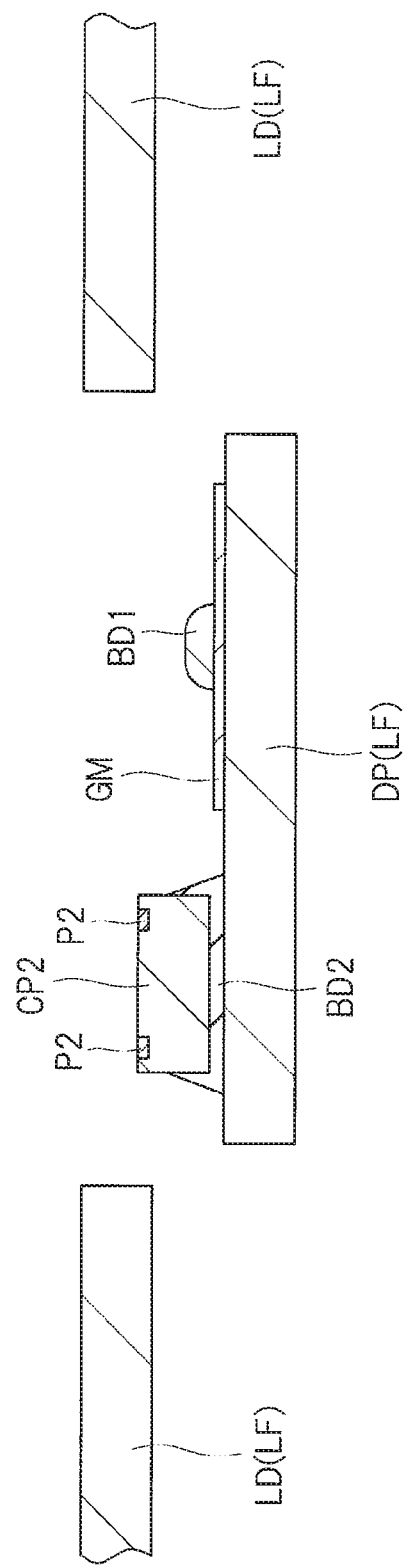
FIG. 26 is a cross-sectional view of the semiconductor device of FIG. 25 during the manufacturing process.

Then, as illustrated in FIGS. 25 and 26, the conductive bonding member BD1 is supplied to the predetermined region to be mounted with the semiconductor chip CP1 on the upper surface of the die pad DP (step S2c in FIG. 16).

Figure 27:
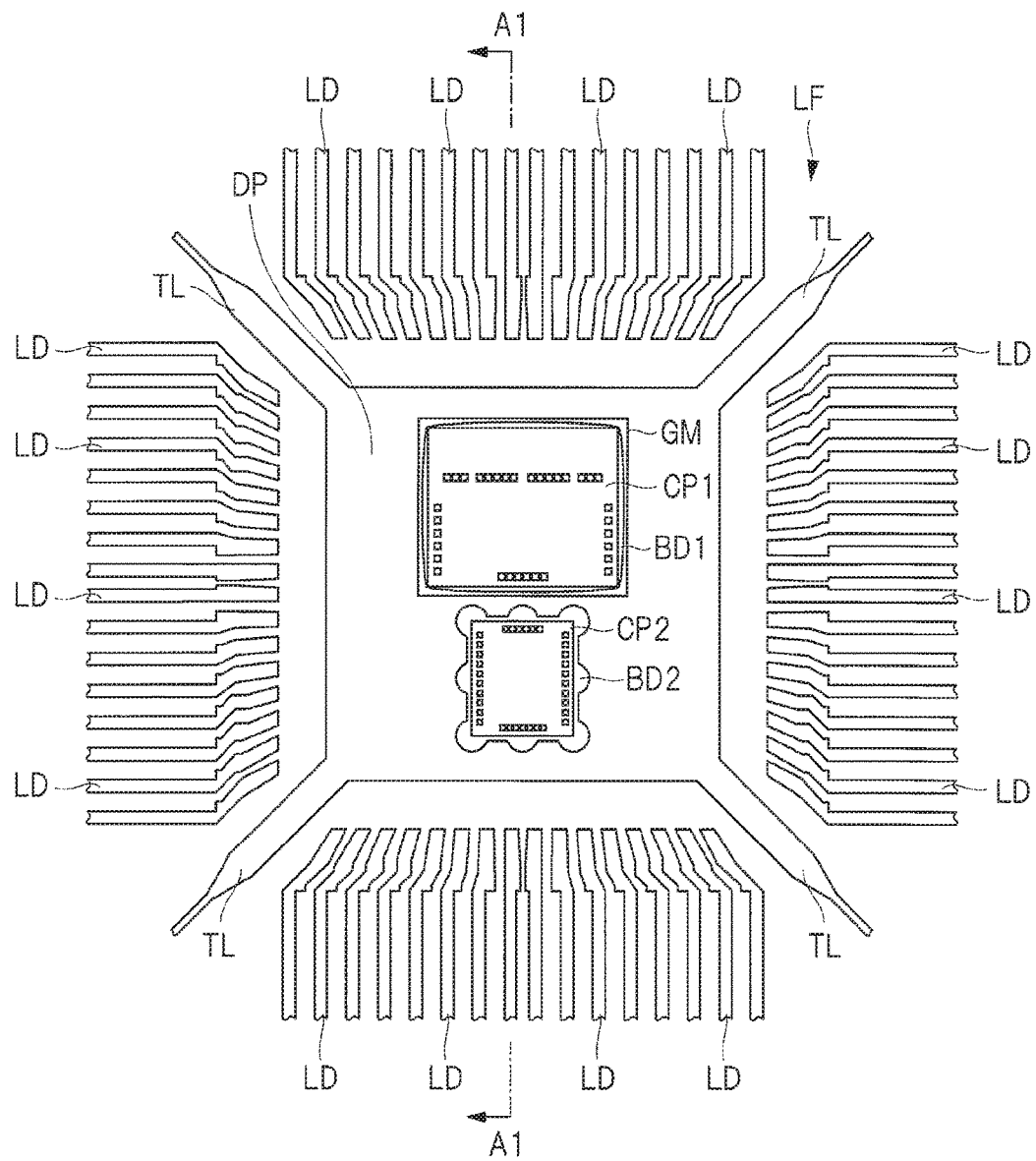
FIG. 27 is a plan view of the semiconductor device during the manufacturing process subsequent to FIG. 25.
Figure 28:
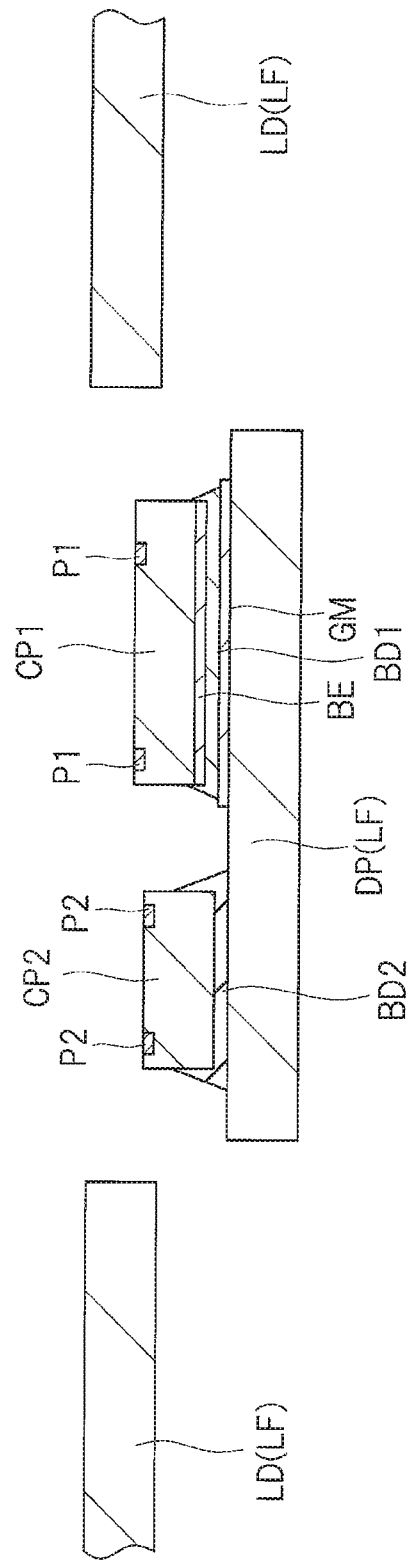
FIG. 28 is a cross-sectional view of the semiconductor device of FIG. 27 during the manufacturing process.

Then, as illustrated in FIGS. 27 and 28, the semiconductor chip CP1 is mounted over the upper surface of the die pad DP via the bonding member BD1 (step S2d in FIG. 16).

The bonding member BD1 preferably includes the conductive paste type bonding member (the adhesive member) such as the silver (Ag) paste. In steps S2c and S2d, the bonding member BD1 has not been cured and is still paste having viscosity.

The conductive paste type bonding member (the adhesive member) including an insulating spacer (an insulating particle or an insulating spacer particle) is further preferably used as the bonding member BD1. The insulating spacer included in the bonding member BD1 is interposed between the semiconductor chip CP1 and the die pad DP, so that a space between the semiconductor chip CP1 and the die pad DP can be secured. That is, the space between the semiconductor chip CP1 and the die pad DP is substantially the same as the size (the diameter) of the insulating spacer included in the bonding member BD1. Accordingly, a thickness of the bonding member BD1 interposed between the semiconductor chip CP1 and the die pad DP can be prevented from thinning, and the bonding member BD1 having a desired thickness can be interposed between the semiconductor chip CP1 and the die pad DP. When the thickness of the bonding member BD1 interposed between the semiconductor chip CP1 and the die pad DP is reduced, a crack due to thermal stress may easily occur in the bonding member BD1 between the semiconductor chip CP1 and the die pad DP. However, interposing the insulating spacer in the bonding member BD1 can eliminate the risk.

A size (an average particle diameter) of the insulating spacer included in the bonding member BD1 can be set to, for example, approximately 10 to 20 μm. Accordingly, the thickness of the bonding member BD1 interposed between the semiconductor chip CP1 and the die pad DP can be set to, for example, approximately 10 to 20 μm.

After that, heat treatment (baking treatment) is performed so as to cure the bonding member BD1 and the bonding member BD2 (step S2e in FIG. 16). When the bonding member BD2 to be supplied in step S2a and the bonding member BD1 to be supplied in step S2c each include a thermosetting bonding member, the bonding members BD1 and BD2 can be cured due to the performance of the heat treatment in step S2e.

Accordingly, the semiconductor chip CP1 is mounted over and fixed onto the die pad DP of the lead frame via the bonding member BD1, and the semiconductor chip CP2 is mounted over and fixed onto the die pad DP of the lead frame via the bonding member BD2.

In this manner, the die bonding step in step S2 can be performed.

Figure 17:
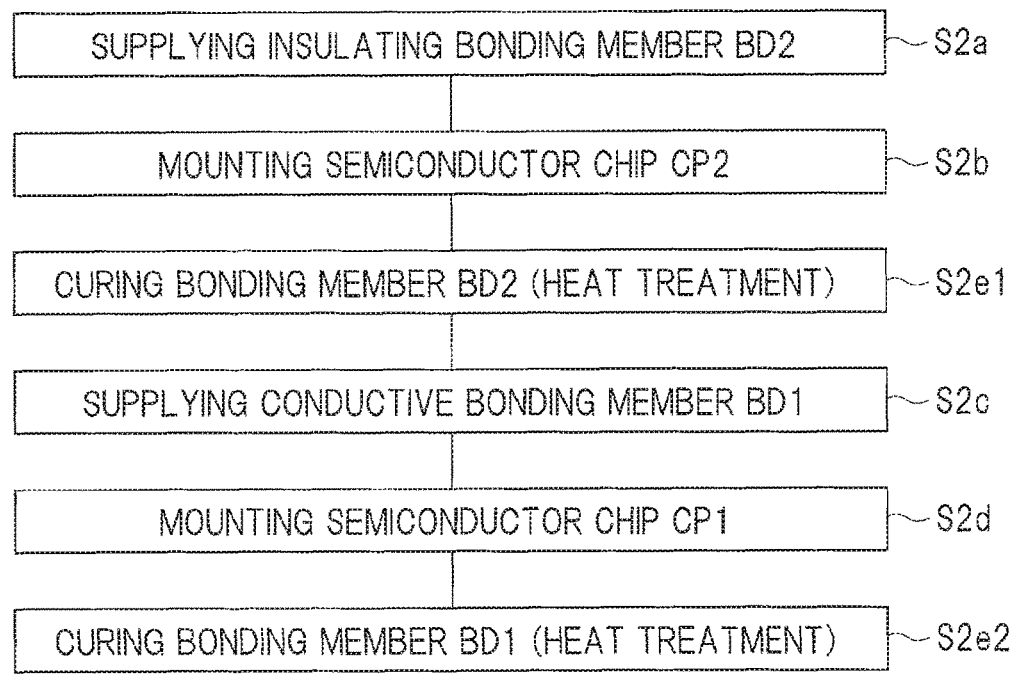
FIG. 17 is a process flow chart of another detailed die bonding step.

Step S2 can be also performed as illustrated in FIG. 17.

That is, as illustrated in FIGS. 21 and 22, the insulating bonding member BD2 is first supplied to the predetermined region to be mounted with the semiconductor chip CP2 on the upper surface of the die pad DP (step S2a in FIG. 17). The material of the bonding member BD2 is the same as that described in FIGS. 21 to 24.

Then, as illustrated in FIGS. 23 and 24, the semiconductor chip CP2 is mounted over the upper surface of the die pad DP via the bonding member BD2 (step S2b in FIG. 17).

Then, heat treatment (baking treatment) is performed so as to cure the bonding member BD2 (step S2e1 in FIG. 17). When the bonding member BD2 to be supplied in step S2a includes the thermosetting bonding member, the bonding member BD2 can be cured by performing the heat treatment in step S2e1.

Accordingly, the semiconductor chip CP2 is mounted over and fixed onto the die pad DP of the lead frame via the bonding member BD2.

Then, as illustrated in FIGS. 25 and 26, the conductive bonding member BD1 is supplied to the predetermined region to be mounted with the semiconductor chip CP1 on the upper surface of the die pad DP (step S2c in FIG. 16). The material of the bonding member BD1 is the same as that described in FIGS. 25 to 28.

Then, as illustrated in FIGS. 27 and 28, the semiconductor chip CP1 is mounted over the upper surface of the die pad DP via the bonding member BD1 (step S2d in FIG. 17).

After that, heat treatment (baking treatment) is performed so as to cure the bonding member BD1 (step S2e2 in FIG. 17). When the bonding member BD1 to be supplied in step S2c includes the thermosetting bonding member, the bonding member BD1 can be cured by performing the heat treatment in step S2e2.

Accordingly, the semiconductor chip CP1 is mounted over and is fixed onto the die pad DP of the lead frame via the bonding member BD1.

In this manner, the die bonding step in step S2 can be performed.

Figure 29:
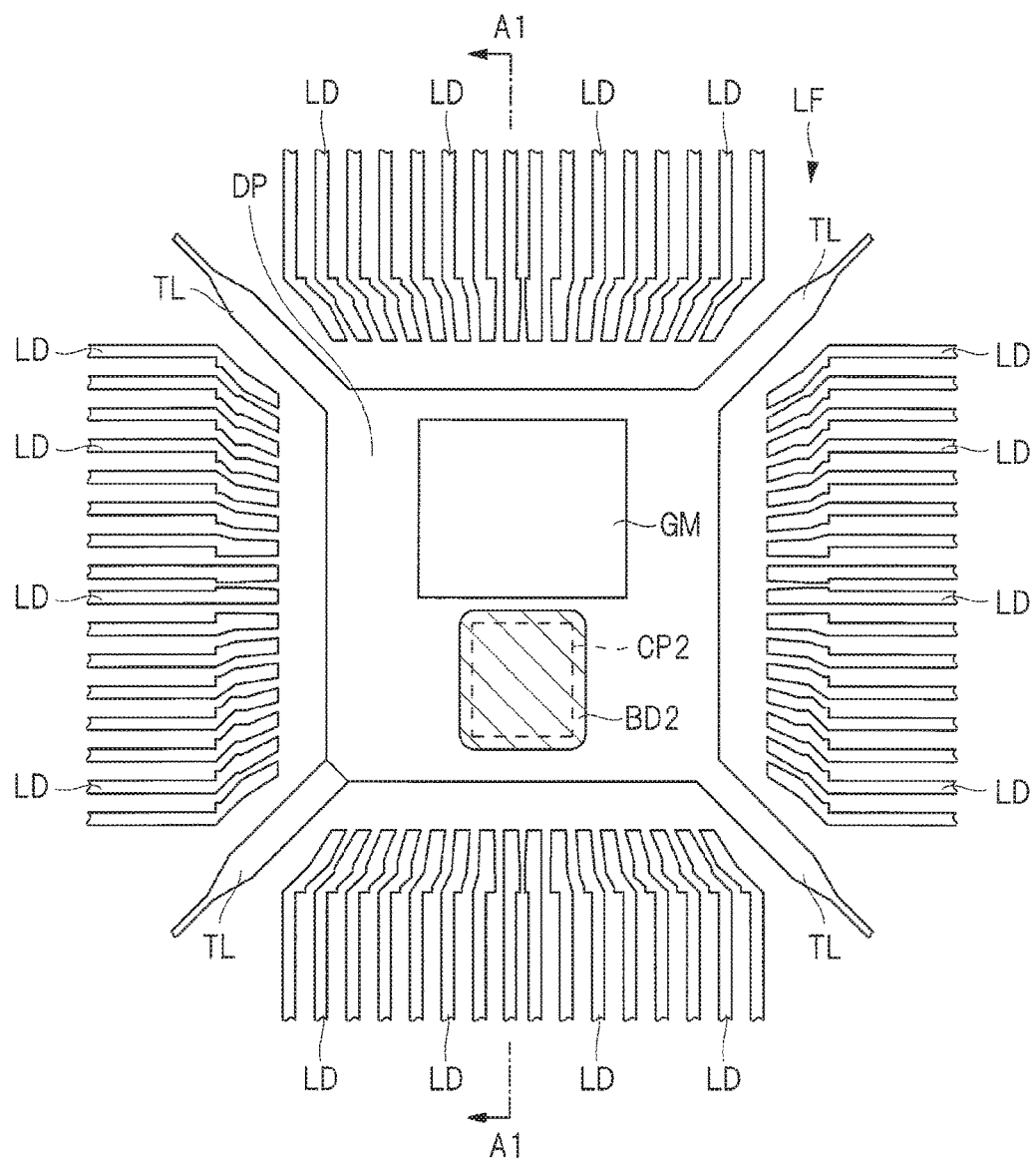
FIG. 29 is a plan view of the semiconductor device according to the embodiment during the manufacturing process.
Figure 30:
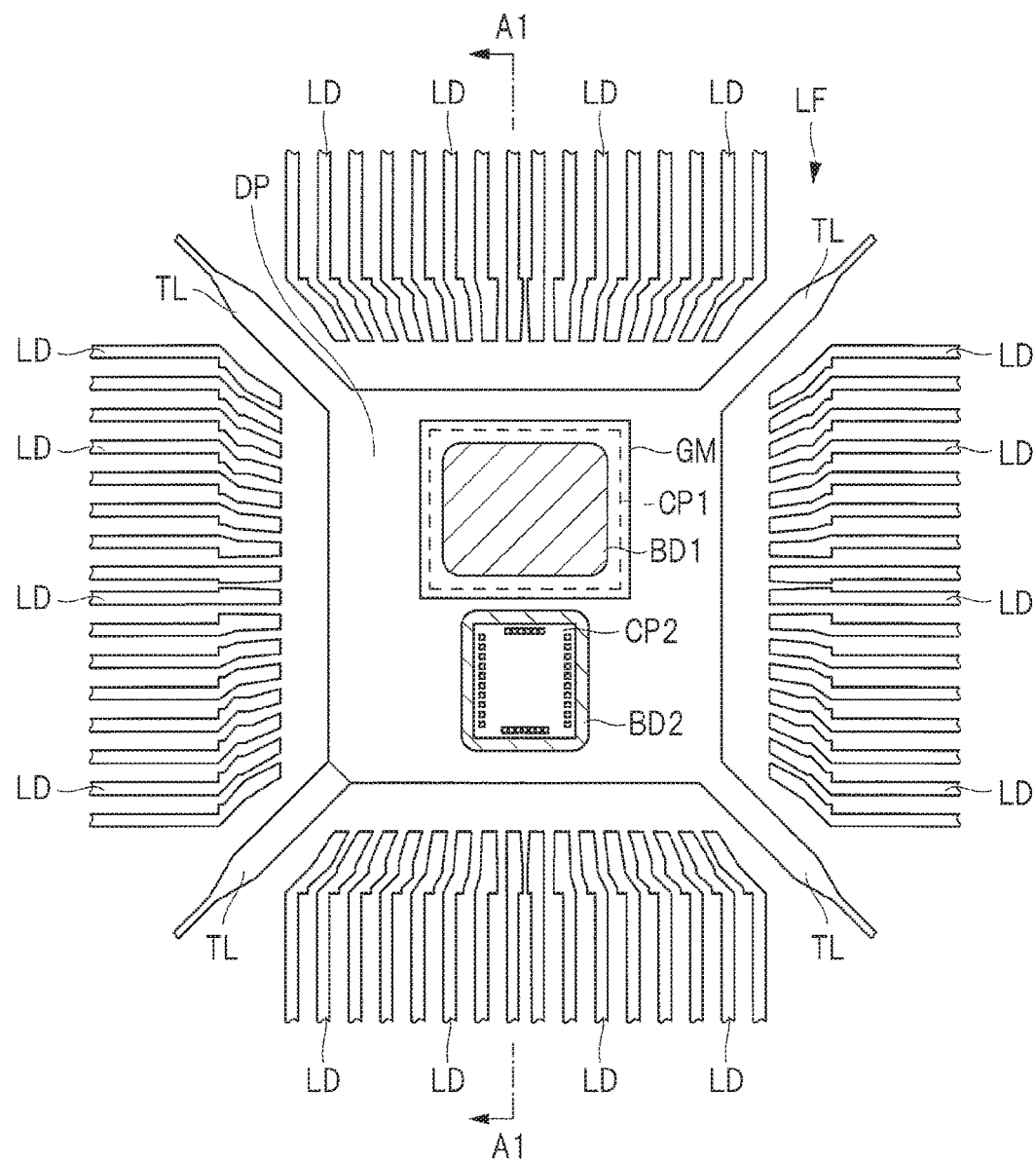
FIG. 30 is a plan view of the semiconductor device during the manufacturing process subsequent to FIG. 29.

FIGS. 21 and 22 illustrate the bonding member BD2 supplied from a nozzle (a nozzle for supplying the bonding member BD2) onto the die pad DP in step S2a. FIGS. 25 and 26 illustrate the bonding member BD1 supplied from a nozzle (a nozzle for supplying the bonding member BD1) onto the die pad DP in step S2c. As another mode, a printing method can also supply (print) the bonding member BD2 onto the die pad DP in step S2a, and the case is illustrated in FIG. 29. In addition, the printing method can supply (print) the bonding member BD1 onto the die pad DP in step S2c, and the case is illustrated in FIG. 30.

Note that, although FIGS. 21 and 29 are the plan views, the bonding member BD2 supplied onto the die pad DP is denoted with hatching in order to make the drawing easy to see. In addition, although FIGS. 25 and 30 are also the plan views, the bonding member BD1 supplied onto the die pad DP is denoted with hatching in order to make the drawing easy to see. Also in FIGS. 21 and 29, the position to be mounted with the semiconductor chip CP2 in step S2b (the predetermined position to be mounted with the semiconductor chip CP2) is indicated with a broken line. Also in FIGS. 25 and 30, the position to be mounted with the semiconductor chip CP1 in step S2d (the predetermined position to be mounted with the semiconductor chip CP1) is indicated with a broken line.

A different point between a process flow in FIG. 16 and a process flow in FIG. 17 is that the curing of the bonding member BD1 and the curing of the bonding member BD2 are performed by the same step (the same heat treatment step) in the process flow in FIG. 16, whereas the curing of the bonding member BD1 and the curing of the bonding member BD2 are performed by the different steps in the process flow in FIG. 17. That is, the curing of the bonding member BD1 and the curing of the bonding member BD2 are performed by the heat treatment in step S2e in the process flow in FIG. 16. Meanwhile, the curing of the bonding member BD1 is performed by the heat treatment in step S2e2, and the curing of the bonding member BD2 is performed by the heat treatment in step S2e1 in the process flow in FIG. 17.

A common point between the process flow in FIG. 16 and the process flow in FIG. 17 is that the semiconductor chip CP2 is first mounted over the upper surface of the die pad DP via the bonding member BD2 by performing steps S2a and S2b, and then, the semiconductor chip CP1 is mounted over the upper surface of the die pad DP via the bonding member BD1 by performing steps S2c and S2d.

Figure 18:
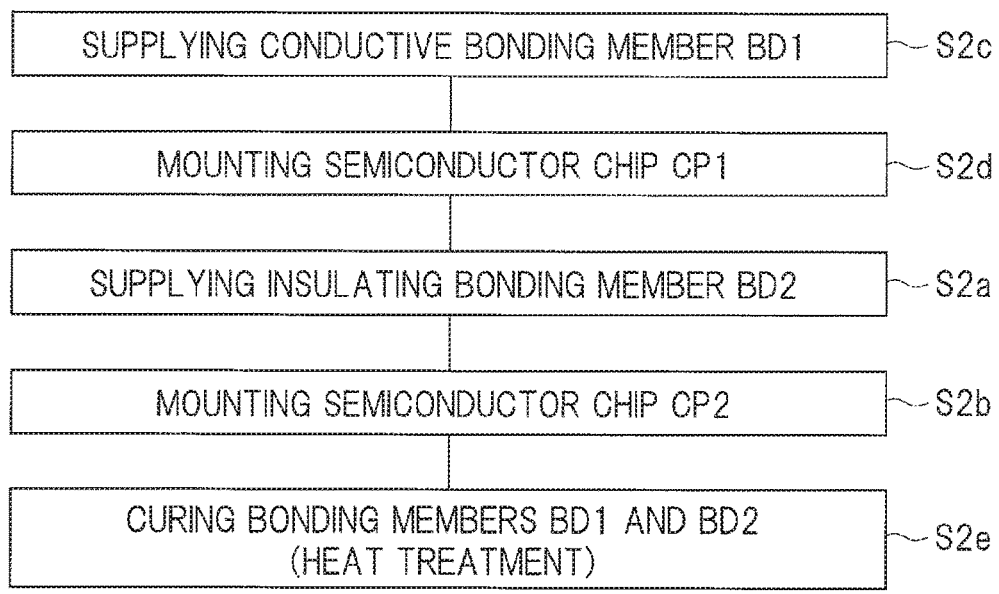
FIG. 18 is a process flow chart of still another detailed die bonding step.

FIG. 18 corresponds to a case where steps S2a and S2b and steps S2c and S2d in the process flow in FIG. 16 are interchanged in order, step S2c and step S2d are first performed, and then, step S2a and step S2b are performed. In addition, FIG. 19 corresponds to a case where steps S2a, S2b, and S2e1 and steps S2c, S2d, and S2e2 in the process flow in FIG. 17 are interchanged in order, step S2c, step S2d, and step S2e2 are first performed, and then, step S2a, step S2b, and S2e1 are performed.

Figure 19:
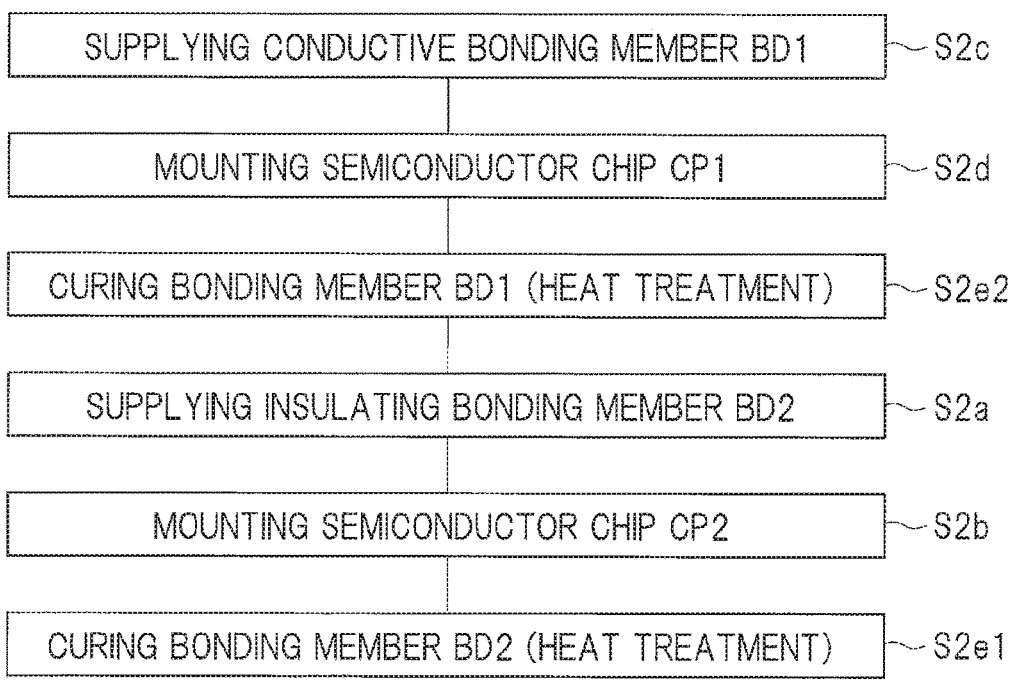
FIG. 19 is a process flow chart of yet another detailed die bonding step.

Any of the process flow in FIG. 16, the process flow in FIG. 17, a process flow in FIG. 18, and a process flow in FIG. 19 can be used as the die bonding step in step S2.

However, either the process flow in FIG. 16 or the process flow in FIG. 17 is preferably adopted as the die bonding step in step S2, instead of the process flow in FIG. 18 and the process flow in FIG. 19. That is, each step is preferably performed in the order illustrated in the process flow in FIG. 16 or the process in FIG. 17. Thus, preferably, step S2a and step S2b are first performed, and then, step S2c and step S2d are performed. The reason is given as follows:

That is, the semiconductor chip CP1 has the back surface electrode BE, and the back surface electrode BE is required to be electrically connected to the die pad DP. Meanwhile, the semiconductor chip CP2 has no back surface electrode and is required to be electrically insulated from the die pad DP without being electrically connected thereto. Accordingly, a die bonding material for the semiconductor chip CP1 (here, the bonding member BD1) has conductivity, and a die bonding material for the semiconductor chip CP2 (here, the bonding member BD2) has insulation property. However, when a part of the die bonding material (here, the bonding member BD1) having the conductivity adheres to the predetermined region to be mounted with the semiconductor chip CP2 on the die pad DP and the semiconductor chip CP2 is then mounted thereon, the insulation between the semiconductor chip CP2 and the die pad DP may be inhibited, and electrical connection (a short circuit) may be made between the semiconductor chip CP2 and the die pad DP. When the electrical connection (the short circuit) is made between the semiconductor chip CP2 and the die pad DP, a semiconductor device in which such a phenomenon has occurred is removed at an inspection step after the manufacturing. Thus, the manufacturing yield of the semiconductor device decreases, and the manufacturing costs of the semiconductor device increase. Accordingly, the die bonding material (here, the binding BD1) having the conductivity is required to be prevented from adhering to the predetermined region to be mounted with the semiconductor chip CP2 on the die pad DP as much as possible.

In contrast, in the process flow in FIG. 16 or the process flow in FIG. 17, step S2a and step S2b are first performed so as to mount the semiconductor chip CP2 on the upper surface of the die pad DP via the insulating bonding member BD2, and then, step S2c and step S2d are performed so as to mount the semiconductor chip CP1 on the upper surface of the die pad DP via the conductive bonding member BD1. Accordingly, the conductive die bonding material (here, the bonding member BD1) is supplied onto the upper surface of the die pad DP in step S2c in a state where the semiconductor chip CP2 has been already mounted over the upper surface of the die pad DP via the insulating bonding member BD2. Accordingly, the die bonding material (here, the bonding member BD1) having the conductivity is easily prevented from adhering to the predetermined region to be mounted with the semiconductor chip CP2 on the die pad DP. Therefore, the electrical connection (the short circuit) is easily prevented from being made between the semiconductor chip CP2 and the die pad DP via the conductive die bonding material. Accordingly, the manufacturing yield of the semiconductor device can be improved, and in addition, the manufacturing costs of the semiconductor device can be reduced. Therefore, in the die bonding step in step S2, each step is preferably performed in the order illustrated in the process flow in FIG. 16 or the process flow in FIG. 17, and in other words, it is preferred that step S2a and step S2b are first performed before step S2c and step S2d are performed.

In addition, the back surface electrode BE of the semiconductor chip CP1 is required to be electrically connected with the die pad DP via the conductive bonding member BD1, achieving a favorable bonding state between the semiconductor chip CP1 and the die pad DP via the conductive bonding member BD1 is important. However, when a solvent in the bonding member BD1 volatilizes before a curing step of the bonding member BD1 is performed after the bonding member BD1 has been supplied onto the die pad DP, the bonding of the bonding member BD1 may degrade. Accordingly, time required until the curing step of the bonding member BD1 is performed after the bonding member BD1 has been supplied onto the die pad DP is preferably shortened to some extent. Thus, the solvent in the bonding member BD1 can be inhibited or prevented from volatilizing before the curing step of the bonding member BD1 is performed. The process flow in FIG. 16 and the process flow in FIG. 17 are preferable also in terms of this.

That is, the process flow in FIG. 16 and the process flow in FIG. 17 can shorten time from a mounting step of the semiconductor chip CP1 (step S2d) to the curing step of the bonding member BD1 (steps S2e and S2e2) in comparison to the process flow in FIG. 18 and the process flow in FIG. 19. The process flow in FIG. 16 and the process flow in FIG. 17 can inhibit or prevent the solvent in the bonding member BD1 from volatilizing before the curing step of the bonding member BD1 (steps S2e and S2e2) after the bonding member BD1 has been supplied onto the die pad DP in step S2c, so that degradation of the bonding of the bonding member BD1 due to the volatilization of the solvent in the bonding member BD1 can be inhibited or prevented. Accordingly, bonding of the bonding member BD1 can be improved, and a favorable bonding state between the semiconductor chip CP1 and the die pad DP via the conductive bonding member BD1 can be achieved.

In this manner, the process flow in FIG. 16 and the process flow in FIG. 17 are preferable in comparison to the process flow in FIG. 18 and the process flow in FIG. 19.

In addition, the process flow in FIG. 16 has the following advantages when the process flow in FIG. 16 and the process flow in FIG. 17 are compared with each other.

That is, a curing step of the bonding member BD2 (step S2e1) and the curing step of the bonding member BD1 (step S2e2) are individually performed in the process flow in FIG. 17, whereas the curing step of the bonding member BD2 and the curing step of the bonding member BD1 are performed in the same step in the process flow in FIG. 16 (step S2e). Accordingly, the process flow in FIG. 16 can reduce the manufacturing step number of the semiconductor device PKG in comparison to the process flow in FIG. 17. Therefore, the manufacturing costs of the semiconductor device PKG can be inhibited. In addition, the throughput of the semiconductor device PKG can be improved.

In addition, the process flow in FIG. 17 has the following advantages when the process follow in FIG. 16 and the process flow in FIG. 17 are compared with each other.

That is, since both of the bonding member BD1 and the bonding member BD2 are cured in step S2e in the process flow in FIG. 16, a heat treatment temperature for curing the bonding member BD1 and a heat treatment temperature for curing the bonding member BD2 become identical. In contrast, since the curing step of the bonding member BD2 (step S2e1) and the curing step of the bonding member BD1 (step S2e2) are individually performed in the process flow in FIG. 17, it is possible to make the heat treatment temperature for curing the bonding member BD1 (a heat treatment temperature in step S2e2) different from the heat treatment temperature for curing the bonding member BD2 (a heat treatment temperature in step S2e1). Accordingly, in the process flow in FIG. 17, the bonding member BD2 can be cured at an optimum heat treatment temperature for curing the bonding member BD2 in step S2e1, and in addition, the bonding member BD1 can be cured at an optimum heat treatment temperature for curing the bonding member BD1 in step S2e2.

<Circuit Configuration of Semiconductor Device>

Figure 31:
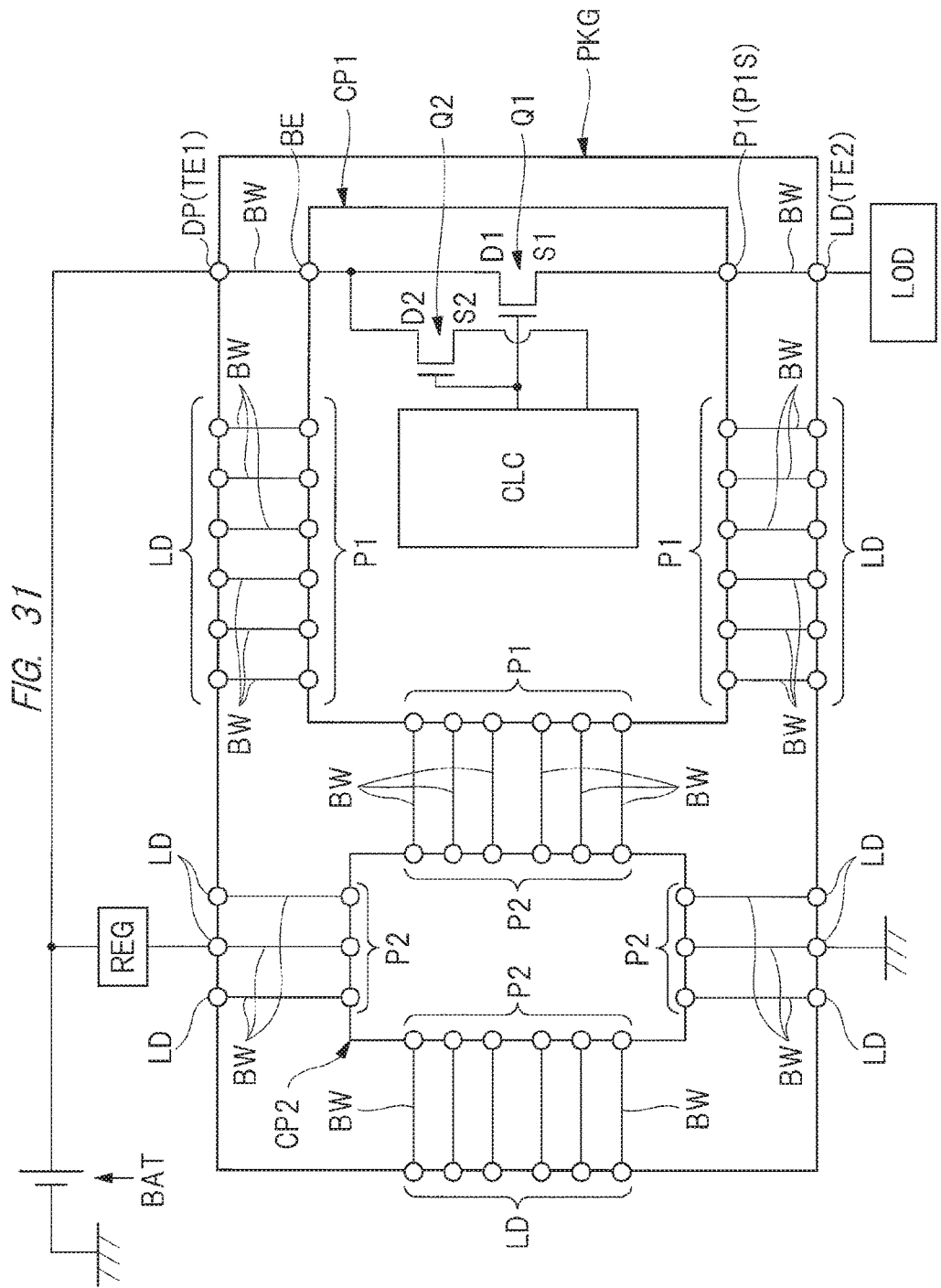
FIG. 31 is a circuit diagram of the semiconductor device according to the embodiment.

Next, a circuit configuration of the semiconductor device PKG will be described with reference to FIG. 31. FIG. 31 is a circuit diagram (circuit block diagram) of the semiconductor device PKG.

As described above, the semiconductor device PKG according to the present embodiment has the semiconductor chips CP1 and CP2 formed therein. The power metal oxide semiconductor field effect transistor (MOSFET) Q1 serving as the power transistor, a sense MOSFET Q2 for detecting a current flowing through the power MOSFET Q1, and the control circuit CLC are formed in the semiconductor chip CP1. The power MOSFET Q1 can function as a switch power transistor.

Note that, in the present application, a MOSFET includes not only a metal insulator semiconductor field effect transistor (MISFET) having an oxide film (an silicon oxide film) used for a gate insulating film, but also a MISFET having an insulating film, except the oxide film (the silicon oxide film), used for a gate insulating film.

The control circuit CLC includes a driver circuit (a driving circuit) that drives the power MOSFET Q1 and the sense MOSFET Q2. Accordingly, the control circuit CLC controls the potential of a gate of the power MOSFET Q1 (corresponding to a gate electrode 8 to be described later) in response to a signal supplied from the outside of the semiconductor chip CP1 to the control circuit CLC, so as to be able to control the operation of the power MOSFET Q1. That is, the gate of the power MOSFET Q1 is connected to the control circuit CLC, and supplying an ON signal (a gate voltage for turning the power MOSFET Q1 into an ON state) from the control circuit CLC to the gate of the power MOSFET Q1 can turn the power MOSFET Q1 into the ON state.

When supplying the ON signal from the control circuit CLC to the gate of the power MOSFET Q1 turns the power MOSFET Q1 into the ON state, a voltage of a power supply BAT is output from the power MOSFET Q1 so as to be supplied to a load LOD. When supplying an OFF signal from the control circuit CLC to the gate of the power MOSFET Q1 (or suspending the supply of the ON signal) turns the power MOSFET Q1 into an OFF state, the supply of the voltage from the power supply BAT to the load LOD is suspended. The control circuit CLC of the semiconductor chip CP1 performs the above ON/OFF control of the power MOSFET Q1 of the semiconductor chip CP1.

In this manner, the semiconductor device PKG can function as a switch semiconductor device turning voltage application from the power supply BAT to the load LOD on/off. In addition, the power MOSFET Q1 of the semiconductor chip CP1 can function as a switching element. In addition, since an output of the power MOSFET Q1 is supplied to the load LOD, the power MOSFET Q1 can be regarded as an output circuit. In addition, an arbitrary electronic device or an electronic component that is desired to be connected with the power supply BAT through the switch semiconductor device PKG can be applied as the load LOD. For example, a motor, a lamp, a heater, or the like can be used as the load LOD.

In addition, the sense MOSFET Q2 for detecting a current is provided in the semiconductor chip CP1 of the semiconductor device PKG. A current flowing through the power MOSFET Q1 is detected by the sense MOSFET Q2, and the power MOSFET Q1 is controlled in response to a current flowing through the sense MOSFET Q2. For example, when it is determined (detected) that an excessive current (a current having a prescribed value or more) flows through the power MOSFET Q1, based on the current flowing through the sense MOSFET Q2, the control circuit CLC controls the gate voltage of the power MOSFET Q1 so as to limit the current of the power MOSFET Q1 to the predetermined value or less or so as to turn the power MOSFET Q1 off, forcibly. Accordingly, the excessive current can be prevented from flowing through the power MOSFET Q1, so that the semiconductor device PKG and an electronic device using the semiconductor device PKG can be protected.

The sense MOSFET Q2 has a drain and a gate which are common to those of the power MOSFET Q1. That is, the drain of the power MOSFET Q1 and the drain of the sense MOSFET Q2 formed in the semiconductor chip CP1 each are electrically connected with the back surface electrode BE of the semiconductor chip CP1 so as to be electrically connected with each other. Accordingly, the back surface electrode BE of the semiconductor chip CP1 is a drain back surface electrode for the power MOSFET Q1 and the sense MOSFET Q2.

The back surface electrode BE of the semiconductor chip CP1 having the drains of the power MOSFET Q1 and the sense MOSFET Q2 connected thereto is connected to a terminal TE1 of the semiconductor device PKG. The die pad DP corresponds to the terminal TE1. It is configured that the same potential is supplied from the terminal TE1 of the semiconductor device PKG (that is, the die pad DP) to the drain of the sense MOSFET Q2 and the drain of the power MOSFET Q1 via the bonding member BD1 and the back surface electrode BE of the semiconductor chip CP1. Since the terminal TE1 (the die pad DP) is connected to the power supply (a battery) BAT arranged outside the semiconductor device PKG, the voltage of the power supply BAT is supplied from the terminal TE1 of the semiconductor device PKG (that is, the die pad DP) to the drain of the power MOSFET Q1 and the drain of the sense MOSFET Q2 via the bonding member BD1 and the back surface electrode BE of the semiconductor chip CP1.

In addition, the gates of the sense MOSFET Q2 and the power MOSFET Q1 are electrically connected to each other so as to be common, and it is configured that the common gates are connected to the control circuit CLC and the same gate signal (a gate voltage) is input from the control circuit CLC to the gate of the sense MOSFET Q2 and the gate of the power MOSFET Q1. Specifically, the gate of the sense MOSFET Q2 (a gate electrode) and the gate of the power MOSFET Q1 (the gate electrode) formed in the semiconductor chip CP1 are electrically connected to the control circuit CLC in the semiconductor chip CP1 via an internal wire of the semiconductor chip CP1.

Meanwhile, a source of the sense MOSFET Q2 is not common to a source of the power MOSFET Q1, and a short circuit is not made between the source of the power MOSFET Q1 and the source of the sense MOSFET Q2.

The source of the power MOSFET Q1 is connected to a terminal TE2 of the semiconductor device PKG, and the terminal TE2 is connected to the load LOD arranged outside the semiconductor device PKG. That is, the source of the power MOSFET Q1 is connected to the load LOD. Of the plurality of leads LD included in the semiconductor device PKG, the leads LD electrically connected with the source pad electrodes P1S of the semiconductor chip CP1 via the wires BW correspond to the terminal TE2. Specifically, the source of the power MOSFET Q1 formed in the semiconductor chip CP1 is electrically connected with each of the source pad electrodes P1S of the semiconductor chip CP1 via the internal wire of the semiconductor chip CP1, the source pad electrodes P1S each are electrically connected with the terminal TE2 (the leads LD) via the wires BW, and the load LOD is connected to the terminal TE2 (the leads LD). Accordingly, when supplying the ON signal from the control circuit CLC to the gate of the power MOSFET Q1 turns the power MOSFET Q1 into the ON state (a conducting state), the voltage of the power supply BAT is supplied to the load LOD via the power MOSFET Q1 in the ON state.

Meanwhile, the source of the sense MOSFET Q2 is connected to the control circuit CLC. Specifically, the source of the sense MOSFET Q2 formed in the semiconductor chip CP1 is electrically connected to the control circuit CLC in the semiconductor chip CP1 via the internal wire of the semiconductor chip CP1.

Note that, in FIG. 31, a reference character D1 represents the drain of the power MOSFET Q1, a reference character S1 represents the source of the power MOSFET Q1, a reference character D2 represents the drain of the sense MOSFET Q2, and a reference character S2 represents the source of the sense MOSFET Q2.

The sense MOSFET Q2 is formed in the semiconductor chip CP1 together with the power MOSFET Q1. The sense MOSFET Q2 is formed so as to serve as a current mirror circuit, together with the power MOSFET Q1 in the semiconductor chip CP1, and has a size of 1/20000 of the power MOSFET Q1, for example. This size ratio can be varied as necessary.

In addition, the control circuit CLC formed in the semiconductor chip CP1 is electrically connected with some pad electrodes P1 of the plurality of pad electrodes P1 of the semiconductor chip CP1 via the internal wire of the semiconductor chip CP1. The plurality of pad electrodes P1 of the semiconductor chip CP1 include an input pad electrode, an output pad electrode, and a ground pad electrode. A signal (an input signal) and a ground potential are input or supplied from some of the pad electrodes P1 to the control circuit CLC, and in addition, a signal (an output signal) output from the control circuit CLC is output from the others of the pad electrodes P1.

The pad electrodes P1 of the semiconductor chip CP1 are electrically connected with the leads LD or the pad electrodes P2 of the semiconductor chip CP2 via the wires BW, respectively. That is, the pad electrodes P1 of the semiconductor chip CP1 include the pad electrodes P1 electrically connected with the leads LD via the wires BW, and the pad electrodes P1 electrically connected with the pad electrodes P2 of the semiconductor chip CP2 via the wires BW.

The semiconductor chip CP2 is the microcomputer chip (a control chip) and can function as the control semiconductor chip controlling the operation of the semiconductor chip CP1.

A circuit in the semiconductor chip CP2 is not illustrated in FIG. 31, but in practice, the semiconductor chip CP2 has a circuit controlling the semiconductor chip CP1 (the circuit in the semiconductor chip CP1) formed therein. That is, the circuit controlling the control circuit CLC formed in the semiconductor chip CP1 is formed in the semiconductor chip CP2.

An internal circuit of the semiconductor chip CP2 is electrically connected with the plurality of pad electrodes P2 of the semiconductor chip CP2 via an internal wire of the semiconductor chip CP2. The pad electrodes P2 of the semiconductor chip CP2 are electrically connected with the leads LD or the pad electrodes P1 of the semiconductor chip CP1 via the wires BW, respectively. That is, the pad electrodes P2 of the semiconductor chip CP2 include the pad electrodes P2 electrically connected with the leads LD via the wires BW, and the pad electrodes P2 electrically connected with the pad electrodes P1 of the semiconductor chip CP1 via the wires BW.

The plurality of leads LD connected with the semiconductor chip CP2 via the wires BW include an input lead, an output lead, and a ground lead. A signal (an input signal) and a ground potential are input or supplied from some of the leads LD to the internal circuit of the semiconductor chip CP2, and a signal (an output signal) output from the internal circuit of the semiconductor chip CP2 is output from the others of the leads LD.

Some of the plurality of leads LD connected with the semiconductor chip CP2 via the wires BW are connected with the power supply BAT arranged outside the semiconductor device PKG via a regulator REG. The voltage of the power supply BAT is converted into a voltage suitable to a power voltage of the semiconductor chip CP2, by the regulator REG, the converted voltage is supplied to the leads LD connected to the regulator REG, and then, the voltage supplied to the leads LD is supplied to the semiconductor chip CP2 via the wires BW connected with the leads LD.

Some pad electrodes P2 of the plurality of pad electrodes P2 of the semiconductor chip CP2 are electrically connected with some pad electrodes P1 of the plurality of pad electrodes P1 of the semiconductor chip CP1 via the wires BW, respectively. The internal circuit of the semiconductor chip CP2 can be electrically connected with an internal circuit of the semiconductor chip CP1 (e.g., the control circuit CLC) via the pad electrodes P2 of the semiconductor chip CP2, the wires BW (the wires BW connecting between the pad electrodes P1 and P2), and the pad electrodes P1 of the semiconductor chip CP1.

The leads LD electrically connected with the semiconductor chip CP2 and the leads LD electrically connected with the semiconductor chip CP1 can also be electrically connected with each other outside the semiconductor device PKG. For example, the semiconductor device PKG is mounted on a wiring board (a mounting board), and the leads LD electrically connected with the semiconductor chip CP2 and the leads LD electrically connected with the semiconductor chip CP1 can be electrically connected with each other via, for example, a wire of the wiring board on the wiring board. Accordingly, the internal circuit of the semiconductor chip CP2 can also be electrically connected with the internal circuit of the semiconductor chip CP1 (e.g., the control circuit CLC) via, for example, a wire outside the semiconductor device PKG (e.g., the wire of the wiring board having the semiconductor device PKG mounted thereon).

Here, the internal circuit of the semiconductor chip CP1 corresponds to a circuit formed in the semiconductor chip CP1, and the internal circuit of the semiconductor chip CP2 corresponds to a circuit formed in the semiconductor chip CP2. The internal wire of the semiconductor chip CP1 corresponds to a wire formed in the semiconductor chip CP1, and the internal wire of the semiconductor chip CP2 corresponds to a wire formed in the semiconductor chip CP2.

<Structure of Semiconductor Chip>

Next, a structure of the semiconductor chip CP1 will be described.

Figure 32:
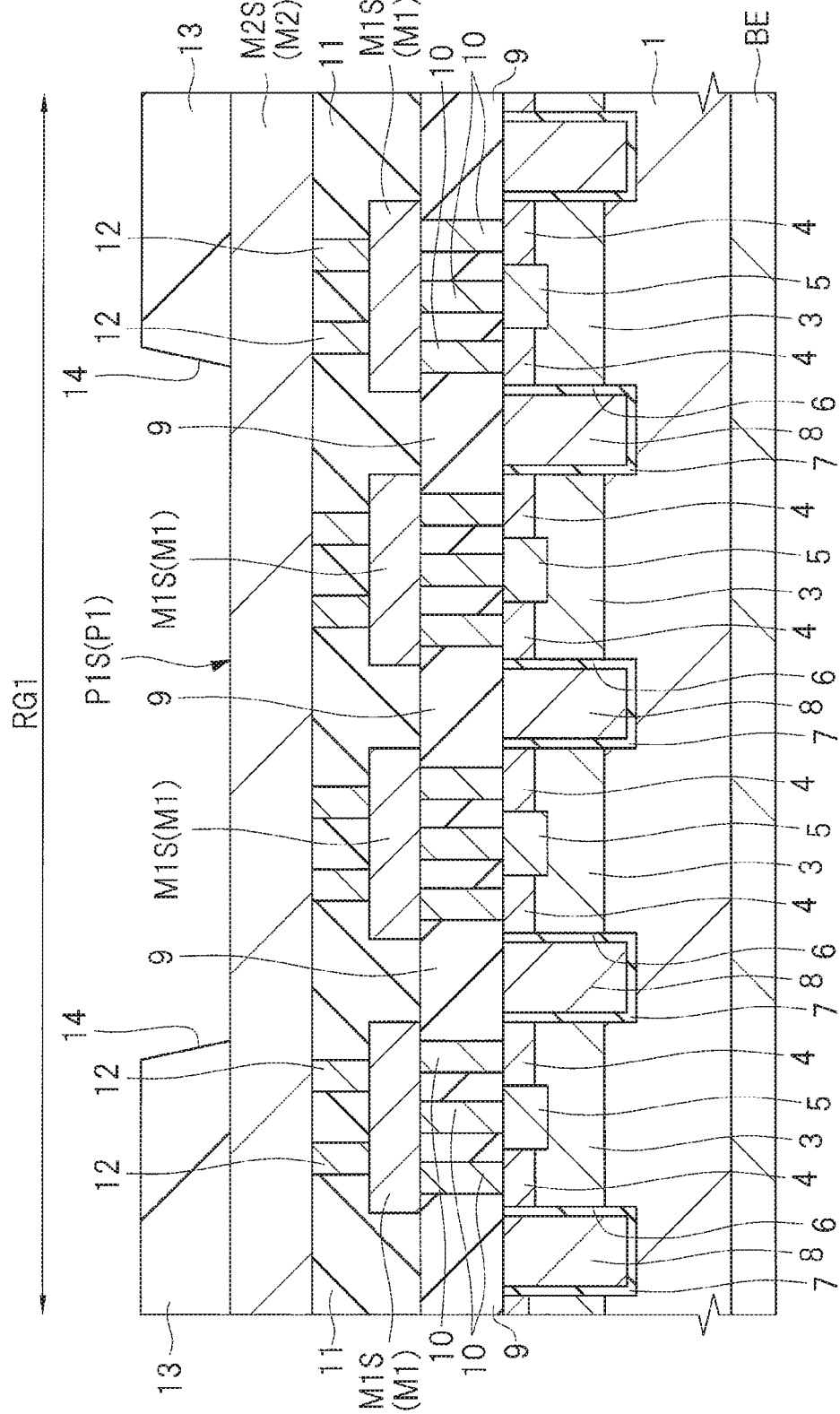
FIG. 32 is a cross-sectional view of a main portion of a semiconductor chip used in the semiconductor device according to the embodiment.

FIG. 32 is a cross-sectional view of a main portion of the semiconductor chip CP1 and illustrates a cross-sectional view of a main portion in a region in which a transistor included in the power MOSFET Q1 is formed (a power MOSFET forming region) on the semiconductor chip CP1.

Here, in the semiconductor chip CP1, the region (a plane region) in which the transistor included in the power MOSFET Q1 is formed is referred to as the power MOSFET forming region. In addition, in the semiconductor chip CP1, a region (a plane region) in which a transistor included in the sense MOSFET Q2 is formed is referred to as a sense MOSFET forming region. In addition, in the semiconductor chip CP1, a region (a plane region) in which the control circuit CLC is formed is referred to as a control circuit forming region. The semiconductor chips CP1 and CP2 are adjacently arranged over the die pad DP such that the control circuit forming region of the semiconductor chip CP1 is closer to the semiconductor chip CP2 than the power MOSFET forming region of the semiconductor chip CP1.

In the semiconductor chip CP1, a structure of the region (the power MOSFET forming region) in which the transistor included in the power MOSFET Q1 is formed will be described with reference to FIG. 32. Note that FIG. 32 illustrates a cross-sectional structure of the power MOSFET forming region. A cross-sectional structure of the sense MOSFET forming region also basically has the same structure as the structure in FIG. 32, but a source wire M2S to be described later is covered with a protective film 13 so as not to be exposed in the sense MOSFET forming region.

The power MOSFET Q1 is formed on a main surface of a semiconductor substrate 1 included in the semiconductor chip CP1.

As illustrated in FIG. 32, the semiconductor substrate 1 included in the semiconductor chip CP1 is composed of n-type single crystal silicon doped with an n-type impurity such as arsenic (As). A semiconductor substrate (that is, an epitaxial wafer) having an epitaxial layer (a semiconductor layer) formed on a substrate body composed of an n-type single crystal silicon substrate can also be used as the semiconductor substrate 1, where the epitaxial layer is composed of an $n^-$-type single crystal silicon whose impurity concentration is lower than that of the n-type single crystal silicon substrate.

A field insulating film composed of, for example, silicon oxide (not illustrated) is formed on the main surface of the semiconductor substrate 1.

A plurality of unit transistor cells included in the power MOSFET Q1 are formed in an active region surrounded by the field insulating film in the power MOSFET forming region. The plurality of unit transistor cells provided in the power MOSFET forming region are connected in parallel so as to form the power MOSFET Q1. In addition, a plurality of unit transistor cells included in the sense MOSFET Q2 are formed in an active region surrounded by the field insulating film in the sense MOSFET forming region. The plurality of unit transistor cells provided in the sense MOSFET forming region are connected in parallel so as to form the sense MOSFET Q2.

Each of the unit transistor cells formed in the power MOSFET forming region is basically the same as each of the unit transistor cells formed in the sense MOSFET forming region in structure (configuration), but the power MOSFET forming region differs from the sense MOSFET forming region in area. The area of the sense MOSFET forming region is smaller than the area of the power MOSFET forming region. Accordingly, the connecting number of the unit transistor cells varies between the power MOSFET Q1 and the sense MOSFET Q2. The number of the unit transistor cells connected in parallel and included in the sense MOSFET Q2 is smaller than the number of the unit transistor cells connected in parallel and included in the power MOSFET Q1. Accordingly, when the sense MOSFET Q2 and the power MOSFET Q1 have the same source potential, the current smaller than the current flowing through the power MOSFET Q1 flows through the sense MOSFET Q2. Each of the unit transistor cells in the power MOSFET forming region and the sense MOSFET forming region includes, for example, an n-channel MOSFET having a trench gate structure.

The semiconductor substrate 1 has a function as a drain region of each of the unit transistor cells. The drain back surface electrode (a back surface drain electrode or a drain electrode) BE is formed on the entire back surface of the semiconductor substrate 1 (the semiconductor chip CP1). The back surface electrode BE is formed by layering, for example, a titanium (Ti) layer, a nickel (Ni) layer, and a gold (Au) layer in this order from the back surface of the semiconductor substrate 1. The back surface electrode BE of the semiconductor chip CP1 is bonded to and is electrically connected with the die pad DP via the bonding member BD1 in the semiconductor device PKG.

In addition, a p-type semiconductor region 3 formed in the semiconductor substrate 1 has a function as a channel forming region of each of the unit transistor cells, in the power MOSFET forming region and the sense MOSFET forming region. Furthermore, an $n^+$-type semiconductor region 4 formed on an upper portion of the p-type semiconductor region 3 has a function as a source region of each of the unit transistor cells. Therefore, the semiconductor region 4 is a source semiconductor region. In addition, a $p^+$-type semiconductor region 5 is formed between the adjacent $n^+$-type semiconductor regions 4 on the upper portion of the p-type semiconductor region 3. The impurity concentration of the $p^+$-type semiconductor region 5 is higher than that of the p-type semiconductor region 3.

In addition, a trench 6 extending from the main surface of the semiconductor substrate 1 in a thickness direction of the semiconductor substrate 1 is formed in the semiconductor substrate 1 in the power MOSFET forming region and the sense MOSFET forming region. The trench 6 is formed so as to penetrate from an upper surface of the $n^+$-type semiconductor region 4 through the $n^+$-type semiconductor region 4 and the p-type semiconductor region 3 and terminate in the semiconductor substrate 1 below the p-type semiconductor region 3. A gate insulating film 7 composed of, for example, silicon oxide is formed on a bottom surface and side surfaces of the trench 6. The gate electrode 8 composed of, for example, doped polysilicon is embedded in the trench 6 via the gate insulating film 7. The gate electrode 8 has a function as a gate electrode of each of the unit transistor cells.

An interlayer insulating film 9 is formed so as to cover the gate electrode 8 over the main surface of the semiconductor substrate 1. Contact holes (through-holes) are formed in the interlayer insulating film 9, and a conductive plug (a via portion) 10 is embedded in each of the contact holes formed in the interlayer insulating film 9.

A wire M1 is formed on the interlayer insulating film 9 having the plug 10 embedded therein. The wire M1 is a wire of a first wiring layer.

An interlayer insulating film 11 is formed so as to cover the wire M1 over the interlayer insulating film 9. Through-holes (through-holes) are formed in the interlayer insulating film 11, and a conductive plug (a via portion) 12 is embedded in each of the through-holes formed in the interlayer insulating film 11.

A wire M2 and the pad electrodes (the bonding pads) P1 are formed on the interlayer insulating film 11 having the plug 12 embedded therein. The wire M2 is a wire of a second wiring layer.

The wire M1 is composed of a conductive film, specifically a metal film, and preferably, an aluminum film or an aluminum alloy film. Similarly, the wire M2 and the pad electrodes P1 are composed of a conductive film, specifically a metal film, and preferably, an aluminum film or an aluminum alloy film.

The wire M1 includes a gate wire (not illustrated) and a source wire M1S. The wire M2 includes a gate wire (not illustrated) and the source wire M2S.

The source $n^+$-type semiconductor region 4 is electrically connected with the source wire M1S via the plug 10 arranged on the semiconductor region 4, and the $p^+$-type semiconductor region 5 is electrically connected with the source wire M1S via the plug 10 arranged on the semiconductor region 5. That is, the semiconductor region 4 and the semiconductor region 5 adjacent to each other are electrically connected with the common source wire M1S via the corresponding plug 10, respectively. The source wire M1S is electrically connected with the source wire M2S via the plug 12 arranged between the source wire M1S and the source wire M2S.

The $p^+$-type semiconductor region 5 has the same conductive type as that of the p-type semiconductor region 3 and is in contact with the p-type semiconductor region 3, so that the $p^+$-type semiconductor region 5 is electrically connected to the p-type semiconductor region 3. Accordingly, the source wire M2S is electrically connected with the source n+-type semiconductor region 4 and is additionally, electrically connected with the channel forming p-type semiconductor region 3, via the plug 12, the source wire M1S, and the plug 10.

The source wire M2S electrically connected with the source of the power MOSFET Q1 (the semiconductor region 4 in the power MOSFET forming region) is formed over substantially the entire power MOSFET forming region. A portion of the source wire M2S is exposed from an opening 14 of the protective film 13, and an exposed portion of the source wire M2S forms the corresponding source pad electrode P1S.

In addition, the source wire M2S electrically connected with the source of the sense MOSFET Q2 (the semiconductor region 4 in the sense MOSFET forming region) is formed over substantially the entire sense MOSFET forming region and is covered with the protective film 13 so as not to be exposed. The source wires M1S and M2S electrically connected with the source of the sense MOSFET Q2 are electrically connected with the control circuit CLC formed in the semiconductor chip CP1. The source wires M1S and M2S electrically connected with the source of the power MOSFET Q1 and the source wires M1S and M2S electrically connected with the source of the sense MOSFET Q2 are not electrically connected and are separated from each other.

In addition, a plurality of the gate electrodes 8 formed in the power MOSFET forming region and the sense MOSFET forming region are electrically connected with each other and are additionally electrically connected with the control circuit CLC formed in the semiconductor chip CP1, via the plug 10, the gate wire of the wire M1 (not illustrated), the plug 12, and the gate wire of the wire M2 (not illustrated).

The insulating protective film (an insulating film) 13 is formed so as to cover the wire M2 and the pad electrodes over the interlayer insulating film 11. The protective film 13 is composed of a resin film such as polyimide resin, for example. The protective film 13 is an uppermost film of the semiconductor chip CP1. The protective film 13 has a plurality of the openings 14 formed therein, and a portion of a conductor pattern included in each of the pad electrodes P1 or a portion of the source wire M2S is exposed from each of the plurality of the openings 14. Note that the source pad electrodes P1S are formed of the source wire M2S exposed from the openings 14 in the protective film 13, and the pad electrodes P1 except the source pad electrodes P1S are formed of a conductor pattern formed in the same layer as that of the wire M2 (an electrode conductor pattern for the pad electrodes P1). The conductor pattern included in the pad electrodes P1 except the source pad electrodes P1S (not illustrated in FIG. 32) is formed in the same step in the same layer as that of the wire M2, and has, for example, a rectangular planar shape. A metal layer (not illustrated) may be formed on each surface of the pad electrodes P1 exposed from the openings 14 (also including the source pad electrodes P1S) by, for example, plating.

In addition, in FIG. 9, the plurality of source pad electrodes P1S being the source pad electrodes of the power MOSFET Q1 are mutually separated by the uppermost protective film 13 but are electrically connected with each other through the source wire M2S and the source wire M1S.

Each operating current of the unit transistor cells of the power MOSFET Q1 and the sense MOSFET Q2 flows along side surfaces of the corresponding gate electrode 8 (that is, the side surfaces of the corresponding trench 6) between the drain n-type semiconductor substrate 1 and the source n+-type semiconductor region 4 in the thickness direction of the semiconductor substrate 1 in the semiconductor chip CP1 having the above configuration. That is, a channel is formed in a thickness direction of the semiconductor chip CP1.

In this manner, the semiconductor chip CP1 is a semiconductor chip having a vertical MOSFET with a trench type gate structure formed therein, and the power MOSFET Q1 and the sense MOSFET Q2 each are formed of a trench gate type MISFET. Here, the vertical MOSFET corresponds to a MOSFET in which a current between a source and a drain flows in a thickness direction of a semiconductor substrate (in a direction substantially vertical to a main surface of the semiconductor substrate).

In addition, a plurality of transistors, the wire M1, and the wire M2 included in the control circuit CLC are formed in a control circuit forming region RG4 in the semiconductor chip CP1, but the illustrations and descriptions thereof will be omitted.

In addition, the semiconductor chip CP1 can also have a plurality of the power MOSFETs Q1 formed therein.

<Study Example>

Figure 33:
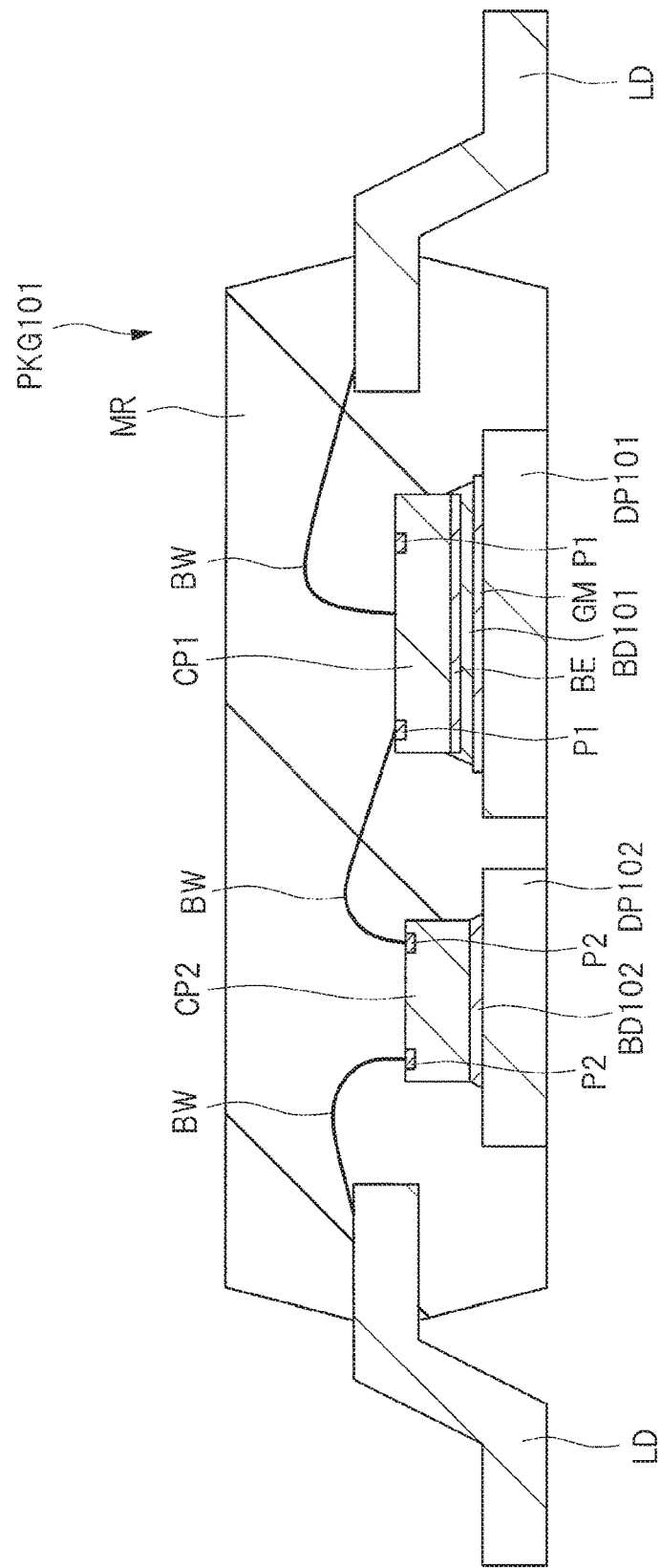
FIG. 33 is a cross-sectional view of a semiconductor device according to a study example.

FIG. 33 is a cross-sectional view of a semiconductor device (a semiconductor package) PKG101 according to a study example studied by the present inventors and illustrates the cross-sectional view corresponding to FIG. 6.

The semiconductor device PKG101 according to the study example illustrated in FIG. 33 is mainly different from the semiconductor device PKG according to the present embodiment in the following points.

That is, the semiconductor device PKG101 according to the study example illustrated in FIG. 33 has two die pads DP101 and DP102. A semiconductor chip CP1 is mounted over the one die pad DP101 via a bonding member BD101, and a semiconductor chip CP2 is mounted over the other die pad DP102 via a bonding member BD102. The die pad DP101 and the die pad DP102 are not integrally formed and are electrically separated. That is, the die pads DP101 and DP102 are sealed by a sealing portion MR, but the die pad DP101 and the die pad DP102 are electrically separated by interposing a portion of the sealing portion MR therebetween. In addition, each of the lower surfaces of the die pads DP101 and DP102 is exposed from a back surface of the sealing portion MR.

A back surface electrode BE is formed on a back surface of the semiconductor chip CP1, and the bonding member BD101 has conductivity. Accordingly, the back surface electrode BE of the semiconductor chip CP1 is electrically connected with the die pad DP101 via the conductive bonding member BD101.

Meanwhile, no back surface electrode is formed on a back surface of the semiconductor chip CP2, and in addition, the die pad DP102 on which the semiconductor chip CP2 is mounted and the die pad DP101 on which the semiconductor chip CP1 is mounted are electrically separated. Accordingly, the bonding member BD102 may have conductivity or insulation property.

Since the die pad DP102 and the die pad DP101 are electrically separated, a voltage to be supplied from the die pad DP101 to the back surface electrode BE of the semiconductor chip CP1 via the conductive bonding member BD101 is not supplied to the die pad DP102. Accordingly, even when the bonding member BD102 has conductivity and the back surface of the semiconductor chip CP2 is electrically connected with the die pad DP102, the voltage to be supplied to the back surface electrode BE of the semiconductor chip CP1 is not supplied to the back surface of the semiconductor chip CP2. Thus, no malfunction occurs in the operation of the semiconductor chip CP2.

However, the following problem occurs in the semiconductor device PKG101 according to the study example.

That is, both of the die pad DP101 on which the semiconductor chip CP1 is mounted and the die pad DP102 on which the semiconductor chip CP2 is mounted are required, and the sealing portion MR is required to make the die pad DP101 and the die pad DP102 apart from each other, so that the plane size of the semiconductor device PKG101 increases. Accordingly, the semiconductor device PKG101 is disadvantageous to miniaturization.

In addition, suspension leads for the die pad DP101 and suspension leads for the die pad DP102 are present in the sealing portion MR, and as a result, the number of the suspension leads becomes large. Accordingly, the number of the leads LD decreases. Thus, the semiconductor device PKG101 is disadvantageous to increasing the number of pins (the number of leads LD). In addition, increasing the number of the suspension leads causes an increase of the plane size of the semiconductor device PKG101.

In addition, stress may occur in the portion of the sealing portion MR interposed between the die pad DP101 and the die pad DP102, causing a crack. This results in a decrease of the reliability of the semiconductor device PKG101.

In addition, the die pads DP101 and DP102 are required to be designed to correspond to the sizes of the semiconductor chips CP1 and CP2, respectively. Thus, general versatility of a lead frame used to manufacture the semiconductor device PKG101 decreases, and as a result, manufacturing costs of the semiconductor device PKG101 increases.

<Commonalization of Die Pad and Die Bonding Material>

The semiconductor device PKG according to the present embodiment has the semiconductor chip CP1 and the semiconductor chip CP2 mounted over the common die pad DP.

Accordingly, in comparison to the semiconductor device PKG101 according to the study example illustrated in FIG. 33, the plane size of the semiconductor device PKG according to the present embodiment can be reduced, so that the miniaturization of the semiconductor device PKG can be achieved. In addition, in comparison to the semiconductor device PKG101 according to the study example illustrated in FIG. 33, the number of suspension leads in the semiconductor device PKG according to the present embodiment can be reduced. Accordingly, it is possible to increase the number of pins (the number of the leads LD) of the semiconductor device PKG. In addition, the semiconductor device PKG according to the present embodiment does not have a risk of generating the crack in the portion of the sealing portion MR interposed between the die pad DP101 and the die pad DP102, which possibly occurs in the semiconductor device PKG101 according to the study example illustrated in FIG. 33. Therefore, the reliability of the semiconductor device PKG can be improved. In addition, the semiconductor device PKG according to the present embodiment does not have to design the die pads DP101 and DP102 to correspond to the sizes of the semiconductor chips CP1 and CP2, respectively, so that the versatility of the lead frame used to manufacture the semiconductor device PKG becomes high, and the manufacturing costs of the semiconductor device PKG can be reduced. In addition, without increasing the size of the semiconductor device PKG, the size of the die pad DP can be made larger than the size of the die pad DP101. Accordingly, the heat generated from the semiconductor chip CP1 is easily released from the die pad DP to the outside of the semiconductor device PKG, so that heat dissipation property of the semiconductor device PKG can be improved.

As described above, in the semiconductor device PKG according to the present embodiment, the semiconductor chip CP1 and the semiconductor chip CP2 are adjacently arranged over the die pad having conductivity. Of the semiconductor chips CP1 and CP2, the semiconductor chip CP1 is mounted over the die pad DP via the bonding member BD1 having the conductivity, and the semiconductor chip CP2 is mounted over the die pad DP via the bonding member BD2 having insulation property.

The semiconductor chip CP1 has the back surface electrode BE, and thus, the back surface electrode BE of the semiconductor chip CP1 is required to be electrically connected with the die pad DP via the bonding member BD1. Accordingly, the bonding member BD1 being the die bonding material for the semiconductor chip CP1 is required to have the conductivity. A desired voltage (e.g., the voltage of the power supply BAT described above) can be supplied to the back surface electrode BE of the semiconductor chip CP1 via the die pad DP and the bonding member BD1.

Meanwhile, the semiconductor chip CP2 has no back surface electrode. Then, in order to operate the semiconductor chip CP2 appropriately, the voltage to be supplied to the back surface electrode BE of the semiconductor chip CP1 via the die pad DP and the bonding member BD1 is preferably prevented from being supplied to the semiconductor chip CP2. Accordingly, the semiconductor chip CP2 and the die pad DP are preferably, electrically insulated from each other. Therefore, the bonding member BD2 being the die bonding material for the semiconductor chip CP2 is required to have no conductivity but insulation property.

Accordingly, the semiconductor chips CP1 and CP2 are mounted over the die pad DP, the conductive bonding member BD1 is used as the die bonding material for the semiconductor chip CP1, and the insulating bonding member BD2 is used as the die bonding material for the semiconductor chip CP2. Accordingly, the desired voltage (e.g., the voltage of the power supply BAT described above) can be supplied to the back surface electrode BE of the semiconductor chip CP1 via the die pad DP and the bonding member BD1, and additionally, the voltage can be prevented from being supplied to the back surface of the semiconductor chip CP2. Thus, the semiconductor chip CP1 and the semiconductor chip CP2 both can be appropriately operated.

<Electrostatic Breakdown>

The semiconductor chip CP2 and the die pad DP have the insulating bonding member BD2 interposed therebetween and are electrically insulated from each other. The withstand voltage between the semiconductor chip CP2 and the die pad DP preferably increases in order to increase the reliability of the semiconductor device PKG. For example, when the withstand voltage between the semiconductor chip CP2 and the die pad DP is low, there is a possibility that an electrostatic breakdown being a breakdown due to electro-static discharge (ESD) occurs between the semiconductor chip CP2 and the die pad DP. The withstand voltage between the semiconductor chip CP2 and the die pad DP preferably increases as much as possible in order to prevent the electrostatic breakdown from occurring. Note that the withstand voltage means dielectric strength.

When the insulating bonding member is used as the die bonding material for the semiconductor chip CP2 (the bonding member BD102) in the semiconductor device PKG101 according to the study example illustrated in FIG. 33, there is a possibility that an electrostatic breakdown occurs between the semiconductor chip CP2 and the die pad DP102. However, in the semiconductor device PKG101 according to the study example illustrated in FIG. 33, the die pad DP101 mounted with the semiconductor chip CP1 and the die pad DP102 mounted with the semiconductor chip CP2 are separated from each other, so that the semiconductor chip CP2 can be mounted over the die pad DP102 via a conductive die bonding material (the bonding member BD102). In this case, the semiconductor chip CP2 and the die pad DP102 conduct to each other via the conductive die bonding material (the bonding member BD102), so that no electric charge is charged in a bonded portion of the semiconductor chip CP2 and the die pad DP102. Thus, no electro-static discharge occurs between the semiconductor chip CP2 and the die pad DP102, and therefore, no electrostatic breakdown occurs. Accordingly, there is no concern about a withstand voltage between the semiconductor chip CP2 and the die pad DP102 in the semiconductor device PKG101 according to the study example illustrated in FIG. 33.

Alternatively, differently from the present embodiment, it is assumed that the semiconductor device PKG includes no semiconductor chip CP1 but only the semiconductor chip CP2 mounted over the die pad DP without the semiconductor chip CP1 mounted thereover. In this case, the semiconductor chip CP2 can be mounted over the die pad DP via a conductive die bonding material (e.g., silver paste) instead of the insulating bonding member BD2. In this case, the semiconductor chip CP2 and the die pad DP conduct to each other via the conductive die bonding material, and accordingly, no electric charge is charged in a bonded portion of the semiconductor chip CP2 and the die pad DP. Thus, no electro-static discharge occurs between the semiconductor chip CP2 and the die pad DP, and therefore, no electrostatic breakdown occurs. Accordingly, there is no concern about a withstand voltage between the semiconductor chip CP2 and the die pad DP.

However, according to the present embodiment, the semiconductor chip CP1 having the back surface electrode BE is adjacently mounted over the common die pad DP, together with the semiconductor chip CP2. Accordingly, the semiconductor chip CP2 is mounted over the die pad DP electrically connected with the back surface electrode BE of the semiconductor chip CP1, and accordingly, the die bonding material for the semiconductor chip CP2 (here, the bonding member BD2) is required to have no conductivity but insulation property. In this case, the semiconductor chip CP2 and the die pad DP are insulated via the insulating die bonding material (here, the bonding member BD2), and accordingly, an electric charge may be charged in the bonded portion of the semiconductor chip CP2 and the die pad DP, so that the electro-static discharge may occur between the semiconductor chip CP2 and the die pad DP, causing the electrostatic breakdown.

That is, when a semiconductor chip is mounted over a conductive die pad via a conductive die bonding material, there is no risk that an electrostatic breakdown occurs between the semiconductor chip and the die pad. However, when the semiconductor chip is mounted over the conductive die pad via an insulating die bonding material, there is a risk that the electrostatic breakdown occurs between the semiconductor chip and the die pad. However, as described above, the semiconductor chip CP2 is necessarily mounted over the conductive die pad DP via the insulating die bonding material.

Accordingly, it is preferable to increase the withstand voltage between the semiconductor chip CP2 and the die pad DP as much as possible such that the electrostatic breakdown is prevented from occurring between the semiconductor chip CP2 and the die pad DP, in order to improve the reliability of the semiconductor device PKG. Therefore, even when a voltage (e.g., 2000 V or more) excessively higher than the voltage to be supplied to the back surface electrode BE of the semiconductor chip CP1 (e.g., approximately several ten volts), is applied between the semiconductor chip CP2 and the die pad DP during a normal operation of the semiconductor device PKG in order to prevent the electrostatic breakdown between the semiconductor chip CP2 and the die pad DP, a dielectric breakdown is preferably prevented from occurring between the semiconductor chip CP2 and the die pad DP.

<Semiconductor Chip CP2 and Bonding Member BD2>

Figure 34:
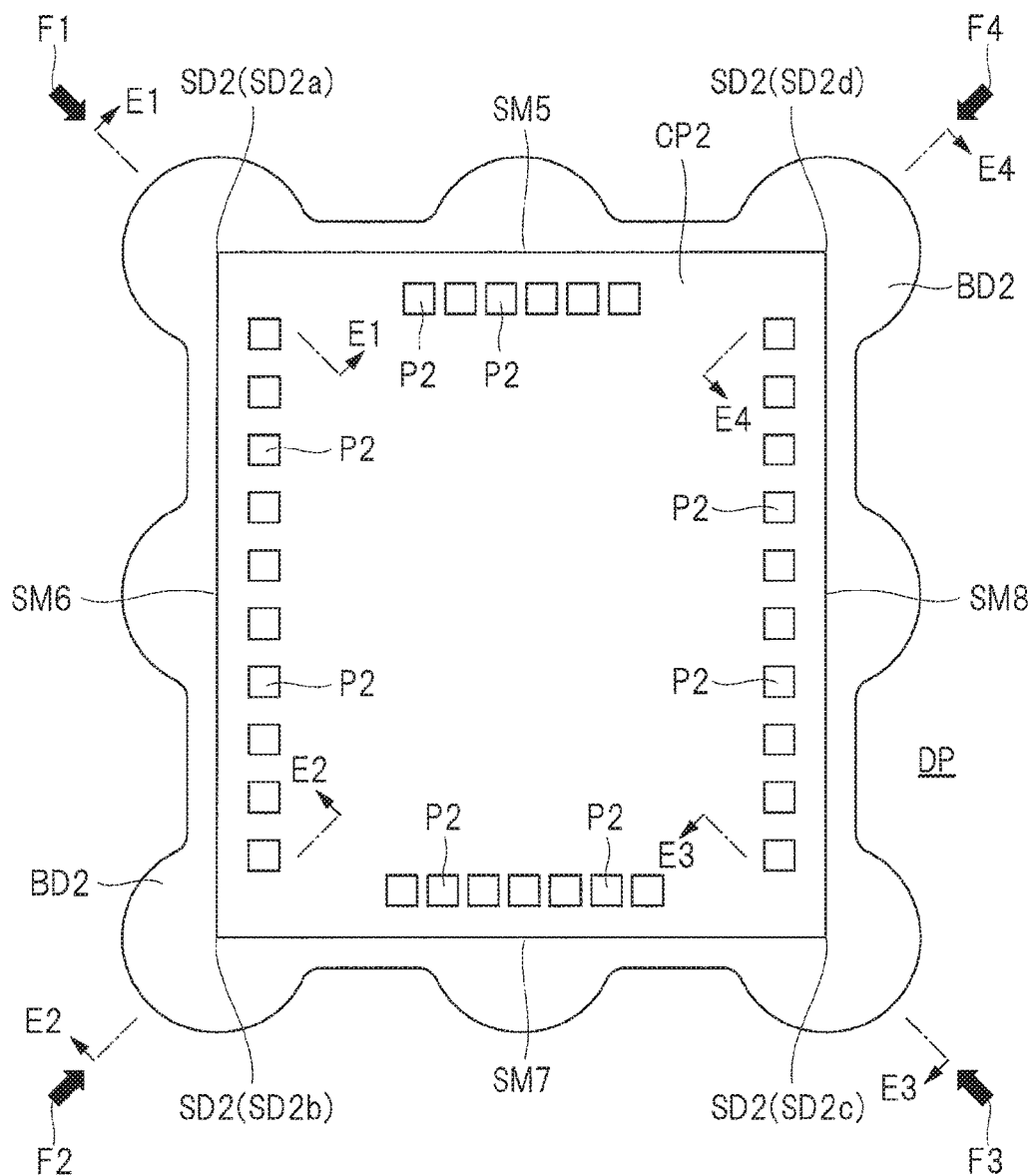
FIG. 34 is a partially enlarged plan perspective view of the semiconductor device according to the embodiment.
Figure 35:
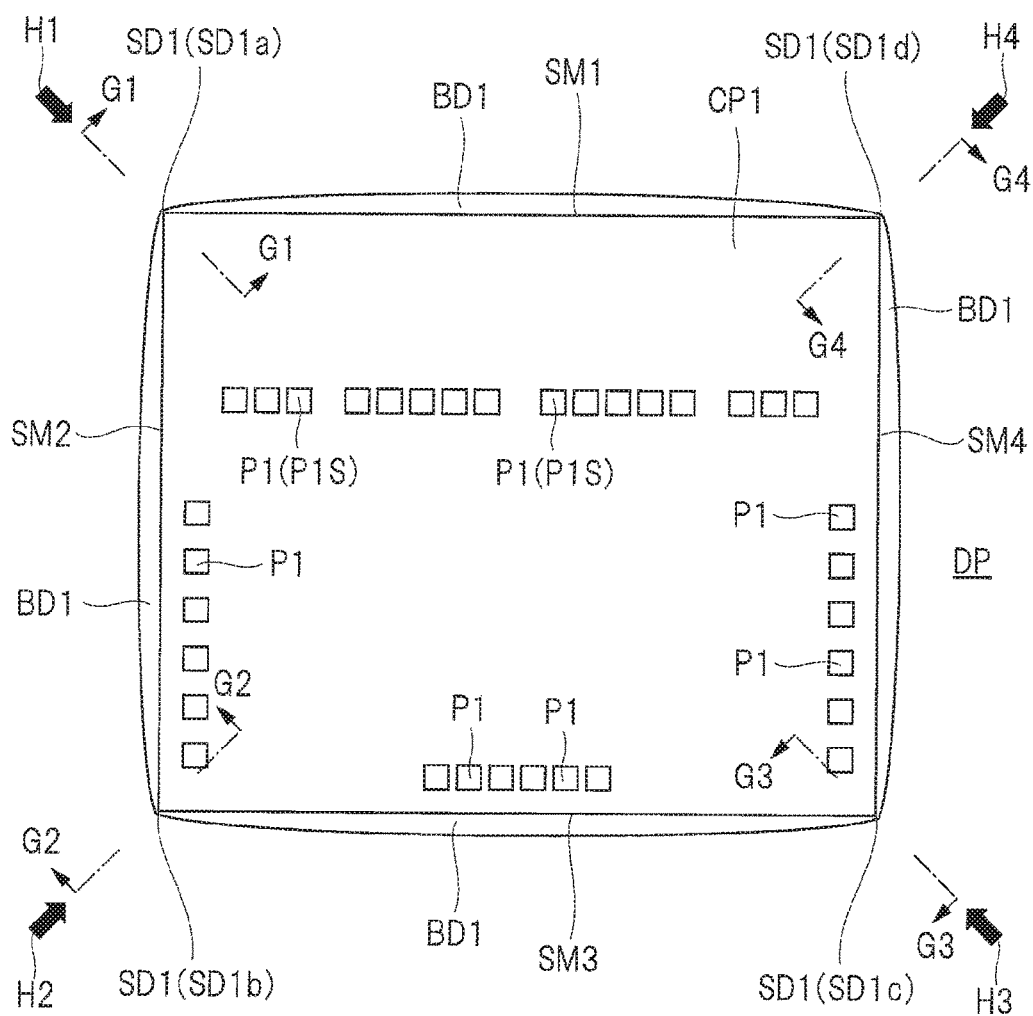
FIG. 35 is a partially enlarged plan perspective view of the semiconductor device according to the embodiment.

FIGS. 34 and 35 are partially enlarged plan perspective views of the semiconductor device PKG. FIG. 34 illustrates the semiconductor chip CP2 mounted over the die pad DP via the bonding member BD2 in an enlarged manner, and FIG. 35 illustrates the semiconductor chip CP1 mounted over the die pad DP via the bonding member BD1 in an enlarged manner. Note that FIG. 34 and FIG. 35 give the illustrations seen through the sealing portion MR and the wires BW, similarly to FIG. 3. Accordingly, FIG. 34 illustrates the semiconductor chip CP2 and the bonding member BD2, and FIG. 35 illustrates the semiconductor chip CP1 and the bonding member BD1.

Figure 36:
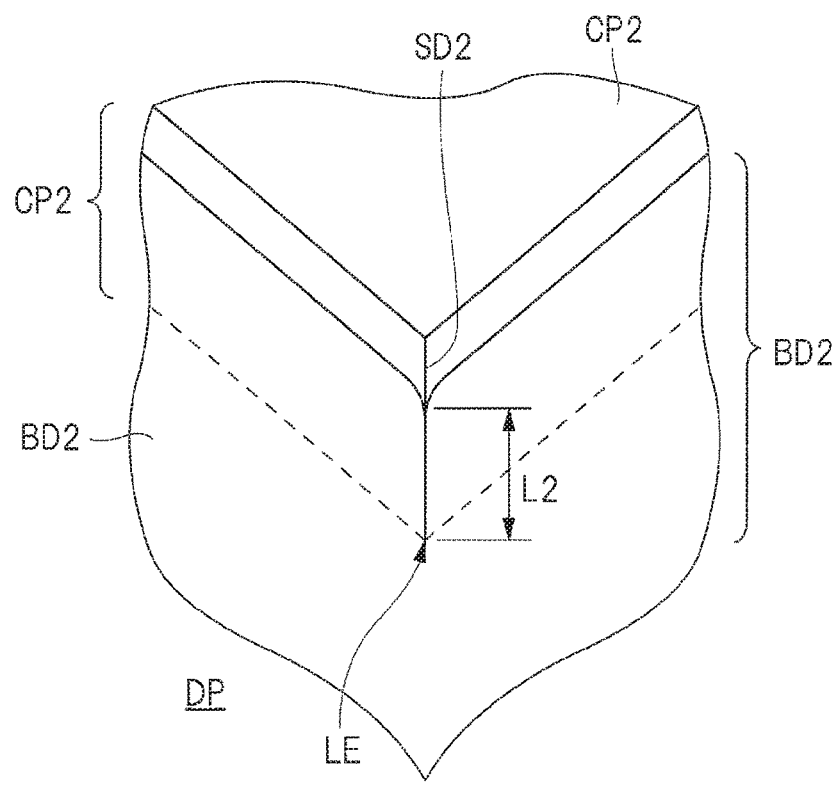
FIG. 36 is a partially enlarged perspective view of the semiconductor device according to the embodiment.
Figure 37:
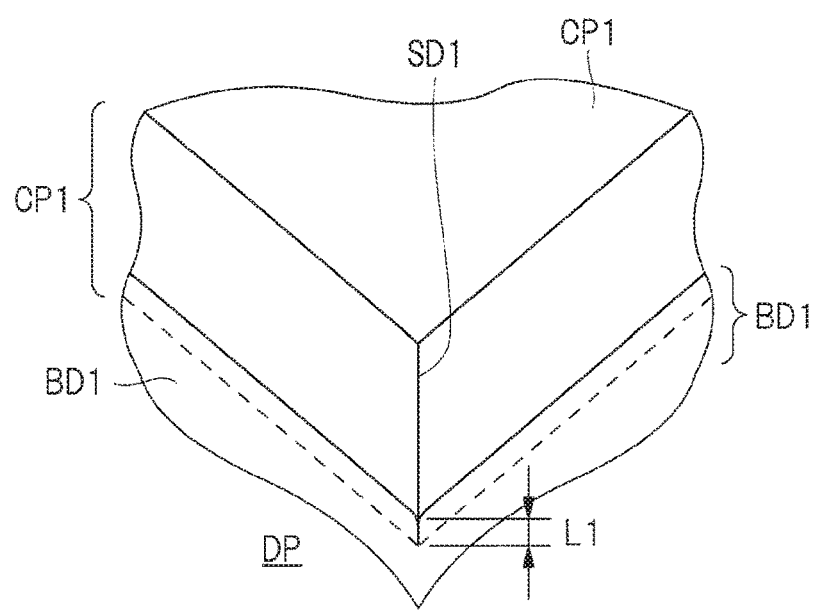
FIG. 37 is a partially enlarged perspective view of the semiconductor device according to the embodiment.

FIGS. 36 and 37 are partially enlarged perspective views of the semiconductor device PKG, seen through the sealing portion MR. Here, FIG. 36 corresponds to a perspective view of the semiconductor chip CP2 viewed in any direction of arrows F1, F2, F3, and F4 in FIG. 34, and FIG. 37 corresponds to a perspective view of the semiconductor chip CP1 viewed in any direction of arrows H1, H2, H3, and H4 in FIG. 35. Accordingly, FIG. 36 illustrates the perspective view of the semiconductor chip CP2, where a side SD2 of the semiconductor chip CP2 appears in front, and FIG. 37 illustrates the perspective view of the semiconductor chip CP1, where a side SD1 of the semiconductor chip CP1 appears in front.

Figure 38:
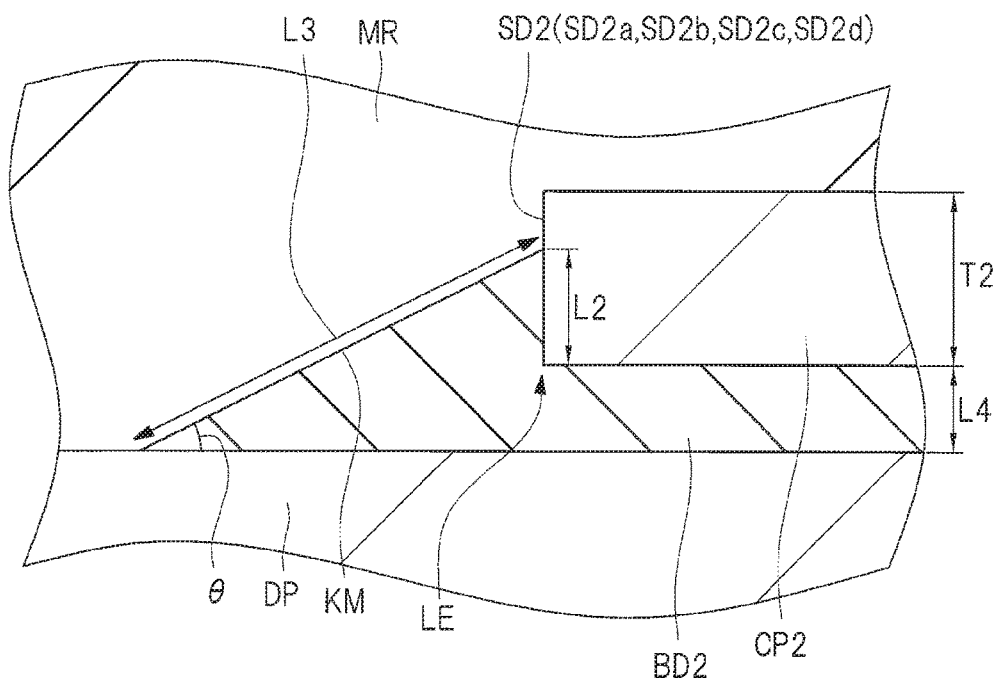
FIG. 38 is a partially enlarged cross-sectional view of the semiconductor device according to the embodiment.
Figure 39:
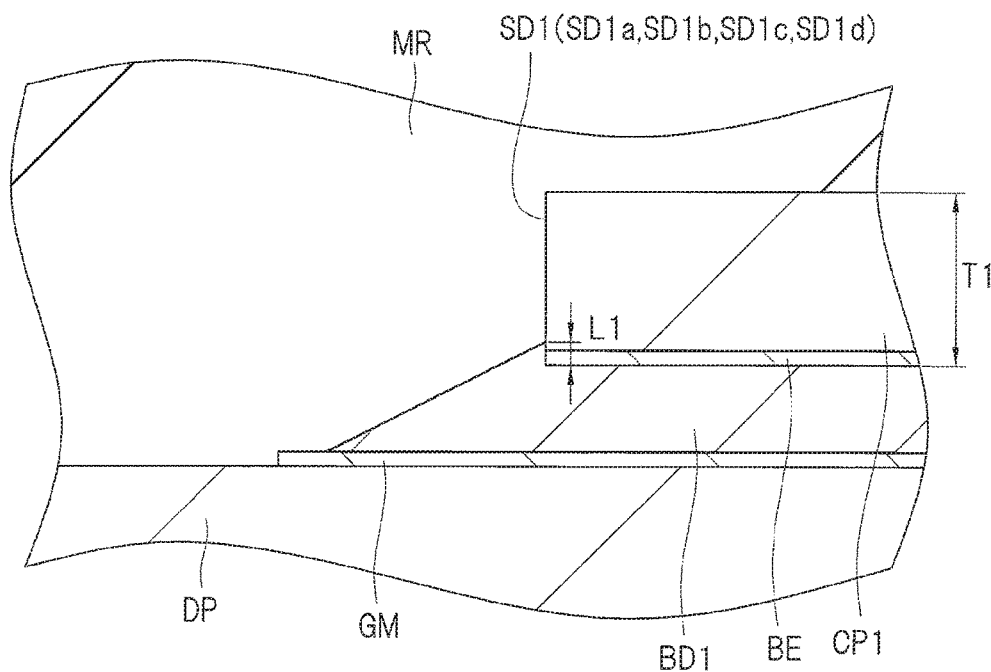
FIG. 39 is a partially enlarged cross-sectional view of the semiconductor device according to the embodiment.

FIGS. 38 and 39 are partially enlarged cross-sectional views of the semiconductor device PKG. FIG. 38 corresponds to any cross-sectional view taken along a line E1-E1, a line E2-E2, a line E3-E3, and a line E4-E4 in FIG. 34, and FIG. 39 corresponds to any cross-sectional view taken along lines G1-G1, G2-G2, G3-G3, and G4-G4 in FIG. 35. Accordingly, FIG. 38 illustrates a cross-section along the side SD2 of the semiconductor chip CP2, and FIG. 39 illustrates a cross-section along the side SD1 of the semiconductor chip CP1.

When the semiconductor chip CP1 and the semiconductor chip CP2 are mounted over the common die pad DP, the electrostatic breakdown between the semiconductor chip CP2 and the die pad DP may be caused by requiring an insulating die bonding material to be used as the die bonding material for the semiconductor chip CP2, and therefore, the present inventors studied making the withstand voltage between the semiconductor chip CP2 and the die pad DP higher. As a result, it was found that covering the side SD2 of the semiconductor chip CP2 with the insulating bonding member BD2 as much as possible was effective in order to increase the withstand voltage between the semiconductor chip CP2 and the die pad DP.

Here, the side (a corner) SD2 of the semiconductor chip CP2 corresponds to a side (a corner) formed by an intersection of two side surfaces of the four side surfaces of the semiconductor chip CP2 (see FIGS. 34, 36, and 38). The semiconductor chip CP2 has the four side surfaces SM5, SM6, SM7, and SM8 so as to have the four sides SD2 formed by intersections of the adjacent side surfaces (SM5, SM6, SM7, and SM8). That is, the sides SD2 of the semiconductor chip CP2 include a side SD2 (SD2a) formed by an intersection of the side surface SM5 and the side surface SM6, a side SD2 (SD2b) formed by an intersection of the side surface SM6 and the side surface SM7, a side SD2 (SD2c) formed by an intersection of the side surface SM7 and the side surface SM8, and a side SD2 (SD2d) formed by an intersection of the side surface SM8 and the side surface SM5.

Here, the side SD2 formed by the intersection of the side surface SM5 and the side surface SM6 is denoted with a reference character SD2a so as to be referred to as a side SD2a, and the side SD2 formed by the intersection of the side surface SM6 and the side surface SM7 is denoted with a reference character SD2b so as to be referred to as a side SD2b, in the semiconductor chip CP2. In addition, the side SD2 formed by the intersection of the side surface SM7 and the side surface SM8 is denoted with a reference character SD2c so as to be referred to as a side SD2c, and the side SD2 formed by the intersection of the side surface SM8 and the side surface SM5 is denoted with a reference character SD2d so as to be referred to as a side SD2d, in the semiconductor chip CP2. The side SD2a is present between the side surface SM5 and the side surface SM6, the side SD2b is present between the side surface SM6 and the side surface SM7, the side SD2c is present between the side surface SM7 and the side surface SM8, and the side SD2d is present between the side surface SM8 and the side surface SM5.

In addition, the side (a corner) SD1 of the semiconductor chip CP1 corresponds to a side (a corner) formed by an intersection of two side surfaces of the four side surfaces of the semiconductor chip CP1 (see FIGS. 35, 37, and 39). The semiconductor chip CP1 has the four side surfaces SM1, SM2, SM3, and SM4 so as to have the four sides SD1 formed by intersections of the adjacent side surfaces (SM1, SM2, SM3, and SM4). That is, the sides SD1 of the semiconductor chip CP1 include a side SD1 (SD1a) formed by an intersection of the side surface SM1 and the side surface SM2, a side SD1 (SD1b) formed by an intersection of the side surface SM2 and the side surface SM3, a side SD1 (SD1c) formed by an intersection of the side surface SM3 and the side surface SM4, and a side SD1 (SD1d) formed by an intersection of the side surface SM4 and the side surface SM1.

Here, the side SD1 formed by the intersection of the side surface SM1 and the side surface SM2 is denoted with a reference character SD1a so as to be referred to as a side SD1a, and the side SD1 formed by the intersection of the side surface SM2 and the side surface SM3 is denoted with a reference character SD1b so as to be referred to as a side SD1b, in the semiconductor chip CP1. In addition, the side SD1 formed by the intersection of the side surface SM3 and the side surface SM4 is denoted with a reference character SD1c so as to be referred to as a side SD1c, and the side SD1 formed by the intersection of the side surface SM4 and the side surface SM1 is denoted with a reference character SD1d so as to be referred to as a side SD1d, in the semiconductor chip CP1. The side SD1a is present between the side surface SM1 and the side surface SM2, the side SD1b is present between the side surface SM2 and the side surface SM3, the side SD1c is present between the side surface SM3 and the side surface SM4, and the side SD1d is present between the side surface SM4 and the side surface SM1.

According to the study of the present inventors, it was found that a path in which the dielectric breakdown such as the electrostatic breakdown occurred between the semiconductor chip CP2 and the die pad DP was not in the bonding member BD2 but in an interface (a boundary surface) KM between the bonding member BD2 and the sealing portion MR. That is, in FIG. 38, a leak path between the semiconductor chip CP2 and the die pad DP is the interface KM between the bonding member BD2 and the sealing portion MR, and the inside of the bonding member BD2 interposed between the semiconductor chip CP2 and the die pad DP barely becomes the leak path. Accordingly, when a high voltage is applied between the semiconductor chip CP2 and the die pad DP, the interface KM between the bonding member BD2 and the sealing portion MR becomes the leak path, so that the dielectric breakdown such as the electrostatic breakdown easily occurs.

In addition, a portion on which an electric field easily concentrates in the semiconductor chip CP2 in applying high voltage between the semiconductor chip CP2 and the die pad DP is a pointed portion (a corner portion) in the semiconductor chip CP2. Specifically, the electric field easily concentrates on the side SD2 of the semiconductor chip CP2, and particularly, the electric field easily concentrates on a lower end LE of the side SD2 of the semiconductor chip CP2. Here, the lower end LE of the side SD2 of the semiconductor chip CP2 is illustrated in FIGS. 36 and 38 and corresponds to a point (a corner portion) at which the two side surfaces adjacent to each other with the side SD2 interposed therebetween and the back surface intersect in the semiconductor chip CP2. That is, each lower end LE of the sides SD2 of the semiconductor chip CP2 corresponds to each leading end of four corner portions of the back surface of the semiconductor chip CP2.

Based on the findings, it was found that covering the sides SD2 of the semiconductor chip CP2 with the insulating bonding member BD2 as much as possible was effective in order to increase the withstand voltage between the semiconductor chip CP2 and the die pad DP. That is, it was found that lengthening a length L2 of a portion covered with the bonding member BD2 in each of the sides SD2 of the semiconductor chip CP2 was effective in order to increase the withstand voltage between the semiconductor chip CP2 and the die pad DP. The reason will be described in more detail below.

That is, as described above, the electric field particularly concentrates on each of the lower ends LE of the sides SD2 of the semiconductor chip CP2 in applying high voltage between the semiconductor chip CP2 and the die pad DP. In addition, the interface KM between the bonding member BD2 and the sealing portion MR easily becomes the leak path. Accordingly, when each lower end LE on which the electric field concentrate is close to the interface KM that easily becomes the leak path, leakage occurs between each lower end LE of the sides SD2 of the semiconductor chip CP2 and the die pad DP through the interface KM between the bonding member BD2 and the sealing portion MR, so that the dielectric breakdown such as the electrostatic breakdown easily occurs. Accordingly, putting the interface KM that easily becomes the leak path away from the lower end LE of the side SD2 of the semiconductor chip CP2 on which the electric field easily concentrate is effective in order to increase the withstand voltage between the semiconductor chip CP2 and the die pad DP.

In contrast, lengthening the length L2 of the portion covered with the bonding member BD2 in each of the sides SD2 of the semiconductor chip CP2 can lengthen a distance from each of the lower ends LE of the sides SD2 of the semiconductor chip CP2 to the interface KM between the bonding member BD2 and the sealing portion MR. Accordingly, the dielectric breakdown such as the electrostatic breakdown can be suppressed or prevented from occurring between each of the lower ends LE of the sides SD2 of the semiconductor chip CP2 and the die pad DP through the interface KM between the bonding member BD2 and the sealing portion MR in applying high voltage between the semiconductor chip CP2 and the die pad DP. Accordingly, the withstand voltage between the semiconductor chip CP2 and the die pad DP can be improved. Therefore, the reliability of the semiconductor device PKG can be improved.

In addition, as described above, when high voltage is applied between the semiconductor chip CP2 and the die pad DP, the interface KM between the bonding member BD2 and the sealing portion MR becomes the leak path, so that the dielectric breakdown such as the electrostatic breakdown easily occurs. Accordingly, lengthening a distance L3 from each of the sides SD2 of the semiconductor chip CP2 to the die pad DP along the interface KM between the bonding member BD2 and the sealing portion MR can also inhibit the dielectric breakdown from occurring along the interface KM between the bonding member BD2 and the sealing portion MR and is effective in order to increase the withstand voltage between the semiconductor chip CP2 and the die pad DP.

In contrast, lengthening the length L2 of the portion covered with the bonding member BD2 in each of the sides SD2 of the semiconductor chip CP2 can lengthen the distance L3 from each of the sides SD2 of the semiconductor chip CP2 to the die pad DP along the interface KM between the bonding member BD2 and the sealing portion MR. That is, even when the length L2 of the portion covered with the bonding member BD2 in each of the sides SD2 of the semiconductor chip CP2 varies, an angle θ between the interface KM and the upper surface of the die pad DP hardly varies. Accordingly, it is required to lengthen the length L2 of the portion covered with the bonding member BD2 in each of the sides SD2 of the semiconductor chip CP2 in order to lengthen the distance L3 from each of the sides SD2 of the semiconductor chip CP2 to the die pad DP along the interface KM between the bonding member BD2 and the sealing portion MR. That is, lengthening the length L2 can lengthen the distance L3 from each of the sides SD2 of the semiconductor chip CP2 to the die pad DP along the interface KM, so that the dielectric breakdown such as the electrostatic breakdown can be inhibited or prevented from occurring between the semiconductor chip CP2 and the die pad DP through the interface KM in applying high voltage between the semiconductor chip CP2 and the die pad DP. Accordingly, the withstand voltage between the semiconductor chip CP2 and the die pad DP can be improved. Therefore, the reliability of the semiconductor device PKG can be improved.

In addition, as described above, the electric field easily concentrated on each of the sides SD2 of the semiconductor chip CP2 in applying high voltage between the semiconductor chip CP2 and the die pad DP. In addition, a withstand voltage of the material included in the bonding member BD2 (a dielectric strength per unit distance) is higher than a withstand voltage of the material included in the sealing portion MR (a dielectric strength per unit distance). This is because the material for the sealing portion MR is required to be selected in consideration of easy formation of the sealing portion MR in a sealing step (the molding step), so that varying the material of the sealing portion MR is difficult in consideration of the withstand voltage, whereas the bonding member BD2 is not a sealing body, so that the material of the bonding member BD2 is easily arranged, and a material having a high withstand voltage can be selected. Accordingly, covering the side SD2 of the semiconductor chip CP2 on which the electric field easily concentrates with the bonding member BD2 having a high withstand voltage, instead of the sealing portion MR having a low withstand voltage, easily inhibits the dielectric breakdown such as the electrostatic breakdown from occurring between the semiconductor chip CP2 and the die pad DP in applying high voltage between the semiconductor chip CP2 and the die pad DP.

In contrast, lengthening the length L2 of the portion covered with the bonding member BD2 in each of the sides SD2 of the semiconductor chip CP2 can increase a ratio of the portion covered with the bonding member BD2 having a high withstand voltage, of each side SD2 of the semiconductor chip CP2 on which the electric field easily concentrates. Accordingly, the dielectric breakdown such as the electrostatic breakdown can be inhibited or prevented from occurring between the semiconductor chip CP2 and the die pad DP in applying high voltage between the semiconductor chip CP2 and the die pad DP. Accordingly, the withstand voltage between the semiconductor chip CP2 and the die pad DP can be improved. Therefore, the reliability of the semiconductor device PKG can be improved.

In this manner, lengthening the length L2 of the portion covered with the bonding member BD2 in each of the sides SD2 of the semiconductor chip CP2 is effective in order to increase the withstand voltage between the semiconductor chip CP2 and the die pad DP.

<Semiconductor Chip CP1 and Bonding Member BD1>

Meanwhile, the semiconductor chip CP1 is mounted over the die pad DP via the conductive bonding member BD1, so that the back surface electrode BE of the semiconductor chip CP1 and the die pad DP conduct to each other via the conductive bonding member BD1, and no dielectric breakdown such as the electrostatic breakdown occurs between the semiconductor chip CP1 and the die pad DP. Accordingly, there is no concern about a withstand voltage between the semiconductor chip CP1 and the die pad DP. Therefore, there is no need to lengthen the length L1 of a portion covered with the bonding member BD1 in each of the sides SD1 of the semiconductor chip CP1.

In addition, the bonding member BD1 being the die bonding material for the semiconductor chip CP1 has the conductivity. When a part of the conductive die bonding material adheres to the front surface of the semiconductor chip CP1, a short circuit may be caused between the pad electrodes P1 of the semiconductor chip CP1. This degrades the reliability of the semiconductor device PKG and also decreases the manufacturing yield of the semiconductor device PKG. Accordingly, it is required to prevent the conductive die bonding material from adhering to the front surface of the semiconductor chip CP1 as much as possible.

The length L1 of the portion covered with the bonding member BD1 in each of the sides SD1 of the semiconductor chip CP1 is preferably shortened. This is because lengthening the length L1 of the portion covered with the bonding member BD1 in each of the sides SD1 of the semiconductor chip CP1 increases a possibility that the part of the conductive bonding member BD1 adheres to the front surface of the semiconductor chip CP1. Accordingly, shortening the length L1 of the portion covered with the bonding member BD1 in each of the sides SD1 of the semiconductor chip CP1 can reduce the possibility that the part of the conductive bonding member BD1 adheres to the front surface of the semiconductor chip CP1. Accordingly, it is possible to inhibit or prevent the part of the conductive bonding member BD1 from adhering to the front surface of the semiconductor chip CP1, so that the reliability of the semiconductor device PKG can be improved. In addition, the manufacturing yield of the semiconductor device PKG can be improved.

Meanwhile, the semiconductor chip CP2 uses the insulating die bonding material. Accordingly, even when a part of the die bonding material (here, the bonding member BD2) adheres to the front surface of the semiconductor chip CP2, the die bonding material has insulation property, so that no short circuit occurs between the pad electrodes P2. Accordingly, the adhesion of the part of the insulating die bonding material to the front surface of the semiconductor chip CP2 barely causes a problem in comparison to the adhesion of the part of the conductive die bonding material to the front surface of the semiconductor chip CP1.

<Main Features and Effect>

As one of main features according to the present embodiment, the length L2 of the portion covered with the bonding member BD2 in each of the sides SD2 of the semiconductor chip CP2 is made larger than the length L1 of the portion covered with the bonding member BD1 in each of the sides SD1 of the semiconductor chip CP1 (that is, L2>L1).

That is, the semiconductor device PKG according to the present embodiment includes the die pad DP having the conductivity (the chip mounting portion), the semiconductor chip CP2 (a first semiconductor chip) mounted over the die pad DP via the bonding member BD2 (a first bonding member) having insulation property, and the semiconductor chip CP1 (a second semiconductor chip) mounted over the die pad DP via the bonding member BD1 (a second bonding member) having the conductivity. The semiconductor device PKG further includes the sealing portion MR (the sealing body) sealing the semiconductor chip CP1, the semiconductor chip CP2, and at least apart of the die pad DP. The semiconductor chip CP1 has the back surface electrode BE, and the back surface electrode BE of the semiconductor chip CP1 is electrically connected with the die pad DP via the bonding member BD1. The length L2 (a first length) of a portion, in a side SD2 (a first side) formed by an intersection of a first side surface and the second side surface of the semiconductor chip CP2, covered with the bonding member BD2 is larger than the length L1 (a second length) of a portion, in a side SD1 (a second side) formed by an intersection of a third side surface and a fourth side surface of the semiconductor chip CP1, covered with the bonding member BD1 (L2>L1).

According to the present embodiment, the semiconductor chip CP2 mounted via the insulating bonding member BD2 has the length L2 longer than the length L1 in order to increase the withstand voltage between the semiconductor chip CP2 and the die pad DP, out of the semiconductor chips CP1 and CP2 mounted over the common die pad DP. The semiconductor chip CP1 mounted via the conductive bonding member BD1 has the length L1 shorter than the length L2 in order to prevent the part of the conductive bonding member BD1 from adhering to the front surface of the semiconductor chip CP1, out of the semiconductor chips CP1 and CP2 mounted over the common die pad DP. Accordingly, the withstand voltage between the semiconductor chip CP2 and the die pad DP can be improved, so that the dielectric breakdown such as the electrostatic breakdown can be inhibited or prevented from occurring between the semiconductor chip CP2 and the die pad DP, and additionally, the part of the conductive bonding member BD1 can be inhibited or prevented from adhering to the front surface of the semiconductor chip CP1. Therefore, the comprehensive reliability of the semiconductor device PKG can be improved.

That is, improving the withstand voltage with respect to the die pad DP is important for the semiconductor chip CP2 because of the use of the insulating die bonding material, and preventing the conductive die bonding material from adhering to the front surface of the semiconductor chip CP1 is important for the semiconductor chip CP1 because of the use of the conductive die bonding material, out of the semiconductor chips CP1 and CP2. According to the present embodiment, the length L2 of the portion covered with the bonding member BD2 in each of the sides SD2 of the semiconductor chip CP2 is made larger than the length L1 of the portion covered with the bonding member BD1 in each of the sides SD1 of the semiconductor chip CP1 (L2>L1), so that the different requirement described above with respect to each of the semiconductor chips CP1 and CP2 can be satisfied, and the comprehensive reliability of the semiconductor device PKG can be improved.

Here, if the problem of the electrostatic breakdown between the semiconductor chip CP2 and the die pad DP is not found when the semiconductor chip CP1 is mounted via the conductive die bonding material and the semiconductor chip CP2 is mounted via the insulating die bonding material on the common die pad DP, the technical idea according to the present embodiment, of satisfying the relation of L2>L1 described above cannot be found. This is because preventing a die bonding material from adhering to a front surface of a semiconductor chip is a typical idea regardless of whether the die bonding material has conductivity or insulation property. Accordingly, if the problem of the electrostatic breakdown between the semiconductor chip CP2 and the die pad DP is not found, decreasing the length L2 of the portion covered with the bonding member BD2 in each of the sides SD2 as much as possible is a proper idea also in the semiconductor chip CP2.

However, the present inventors have found that the problem of the electrostatic breakdown between the semiconductor chip CP2 and the die pad DP arises when the semiconductor chip CP1 is mounted via the conductive die bonding material and the semiconductor chip CP2 is mounted via the insulating die bonding material on the common die pad DP, and in order to solve the problem, the length L2 described above is made larger. Meanwhile, the length L1 is made smaller, considering that no electrostatic breakdown occurs between the semiconductor chip CP1 and the die pad DP and further, considering that a large problem such as the short circuit between the pad electrodes P1 may arise when the conductive die bonding material adheres to the front surface of the semiconductor chip in comparison to adhesion of an insulating die bonding material to the front surface of the semiconductor chip.

Therefore, the problem of the present application cannot be recognized in a state where a semiconductor package including only the semiconductor chip CP1 without the semiconductor chip CP2 and a semiconductor package including only the semiconductor chip CP2 without the semiconductor chip CP1 are individually prepared. Therefore, it can be said that the technical idea according to the present embodiment cannot be reached. In addition, if the problem of the electrostatic breakdown between the semiconductor chip CP2 and the die pad DP is not found when the semiconductor chip CP1 is mounted via the conductive die bonding material and the semiconductor chip CP2 is mounted via the insulating die bonding material on the common die pad DP, it can be said that the technical idea according to the present embodiment cannot be reached. That is, a case where the semiconductor chip CP1 is mounted via the conductive die bonding material and the semiconductor chip CP2 is mounted via the insulating die bonding material on the common die pad DP was studied, and then, the problem of the electrostatic breakdown between the semiconductor chip CP2 and the die pad DP was found. Therefore, it can be said that the technical idea according to the present embodiment was reached.

In addition, the sides SD2 of the semiconductor chip CP2 include the four sides SD2a, SD2b, SD2c, and SD2d, and the sides SD1 of the semiconductor chip CP1 include the four sides SD1a, SD1b, SD1c, and SD1d.

When a side having a small length L2 of a portion covered with the bonding member BD2 is present in the four sides SD2a, SD2b, SD2c, and SD2d of the semiconductor chip CP2, a withstand voltage becomes low between the small side and the die pad DP. Accordingly, the length L2 of the portion covered with the bonding member BD2 in any of the four sides SD2a, SD2b, SD2c, and SD2d of the semiconductor chip CP2 is preferably large. Accordingly, the withstand voltage between the semiconductor chip CP2 and the die pad DP can appropriately be enhanced.

In addition, when a side having a large length L1 of a portion covered with the bonding member BD1 is present in the four sides SD1a, SD1b, SD1c, and SD1d of the semiconductor chip CP1, a part of the conductive bonding member BD1 adheres to the front surface of the semiconductor chip CP1 due to the large side. Accordingly, the length L1 of the portion covered with the bonding member BD1 in any of the four sides SD1a, SD1b, SD1c, and SD1d of the semiconductor chip CP1 is preferably small. Accordingly, the part of the conductive bonding member BD1 can be appropriately prevented from adhering to the front surface of the semiconductor chip CP1.

Therefore, a case where an arbitrary side SD2 of the four sides SD2a, SD2b, SD2c, and SD2d of the semiconductor chip CP2, and an arbitrary side SD1 of the four sides SD1a, SD1b, SD1c, and SD1d of the semiconductor chip CP1 are compared is assumed. In this case, even when any side SD1 and any side SD2 are selected, the length L2 of the portion covered with the bonding member BD2 in the arbitrary side SD2 and the length L1 of the portion covered with the bonding member BD1 in the arbitrary side SD1 preferably always satisfy the relation of L2>L1. That is, the relation of L2>L1 is preferably satisfied with any combination between the four sides SD2a, SD2b, SD2c, and SD2d of the semiconductor chip CP2 and the four sides SD1a, SD1b, SD1c, and SD1d of the semiconductor chip CP1.

Here, the smallest value in the length L2 of the portion covered with the bonding member BD2 in the side SD2a, the length L2 of the portion covered with the bonding member BD2 in the side SD2b, the length L2 of the portion covered with the bonding member BD2 in the side SD2c, and the length L2 of the portion covered with the bonding member BD2 in the side SD2d in the semiconductor chip CP2 is referred to as a minimum value L2min. In addition, the largest value in the length L1 of the portion covered with the bonding member BD1 in the side SD1a, the length L1 of the portion covered with the bonding member BD1 in the side SD1b, the length L1 of the portion covered with the bonding member BD1 in the side SD1c, and the length L1 of the portion covered with the bonding member BD1 in the side SD1d in the semiconductor chip CP1 is referred to as a maximum value L1max. In this case, the minimum value L2min is preferably larger than the maximum value L1max (that is, L2min>L1max). That is, the minimum value L2min of the length L2 of the portion covered with the bonding member BD2 in the sides SD2a, SD2b, SD2c, and SD2d of the semiconductor chip CP2 is preferably larger than the maximum value L1max of the length L1 of the portion covered with the bonding member BD1 in the sides SD1a, SD1b, SD1c, and SD1d of the semiconductor chip CP1 (L2min>L1max).

Accordingly, the withstand voltage between the semiconductor chip CP2 and the die pad DP can appropriately be improved, and additionally, the part of the conductive bonding member BD1 can appropriately be inhibited or prevented from adhering to the front surface of the semiconductor chip CP1. Therefore, the comprehensive reliability of the semiconductor device PKG can appropriately be improved.

In addition, as described above, lengthening the length L2 of the portion covered with the bonding member BD2 in each of the sides SD2 of the semiconductor chip CP2 can improve the withstand voltage between the semiconductor chip CP2 and the die pad DP. In order to appropriately obtain an effect of improving the withstand voltage, the length L2 of the portion covered with the bonding member BD2 in each of the sides SD2 of the semiconductor chip CP2 is preferably ½ or more of a thickness T2 of the semiconductor chip CP2 (that is, L2≥T2×½) (see FIG. 38). In addition, the length L2 of the portion covered with the bonding member BD2 in any of the four sides SD2a, SD2b, SD2c, and SD2d of the semiconductor chip CP2 is further preferably ½ or more of the thickness T2 of the semiconductor chip CP2 (that is, L2≥T2×½). That is, the minimum value L2min is further preferably ½ or more of the thickness T2 of the semiconductor chip CP2 (that is, L2min≥T2×½). Accordingly, the withstand voltage between the semiconductor chip CP2 and the die pad DP can more appropriately be improved, so that the dielectric breakdown such as the electrostatic breakdown can be more appropriately inhibited or prevented from occurring between the semiconductor chip CP2 and the die pad DP. Therefore, the reliability of the semiconductor device PKG can more appropriately be improved.

In addition, as described above, shortening the length L1 of the portion covered with the bonding member BD1 in each of the sides SD1 of the semiconductor chip CP1 can reduce the possibility that the part of the conductive bonding member BD1 adheres to the front surface of the semiconductor chip CP1. Accordingly, the length L1 of the portion covered with the bonding member BD1 in each of the sides SD1 of the semiconductor chip CP1 is preferably less than ½ of a thickness T1 of the semiconductor chip CP1 (that is, L1<T1×½), further preferably, ¼ or less of the thickness T1 of the semiconductor chip CP1 (that is, L1≤T1×¼) (see FIG. 39). In addition, the length L1 of the portion covered with the bonding member BD1 in any of the four sides SD1a, SD1b, SD1c, and SD1d of the semiconductor chip CP1 is more preferably less than ½ of the thickness T1 of the semiconductor chip CP1 (that is, L1<T1×½), further preferably, ¼ or less of the thickness T1 of the semiconductor chip CP1 (that is, L1≤T1×¼). That is, the maximum value L1max is more preferably less than ½ of the thickness T1 of the semiconductor chip CP1 (that is, L1max<T1×½), further preferably, ¼ or less of the thickness T1 of the semiconductor chip CP1 (that is, L1max≤T1×¼). Accordingly, the part of the conductive bonding member BD1 can be more appropriately inhibited or prevented from adhering to the front surface of the semiconductor chip CP1. Therefore, the reliability of the semiconductor device PKG can more appropriately be improved. In addition, the manufacturing yield of the semiconductor device PKG can appropriately be improved. Note that, since the semiconductor chip CP1 has the back surface electrode BE, the thickness T1 of the semiconductor chip CP1 also includes the thickness of the back surface electrode BE.

Note that the length L1 of the portion covered with the bonding member BD1 in each of the sides SD1 of the semiconductor chip CP1 may be zero (that is, L1=0). When the following expression L1=0 is satisfied, the sides SD1 of the semiconductor chip CP1 are not covered with the bonding member BD1.

In addition, when the present embodiment is applied to a case where the withstand voltage of the bonding member BD2 (a withstand voltage per unit distance) is larger than the withstand voltage of the sealing portion MR (a withstand voltage per unit distance), the effect is considerably large. In other words, when the present embodiment is applied to a case where the withstand voltage of the sealing portion MR (the withstand voltage per unit distance) is smaller than the withstand voltage of the bonding member BD2 (the withstand voltage per unit distance), the effect is considerably large.

The material for the sealing portion MR is required to be selected in consideration of the easy formation of the sealing portion MR in the sealing step (the molding step), so that varying the material of the sealing portion MR is difficult in consideration of the withstand voltage. Meanwhile, the bonding member BD2 is not the sealing body, so that the material of the bonding member BD2 is easily arranged, and a material having a high withstand voltage can be selected. Accordingly, focusing on a withstand voltage of each member of the semiconductor device PKG estimates that the withstand voltage of the sealing portion MR (the withstand voltage per unit distance) becomes smaller than the withstand voltage of the bonding member BD2 (the withstand voltage per unit distance). The withstand voltage of the sealing portion MR (the withstand voltage per unit distance) is, for example, approximately 10 to 30 kV/mm, and the withstand voltage of the bonding member BD2 (the withstand voltage per unit distance) is, for example, approximately 80 to 150 kV/mm.

When the withstand voltage of the sealing portion MR (the withstand voltage per unit distance) is smaller than the withstand voltage of the bonding member BD2 (the withstand voltage per unit distance), the dielectric breakdown such as the electrostatic breakdown easily occurs in the interface KM between the bonding member BD2 and the sealing portion MR. In contrast, according to the present embodiment, lengthening the length L2 of the portion covered with the bonding member BD2 in each of the sides SD2 of the semiconductor chip CP2 as described above can inhibit or prevent the dielectric breakdown such as the electrostatic breakdown from occurring due to the leak path of the interface KM between the bonding member BD2 and the sealing portion MR. Accordingly, even when the withstand voltage of the sealing portion MR is smaller than the withstand voltage of the bonding member BD2, the dielectric breakdown such as the electrostatic breakdown can be inhibited or prevented from occurring between the semiconductor chip CP2 and the die pad DP, and the reliability of the semiconductor device PKG can be improved. Therefore, when the present embodiment is applied to a case where the withstand voltage of the sealing portion MR (the withstand voltage per unit distance) is smaller than the withstand voltage of the bonding member BD2 (the withstand voltage per unit distance), the effect is considerably large.

FIG. 40 is a table indicating an exemplary effect according to the present embodiment. A sample A and a sample B indicated in FIG. 40 each correspond to a different state of the bonding member BD2 in the semiconductor device PKG. That is, the thickness T2 of the semiconductor chip CP2 is approximately 400 μm in both the sample A and the sample B. The length L2 of the portion covered with the bonding member BD2 in each of the sides SD2 of the semiconductor chip CP2 is approximately 60 μm for the sample A. Since the length L2 is small, the distance L3 is correspondingly made small, and the distance L3 is approximately 85 μm. In addition, the length L2 of the portion covered with the bonding member BD2 in each of the sides SD2 of the semiconductor chip CP2 is approximately 250 μm for the sample B. Since the length L2 is large, the distance L3 is correspondingly made large, and the distance L3 is approximately 320 μm.

The dielectric strength between the semiconductor chip CP2 and the die pad DP was approximately 1300 V for the sample A, whereas even when a voltage of 5000 V was applied for the sample B, no dielectric breakdown occurred between the semiconductor chip CP2 and the die pad DP, and the dielectric strength between the semiconductor chip CP2 and the die pad DP was 5000 V or more.

Like the sample B, lengthening the length L2 of the portion covered with the bonding member BD2 in each of the sides SD2 of the semiconductor chip CP2, preferably, setting the length L2 to ½ or more of the thickness T2 of the semiconductor chip CP2 (L2≥T2×½) can improve the dielectric strength between the semiconductor chip CP2 and the die pad DP, so that the reliability of the semiconductor device can be improved.

The following Expressions (1) and (2) are preferably satisfied:

$$V2 \times L3 \geq V1 \qquad \text{Expression (1)}$$

$$V3 \times L4 \geq V1 \qquad \text{Expression (2)}$$

where V1 represents a required withstand voltage between the semiconductor chip CP2 and the die pad DP (ESD standards), V2 represents the withstand voltage per unit distance of the sealing portion MR, V3 represents the withstand voltage per unit distance of the bonding member BD2, and L4 represents the distance (the interval) between the semiconductor chip CP2 and the die pad DP. Note that the distance (the interval) L4 between the semiconductor chip CP2 and the die pad DP also corresponds to the thickness of the bonding member BD2 of a portion interposed between the die pad DP and the semiconductor chip CP2.

For example, when the required withstand voltage V1 is 2000 V and the withstand voltage V2 per unit distance of the sealing portion MR is approximately 14 kV/mm, the distance L3 is preferably set to approximately 150 μm or more. That is, it is sufficient if the length L2 is made large until the distance L3 reaches approximately 150 μm or more. Accordingly, Expression (1) is satisfied, so that the withstand voltage between the semiconductor chip CP2 and the die pad DP via the interface KM between the semiconductor chip CP2 and the die pad DP can be set to the required withstand voltage V1 or more.

In addition, for example, when the required withstand voltage V1 is 2000 V and the withstand voltage V3 per unit distance of the bonding member BD2 is approximately 90 kV/mm, the distance L4 is preferably set to approximately 23 μm or more. That is, the thickness of the bonding member BD2 of the portion interposed between the die pad DP and the semiconductor chip CP2 is preferably set to approximately 23 μm or more. Accordingly, Expression (2) is satisfied, so that the withstand voltage between the semiconductor chip CP2 and the die pad DP via the bonding member BD2 between the semiconductor chip CP2 and the die pad DP can be set to the required withstand voltage V1 or more.

Therefore, the distance L3 and the distance L4 are set in order to satisfy both of Expression (1) and Expression (2), so that the withstand voltage between the semiconductor chip CP2 and the die pad DP can be set to the required withstand voltage V1 or more.

In addition, according to the present embodiment, the length L2 of the portion covered with the bonding member BD2 in each of the sides SD2 of the semiconductor chip CP2 is made larger than the length L1 of the portion covered with the bonding member BD1 in each of the sides SD1 of the semiconductor chip CP1 (L2>L1). The manufacturing process of the semiconductor device PKG is arranged in order to achieve this condition appropriately. The arrangement will be described below.

The insulating bonding member BD2 is supplied onto the die pad DP in step S2a, and then, the semiconductor chip CP2 is mounted over the die pad DP via the bonding member BD2 in step S2b. Here, a noticeable point is that, in step S2a, the bonding member BD2 is also supplied to positions on which four corners of the semiconductor chip CP2 are superimposed in plan view in mounting the semiconductor chip CP2 on the die pad DP in step S2b (see FIGS. 21 and 29).

FIGS. 21 and 29 illustrate a state immediately after performing step S2a, and therefore, step S2b has not been performed yet. Note that FIG. 21 illustrates a state where the bonding member BD2 has been supplied from the nozzle for supplying the bonding member onto the die pad DP, and FIG. 29 illustrates a state where the bonding member BD2 has been supplied onto the die pad DP by the printing method. In addition, the position to be mounted with the semiconductor chip CP2 in step S2b is indicated with the broken line in FIGS. 21 and 29.

In FIG. 21, the bonding member BD2 is supplied from the nozzle onto the die pad DP in step S2a, so that the bonding member BD2 is locally arranged on the upper surface of the die pad DP. Accordingly, when the bonding member BD2 is supplied from the nozzle, the bonding member BD2 is preferably supplied (arranged) to a plurality of places on the upper surface of the die pad DP. In FIG. 21, the bonding member BD2 is supplied (arranged) to nine places on the upper surface of the die pad DP. In this case, a part of the bonding member BD2 protrudes from the predetermined region to be mounted with the semiconductor chip CP2 in step S2b, and the bonding member BD2 has been also supplied (arranged) to the positions on which the four corners of the semiconductor chip CP2 to be mounted later are superimposed, in step S2a, in plan view.

Here, the predetermined region to be mounted with the semiconductor chip CP2 corresponds to a region on which the semiconductor chip CP2 is superimposed in plan view in mounting the semiconductor chip CP2 on the die pad DP in step S2b and corresponds to a region surrounded with the broken line in FIGS. 21 and 29.

In FIG. 29, the bonding member BD2 is supplied onto the die pad DP by the printing method in step S2a, so that the bonding member BD2 is not locally arranged on the upper surface of the die pad DP but is arranged over a relatively wide area. In FIG. 29, the predetermined region to be mounted with the semiconductor chip CP2 in step S2b is located within a region to which the bonding member BD2 has been supplied (arranged), in plan view. Accordingly, a part of the bonding member BD2 protrudes from the predetermined region to be mounted with the semiconductor chip CP2, and the bonding member BD2 has been supplied (arranged) to the positions on which the four corners of the semiconductor chip CP2 to be mounted later are superimposed in plan view, in step S2a.

A common point in FIGS. 21 and 29 is that the four corners of the predetermined region to be mounted with the semiconductor chip CP2 indicated with the broken line are superimposed on the bonding member BD2 supplied onto the die pad DP in step S2a, in plan view. In step S2b, the semiconductor chip CP2 is mounted over the position indicated with the broken line in FIGS. 21 and 29. Accordingly, in step S2b, the semiconductor chip CP2 is mounted over the die pad DP in a state where the bonding member BD2 has been already arranged in the positions on which the four corners of the semiconductor chip CP2 are superimposed in plan view. That is, in step S2a, the bonding member BD2 is previously supplied to the positions on which the four corners of the semiconductor chip CP2 are superimposed in plan view in mounting the semiconductor chip CP2 onto the die pad DP in step S2b.

Accordingly, when the semiconductor chip CP2 is mounted over the die pad DP in step S2b, the lower end LE of each of the four sides SD2a, SD2b, SD2c, and SD2d of the semiconductor chip CP2 is embedded in the bonding member BD2 arranged on the die pad DP. A lower portion of each of the four sides SD2a, SD2b, SD2c, and SD2d of the semiconductor chip CP2 is embedded in the bonding member BD2 so as to be covered with the bonding member BD2, so that the length L2 of the portion covered with the bonding member BD2 in each of the sides SD2a, SD2b, SD2c, and SD2d of the semiconductor chip CP2, can be made larger. Therefore, the withstand voltage between the semiconductor chip CP2 and the die pad DP can be improved, so that the dielectric breakdown such as the electrostatic breakdown can be inhibited or prevented from occurring between the semiconductor chip CP2 and the die pad DP.

In addition, the conductive bonding member BD1 is supplied onto the die pad DP in step S2c, and then, the semiconductor chip CP1 is mounted over the die pad DP via the bonding member BD1 in step S2d. Here, a noticeable point is that, in step S2c, the bonding member BD1 is not supplied to positions on which four corners of the semiconductor chip CP1 are superimposed in plan view in mounting the semiconductor chip CP1 on the die pad DP in step S2d (see FIGS. 25 and 30).

FIGS. 25 and 30 illustrate a state immediately after performing step S2c, and therefore, step S2d has not been performed yet. Note that FIG. 25 illustrates a state where the bonding member BD1 has been supplied from the nozzle for supplying the bonding member onto the die pad DP, and FIG. 30 illustrates a state where the bonding member BD1 has been supplied onto the die pad DP by the printing method. In addition, the position to be mounted with the semiconductor chip CP1 in step S2d is indicated with the broken line in FIGS. 25 and 30.

In FIG. 25, the bonding member BD1 is supplied from the nozzle onto the die pad DP in step S2c, so that the bonding member BD1 is locally arranged on the upper surface of the die pad DP. Accordingly, when the bonding member BD1 is supplied from the nozzle, the bonding member BD1 is preferably supplied (arranged) to a plurality of places on the upper surface of the die pad DP. In FIG. 25, the bonding member BD1 is supplied (arranged) to five places on the upper surface of the die pad DP. In this case, the bonding member BD1 is supplied so as not to protrude from the predetermined region to be mounted with the semiconductor chip CP1 in step S2d. That is, a region to which the bonding member BD1 has been supplied (arranged) is located within the predetermined region to be mounted with the semiconductor chip CP1 in plan view. In other words, in step S2c, the bonding member BD1 is supplied (arranged) inside the predetermined region to be mounted with the semiconductor chip CP1, and the bonding member BD1 is not supplied (arranged) to an outer periphery portion of the predetermined region to be mounted with the semiconductor chip CP1. Accordingly, in FIG. 25, the bonding member BD1 is not supplied (arranged) to the positions on which the four corners of the semiconductor chip CP1 to be mounted later are superimposed in plan view, in step S2c.

Here, the predetermined region to be mounted with the semiconductor chip CP1 corresponds to a region on which the semiconductor chip CP1 is superimposed in plan view in mounting the semiconductor chip CP1 on the die pad DP in step S2d and corresponds to a region surrounded with the broken line in FIGS. 25 and 30.

In FIG. 30, the bonding member BD1 is supplied onto the die pad DP by the printing method in step S2c, so that the bonding member BD1 is not locally arranged on the upper surface of the die pad DP but is arranged over a relatively wide area. In supplying (arranging) the bonding member BD1 onto the die pad DP by the printing method in step S2c, the bonding member BD1 is supplied so as not to protrude from the predetermined region to be mounted with the semiconductor chip CP1 in step S2d. That is, the region to which the bonding member BD1 has been supplied (arranged) is located within the predetermined region to be mounted with the semiconductor chip CP1 in plan view. In other words, in step S2c, the bonding member BD1 is supplied (arranged) inside the predetermined region to be mounted with the semiconductor chip CP1, and the bonding member BD1 is not supplied (arranged) to the outer periphery portion of the predetermined region to be mounted with the semiconductor chip CP1. Accordingly, also in FIG. 30, the bonding member BD1 is not supplied (arranged) to the positions on which the four corners of the semiconductor chip CP1 to be mounted later are superimposed in plan view, in step S2c.

A common point in FIGS. 25 and 30 is that the four corners of the predetermined region to be mounted with the semiconductor chip CP1 indicated with the broken line are not superimposed on the bonding member BD1 supplied onto the die pad DP in step S2c, in plan view. In step S2d, the semiconductor chip CP1 is mounted in the position indicated with the broken line in FIGS. 25 and 30. Accordingly, in step S2d, the semiconductor chip CP1 is mounted over the die pad DP in a state where the bonding member BD1 has not been arranged in the positions on which the four corners of the semiconductor chip CP1 are superimposed in plan view. That is, in step S2c, the bonding member BD1 is not supplied to the positions on which the four corners of the semiconductor chip CP1 are superimposed in plan view in mounting the semiconductor chip CP1 onto the die pad DP in step S2d. It is more preferable that the region supplied (arranged) with the bonding member BD1 on the die pad DP in step S2c is set so as to be located within the predetermined region to be mounted with the semiconductor chip CP1.

Accordingly, when the semiconductor chip CP1 is mounted over the die pad DP in step S2d, the bonding member BD1 barely wets up on the side surfaces SM1, SM2, SM3, and SM4, and the sides SD1a, SD1b, SD1c, and SD1d of the semiconductor chip CP1 so that the side surfaces SM1, SM2, SM3, and SM4, and the sides SD1a, SD1b, SD1c, and SD1d of the semiconductor chip CP1 are barely covered with the bonding member BD1. Therefore, the length L1 of the portion covered with the bonding member BD1 in each of the sides SD1a, SD1b, SD1c, and SD1d of the semiconductor chip CP1 can be made short, so that the part of the conductive bonding member BD1 can be inhibited or prevented from adhering to the front surface of the semiconductor chip CP1.

In this manner, according to the present embodiment, in step S2a, the bonding member BD2 is supplied also to the positions on which the four corners of the semiconductor chip CP2 are superimposed in plan view in mounting the semiconductor chip CP2 on the die pad DP in step S2b. Accordingly, the length L2 of the portion covered with the bonding member BD2 in each of the sides SD2a, SD2b, SD2c, and SD2d of the semiconductor chip CP2 can be made long. In addition, the positions on which the four corners of the semiconductor chip CP1 are superimposed in plan view in mounting the semiconductor chip CP1 on the die pad DP in step S2d is prevented from being supplied with the bonding member BD1 in step S2c. It is more preferable that the region supplied (arranged) with the bonding member BD1 on the die pad DP in step S2c is set so as to be located within the region on which the semiconductor chip CP1 is superimposed (that is, the predetermined region to be mounted with the semiconductor chip CP1) in plan view in mounting the semiconductor chip CP1 on the die pad DP in step S2d. Accordingly, the length L1 of the portion covered with the bonding member BD1 in each of the sides SD1a, SD1b, SD1c, and SD1d of the semiconductor chip CP1 can be made short. Therefore, a structure in which the length L2 of the portion covered with the bonding member BD2 in each of the sides SD2 of the semiconductor chip CP2 is larger than the length L1 of the portion covered with the bonding member BD1 in each of the sides SD1 of the semiconductor chip CP1 (L2>L1) can be easily and appropriately achieved.

In addition, according to the present embodiment, the effect is considerably large when the paste type bonding members are used to both of the bonding member BD1 and the bonding member BD2. That is, the effect is considerably large when the conductive paste type bonding member is used as the conductive bonding member BD1 and the insulating paste type bonding member is used as the insulating bonding member BD2.

That is, when both of the bonding members BD1 and BD2 are the paste type bonding members, the bonding members BD1 and BD2 both have property of easily wetting up on a side surface of a semiconductor chip. Accordingly, differently from the present embodiment, when no arrangement is made in a manufacturing process of a semiconductor device, the wetting amount of the bonding member BD1 and the wetting amount of the bonding member BD2 become substantially the same, so that the length L1 and the length L2 become the same (that is, L1=L2). Differently from the present embodiment, when the following expression L1=L2 is satisfied, a state where both of the lengths L1 and L2 are small or a state where both of the lengths L1 and L2 are large occurs. When both of the lengths L1 and L2 are small, as described above, the withstand voltage between the semiconductor chip CP2 and the die pad DP becomes low because the length L2 is small, so that there is a risk of the electrostatic breakdown between the semiconductor chip CP2 and the die pad DP. Meanwhile, when both of the lengths L1 and L2 are large, as described above, there is a risk that a part of the conductive bonding member BD1 adheres to the front surface of the semiconductor chip CP1 because the length L1 is large. They decrease the comprehensive reliability of the semiconductor device.

In contrast, according to the present embodiment, when both of the bonding members BD1 and BD2 are the paste type bonding members, both of the bonding members BD1 and BD2 have property of easily wetting up on a side surface of the semiconductor chip. However, the manufacturing process is arranged, so that the wetting amount of the insulating bonding member BD2 is made large, and the wetting amount of the conductive bonding member BD1 is made small by inhibiting the wetting. Accordingly, the length L2 is made larger than the length L1 (L2>L1). Thus, the length L2 can be made large, and the length L1 can be made small. For the semiconductor chip CP2, the length L2 can be preferably made ½ or more of the thickness T2 of the semiconductor chip CP2. For the semiconductor chip CP1, the length L1 can be preferably made less than ½ of the thickness T1 of the semiconductor chip CP1, and the length L1 can be more preferably made ¼ or less of the thickness T1 of the semiconductor chip CP1. Accordingly, as described above, since the length L2 is large, the withstand voltage between the semiconductor chip CP2 and the die pad DP becomes high, so that the electrostatic breakdown between the semiconductor chip CP2 and the die pad DP can be inhibited or prevented. Meanwhile, since the length L1 is small, the part of the conductive bonding member BD1 can be inhibited or prevented from adhering to the front surface of the semiconductor chip CP1. Therefore, the comprehensive reliability of the semiconductor device can be improved.

In this manner, when the paste type bonding members that easily wet up on the side surface of the semiconductor chip are used as the bonding members BD1 and BD2, the effect of applying the present embodiment is considerably large.

In addition, when the conductive bonding member BD1 is a conductive paste type bonding member such as silver (Ag) paste, the bonding member BD1 easily wets up on the side surfaces SM1, SM2, SM3, and SM4, and the sides SD1a, SD1b, SD1c, and SD1d of the semiconductor chip CP1, so that apart of the conductive bonding member BD1 may adhere to the front surface of the semiconductor chip CP1. Accordingly, when the conductive bonding member BD1 is the conductive paste type bonding member such as the silver (Ag) paste, inhibiting the bonding member BD1 from wetting up on the side surfaces SM1, SM2, SM3, and SM4, and the sides SD1a, SD1b, SD1c, and SD1d of the semiconductor chip CP1 is particularly important. Therefore, when the bonding member BD1 is the conductive paste type bonding member, it is considerably important not to supply the bonding member BD1 to the positions on which the four corners of the semiconductor chip CP1 are superimposed in plan view in mounting the semiconductor chip CP1 on the die pad DP in step S2d, in step S2c. In addition, in supplying the bonding member BD1 onto the die pad DP in step S2c, the bonding member BD1 preferably is made so as not to protrude from the predetermined region to be mounted with the semiconductor chip CP1, and the region supplied (arranged) with the bonding member BD1 is preferably located within the predetermined region to be mounted with the semiconductor chip CP1. As a result, even when the bonding member BD1 is the conductive paste type bonding member that easily wets up on the side surfaces of the semiconductor chip CP1, the bonding member BD1 can be inhibited from wetting up on the side surfaces SM1, SM2, SM3, and SM4, and the sides SD1a, SD1b, SD1c, and SD1d of the semiconductor chip CP1. Accordingly, the part of the conductive bonding member BD1 can be appropriately inhibited or prevented from adhering to the front surface of the semiconductor chip CP1.

Note that there is an approach of using a solder material as the conductive bonding member BD1. Note that, when the solder material is used, there is a need to provide a flux cleaning step after solder reflow. This means an increase of the number of assembly steps (the manufacturing process number). In addition, there is also a need to adopt lead-enriched high-melting solder having a melting point higher than a reflow temperature in mounting, in order to secure reflow resistance of the semiconductor device PKG. This means opposing the stream of making the semiconductor device PKG lead-free.

In consideration of these disadvantages, the conductive paste type bonding member such as the silver (Ag) paste is preferably used as the conductive bonding member BD1 instead of the solder material. In comparison to a case where the solder material is used, using the conductive paste type bonding member such as the silver (Ag) paste inhibits the number of assembly steps (the manufacturing process number), so that the environment-friendly semiconductor device PKG can be achieved.

In the foregoing, the invention made by the inventors of the present invention has been concretely described based on the embodiment. However, it is needless to say that the present invention is not limited to the foregoing embodiment and various modifications and alterations can be made within the scope of the present invention.

EXPLANATION OF REFERENCE CHARACTERS

1 Semiconductor substrate
3 p-type semiconductor region
4 $n^+$-type semiconductor region
5 $p^+$-type semiconductor region
6 Trench
7 Gate insulating film
8 Gate electrode
9, 11 Interlayer insulating film
10, 12 Plug
13 Protective film
14 Opening
BAT Power supply
BD1, BD2 Bonding member
BE Back surface electrode
BW Wire
CLC Control circuit
CP1, CP2 Semiconductor chip
DP Die pad
GM Silver plated layer
KM Interface
LD Lead
LE Lower end
LF Lead frame
LOD Load
M1, M2 Wire
M1S, M2S Source wire
MR Sealing portion
MRa Upper surface
MRb Lower surface
MRc1, MRc2, MRc3, MRc4 Side surface
P1, P2 Pad electrode P1S Source pad electrode
PKG Semiconductor device
Q1 Power MOSFET
Q2 Sense MOSFET
REG Regulator
SM1, SM2, SM3, SM4, SM5, SM6, SM7, SM8 Side surface
SD1, SD1a, SD1b, SD1c, SD1d Side
SD2, SD2a, SD2b, SD2c, SD2d Side
TL Suspension lead

The invention claimed is:

1. A semiconductor device comprising:
a chip mounting portion having electrical conductivity;
a first semiconductor chip mounted over the chip mounting portion via a first bonding member having insulation property;
a second semiconductor chip mounted over the chip mounting portion via a second bonding member having electrical conductivity;
a plurality of leads arranged outside of the chip mounting portion;
a plurality of wires connecting the first and second semiconductor chips with the plurality of leads respectively; and
a sealing body sealing the first semiconductor chip, the second semiconductor chip, a part of each of the plurality of leads, the plurality of wires and at least a part of the chip mounting portion,
wherein the second semiconductor chip includes a power transistor,
wherein the first semiconductor chip controls the second semiconductor chip
wherein the second semiconductor chip has a back surface electrode, the back surface electrode of the second semiconductor chip being electrically connected with the chip mounting portion via the second bonding member, and
wherein a first length of a portion, on a first side formed by an intersection of a first side surface and a second side surface of the first semiconductor chip, covered with the first bonding member is larger than a second length of a portion, on a second side formed by an intersection of a third side surface and a fourth side surface of the second semiconductor chip, covered with the second bonding member,
wherein the plurality of wires include a plurality of first wires electrically connecting a plurality of first pad electrodes of the first semiconductor chip and a plurality of first leads of the plurality of leads respectively, and a plurality of second wires electrically connecting a plurality of second pad electrodes of the second semiconductor chip and a plurality of second leads of the plurality of leads respectively,
wherein the plurality of the second pad electrodes include a plurality of source pad electrodes,
wherein the plurality of second wires include a plurality of third wires connecting with the plurality of source pad electrodes respectively, and
wherein diameters of the plurality of third wires are larger than diameters of the wires connected to the first and second pad electrodes except the source pad electrodes.

2. The semiconductor device according to claim 1, wherein the first length is ½ or more of a thickness of the first semiconductor chip.

3. The semiconductor device according to claim 2, wherein the second length is less than ½ of a thickness of the second semiconductor chip.

4. The semiconductor device according to claim 3, wherein the second length is ¼ or less of the thickness of the second semiconductor chip.

5. The semiconductor device according to claim 1, wherein a dielectric strength voltage of the first bonding member is larger than a dielectric strength voltage of the sealing body.

6. The semiconductor device according to claim 1, wherein the first bonding member is an insulating adhesive member.

7. The semiconductor device according to claim 6, wherein the second bonding member is an electrically conductive adhesive member.

8. The semiconductor device according to claim 1, wherein the plurality of third wires are Cu wires, and wherein the plurality of wires except the third wires are Au wires.

9. The semiconductor device according to claim 1, wherein a silver plated layer is formed on a part of an upper surface of the chip mounting portion,
wherein the second semiconductor chip is mounted over the silver plated layer of the chip mounting portion via the second bonding member, and
wherein the first semiconductor chip is mounted over the chip mounting portion in a region in which the silver plated layer is not formed, via the first bonding member.

10. The semiconductor device according to claim 1, wherein the plurality of wires are Cu wires.

* * * * *